United States Patent
Kasuya et al.

(10) Patent No.: US 10,832,996 B2
(45) Date of Patent: Nov. 10, 2020

(54) POWER MODULE AND MOTOR DRIVE CIRCUIT

(71) Applicant: ROHM CO., LTD., Kyoto (JP)

(72) Inventors: Yasumasa Kasuya, Kyoto (JP); Hiroaki Matsubara, Kyoto (JP); Hiroshi Kumano, Kyoto (JP); Toshio Nakajima, Kyoto (JP); Shigeru Hirata, Kyoto (JP); Yuji Ishimatsu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/853,302

(22) Filed: Apr. 20, 2020

(65) Prior Publication Data

US 2020/0251410 A1 Aug. 6, 2020

Related U.S. Application Data

(63) Continuation of application No. 15/666,055, filed on Aug. 1, 2017, now Pat. No. 10,679,928.

(30) Foreign Application Priority Data

Aug. 5, 2016 (JP) .................................. 2016-154932

(51) Int. Cl.
*H01L 23/495* (2006.01)
*H01L 29/08* (2006.01)
(Continued)

(52) U.S. Cl.
CPC .... *H01L 23/49562* (2013.01); *H01L 23/4952* (2013.01); *H01L 23/49503* (2013.01); *H01L 23/49524* (2013.01); *H01L 23/49537* (2013.01); *H01L 23/49551* (2013.01); *H01L 23/49568* (2013.01); *H01L 23/49575* (2013.01); *H01L 23/49582* (2013.01); *H01L 24/00* (2013.01); *H01L 29/0878* (2013.01); (Continued)

(58) Field of Classification Search
CPC ......... H01L 23/19562; H01L 23/49503; H01L 23/49562
See application file for complete search history.

(56) References Cited

U.S. PATENT DOCUMENTS 6,175,150 B1  1/2001 Ichikawa et al.
6,448,633 B1  9/2002 Yee et al.
(Continued)

FOREIGN PATENT DOCUMENTS

JP  2012-39784  2/2012

*Primary Examiner* — Errol V Fernandes
(74) *Attorney, Agent, or Firm* — Hamre, Schumann, Mueller & Larson, P.C.

(57) ABSTRACT

A power module includes a first die pad, a first switching element, a second die pad, a second switching element, an integrated circuit element, an encapsulation resin, and a lead frame assembly. The encapsulation resin encapsulates the first switching element, the second switching element, and the integrated circuit element. The lead frame assembly includes an outer lead and an inner lead. The lead frame assembly includes a first lead frame and a second lead frame. The first lead frame includes a first inner lead connected to the first die pad and a first outer lead connected to the first inner lead. The second lead frame includes a second inner lead connected to the second die pad and a second outer lead connected to the second inner lead.

19 Claims, 40 Drawing Sheets

(51) Int. Cl.
*H01L 23/00* (2006.01)
*H02P 6/12* (2006.01)
*H02P 6/14* (2016.01)
*H01L 29/78* (2006.01)
*H01L 29/861* (2006.01)
*H01L 29/40* (2006.01)
*H01L 29/423* (2006.01)
*H01L 29/66* (2006.01)
*H01L 29/167* (2006.01)
*H01L 29/06* (2006.01)
*H02P 27/06* (2006.01)
*H01L 23/31* (2006.01)
*H01L 25/00* (2006.01)

(52) U.S. Cl.
CPC ............ *H01L 29/7824* (2013.01); *H02P 6/12* (2013.01); *H02P 6/14* (2013.01); *H01L 23/3121* (2013.01); *H01L 24/45* (2013.01); *H01L 24/48* (2013.01); *H01L 24/49* (2013.01); *H01L 25/50* (2013.01); *H01L 29/0634* (2013.01); *H01L 29/0692* (2013.01); *H01L 29/0696* (2013.01); *H01L 29/167* (2013.01); *H01L 29/404* (2013.01); *H01L 29/42368* (2013.01); *H01L 29/66712* (2013.01); *H01L 29/7802* (2013.01); *H01L 29/7813* (2013.01); *H01L 29/8611* (2013.01); *H01L 2224/04042* (2013.01); *H01L 2224/05554* (2013.01); *H01L 2224/0603* (2013.01); *H01L 2224/45124* (2013.01); *H01L 2224/45144* (2013.01); *H01L 2224/48137* (2013.01); *H01L 2224/48247* (2013.01); *H01L 2224/48472* (2013.01); *H01L 2224/4903* (2013.01); *H01L 2224/49113* (2013.01); *H01L 2924/13091* (2013.01); *H01L 2924/181* (2013.01); *H01L 2924/19105* (2013.01); *H02P 27/06* (2013.01)

(56) References Cited

U.S. PATENT DOCUMENTS

| | | |
|---|---|---|
| 2013/0127034 A1 | 5/2013 | Hasegawa et al. |
| 2015/0269472 A1 | 9/2015 | Finn et al. |
| 2015/0333168 A1* | 11/2015 | Hirler ................. H01L 29/7811 257/329 |
| 2017/0358522 A1 | 12/2017 | Nakamura |

* cited by examiner

Polishing

Emission of Charged Particles ($^3$He$^{++}$ or $^4$He$^{++}$)

POWER MODULE AND MOTOR DRIVE CIRCUIT

BACKGROUND OF THE INVENTION

The present invention relates to a power module and a motor drive circuit.

A semiconductor device known in the art molds a switching element such as a power metal-oxide-semiconductor (MOS) transistor in resin. Such a semiconductor device is used in various types of circuits. For example, a semiconductor device may be used as a motor drive circuit for driving a motor (refer to, for example, Japanese Laid Open Patent Publication No. 2012-039784).

SUMMARY OF THE INVENTION

With recent tendencies to reduce the size of electric appliances, it is desirable that circuit boards for driving and controlling electric appliances also be downsized. The semiconductor device requires a control circuit to control the switching element. In this case, when mounting semiconductor devices, such as a switching element and a control circuit, on a circuit board, the area occupied by the mounted semiconductor will increase and make it difficult to cope with the downsizing of the circuit board.

It is an object of the present disclosure to provide a power module and a motor drive circuit that are capable of reducing the mounting area on a circuit board.

To achieve the above object, one aspect of the present disclosure is a power module including a first die pad, a first switching element, a second die pad, a second switching element, an encapsulation resin, and a lead frame assembly. The first switching element is mounted on the first die pad. The second die pad is electrically insulated from the first die pad. The second switching element is mounted on the second die pad. The integrated circuit element controls a switching operation of the first switching element and the second switching element. The encapsulation resin encapsulates the first switching element, the second switching element, and the integrated circuit element. The lead frame assembly includes an outer lead, which protrudes from the encapsulation resin, and an inner lead, which is arranged in the encapsulation resin and electrically connected to the outer lead. The lead frame assembly includes a first lead frame and a second lead frame. The first lead frame includes a first inner lead, which serves as the inner lead and is connected to the first die pad, and a first outer lead, which serves as the outer lead and is electrically connected to the first inner lead. The second lead frame includes a second inner lead, which serves as the inner lead and is connected to the second die pad, and a second outer lead, which serves as the outer lead and is electrically connected to the second inner lead.

Other aspects and advantages of the present invention will become apparent from the description hereafter, taken in conjunction with the accompanying drawings, illustrating by way of example the principles of the invention.

BRIEF DESCRIPTION OF THE DRAWINGS

The invention, together with objects and advantages thereof, may best be understood by reference to the description hereafter of the presently preferred embodiments together with the accompanying drawings in which:

FIG. 31 is an enlarged plan view illustrating a third die pad of the power module in a modified example;

DETAILED DESCRIPTION OF THE PREFERRED EMBODIMENTS

One embodiment of a power module will now be described with reference to the drawings. The following embodiment merely illustrates configurations and methods embodying a technical concept and, therefore, does not intend to limit the material, shape, structure, location, dimensions, and the like of elements as described below. The following embodiment may be modified in various manners within the scope of the appended claims.

Power Module

Figure 1:
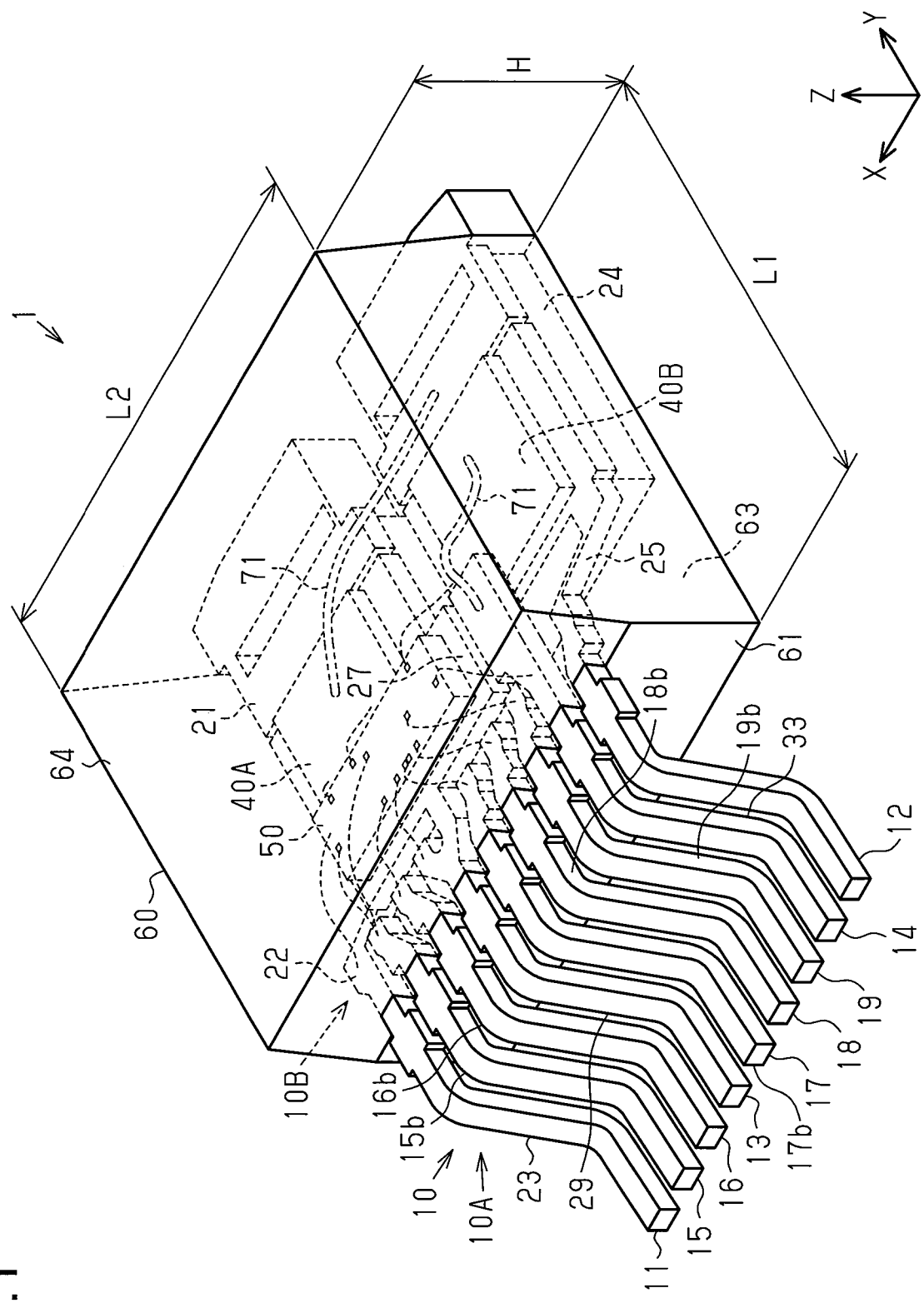
FIG. 1 is a perspective view of a power module according to one embodiment of the present invention.

As illustrated in FIG. 1. 1, a power module 1 includes a first switching element 40A, a second switching element 40B, an integrated circuit element 50 that controls switching operations of the switching elements 40A and 40B, and an encapsulation resin 60 that encapsulates the switching elements 40A and 40B and the integrated circuit element 50. The power module 1 also includes a first die pad 21 on which the first switching element 40A is mounted, a second die pad 24 on which the second switching element 40B is mounted, and a third die pad 27 on which the integrated circuit element 50 is mounted. The power module 1 also includes a lead frame assembly 10. The lead frame assembly 10 includes outer leads 10A and inner leads 10B. The outer leads 10A protrude from the encapsulation resin 60. The inner leads 10B are arranged in the encapsulation resin 60 and electrically connected to the outer leads 10A, respectively. In the description hereafter, the outer leads 10A refer to outer leads of the entire lead frame assembly 10, and the inner leads 10B refer to inner leads of the entire lead frame assembly 10.

Each of the first switching element 40A and the second switching element 40B is, for example, a transistor. Preferably, the transistor is a metal-oxide-semiconductor field effect transistor (MOSFET) of an N type having an ON resistance of 1Ω or less. In this embodiment, the MOSFET used as the first switching element 40A is identical in structure to the MOSFET used as the second switching element 40B. The power module 1 is a TO (Transistor Outline)-263 module that is in compliance with the Standard of Japan Electronics and Information Technology Industries Association (JEITA). Specifically, the encapsulation resin 60 has a length L1 of 9.15 mm, a width L2 of 10.16 mm, and a height H of 4.57 mm. Moreover, the power module 1 is of a so-called single inline package (SIP) type, in which the outer leads 10A extend from one side of the encapsulation resin 60.

Figure 2:
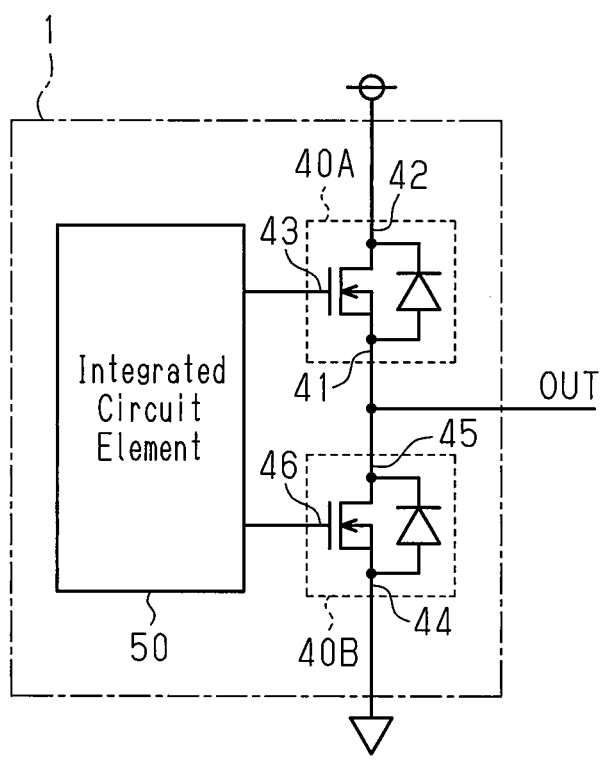
FIG. 2 is a schematic circuit diagram that illustrates the circuit configuration of the power module shown in FIG. 1.

As illustrated in FIG. 2, a drain 42 of the first switching element 40A is connected to an external power supply. A source 41 of the first switching element 40A is connected to a drain 45 of the second switching element 40B. A source 44 of the second switching element 40B is grounded. The first switching element 40A and the second switching element 40B are respectively an upper arm switching element and a lower arm switching element connected in series. The integrated circuit element 50 is connected to a gate 43 of the first switching element 40A and a gate 46 of the second switching element 40B. As described above, the power module 1 is a switch drive device in which the integrated circuit element 50 controls, in a complementary manner, ON and OFF states of the first switching element 40A and second switching element 40B connected in series between two different potentials. The power module 1 controls the ON and OFF states of the first switching element 40A and second switching element 40B to control a drive current flowing through a load (not shown). The term "complementary (exclusive)" include cases where the first switching element 40A and the second switching element 40B have a completely inverse relationship as to their ON and OFF states, and cases where a period in which the first switching element 40A and the second switching element 40B are simultaneously turned off is set from the viewpoint of prevention of a through current.

Figure 3:
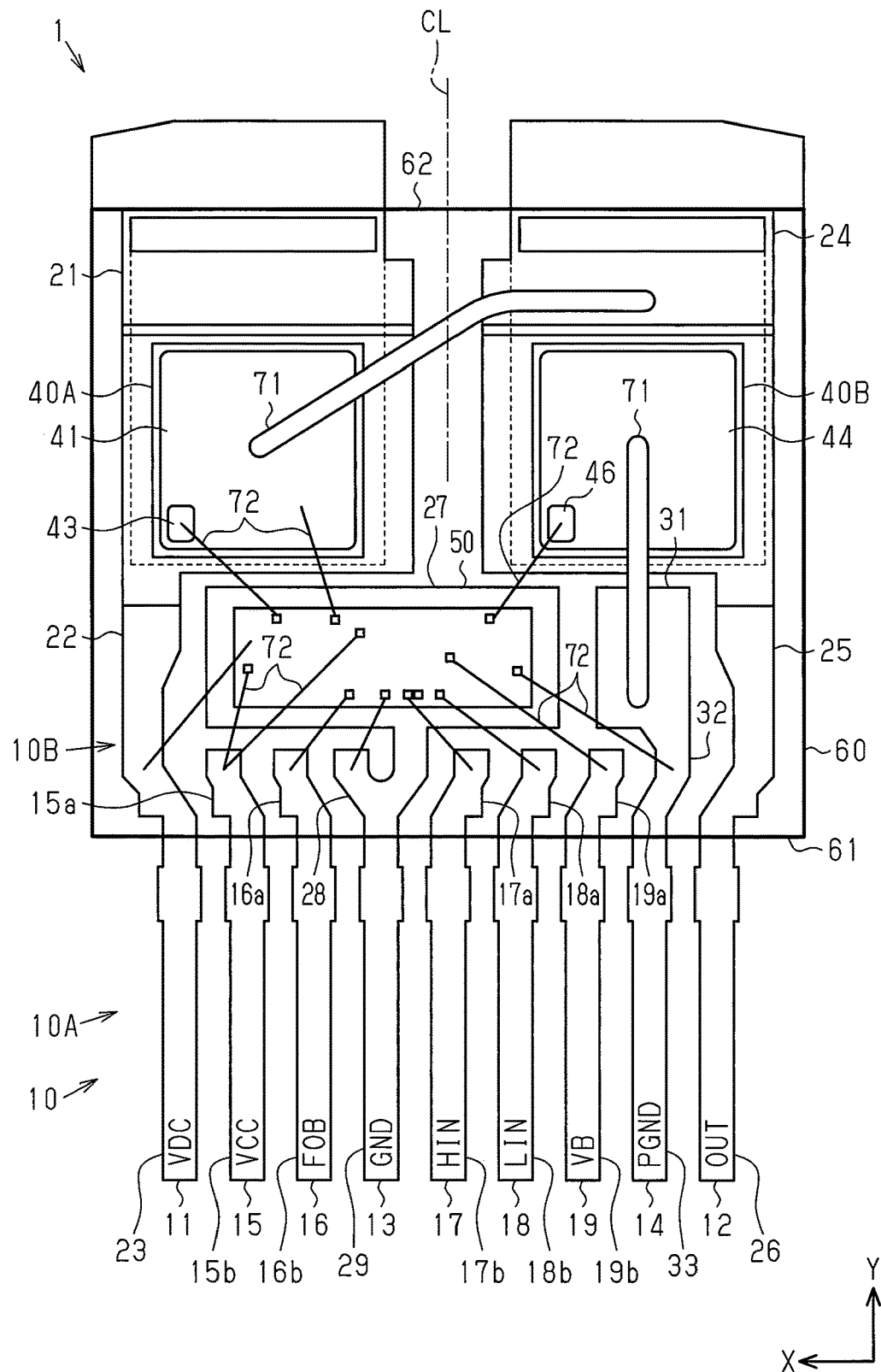
FIG. 3 is a schematic plan view that illustrates the layout of components configuring the power module of FIG. 1.

As illustrated in FIG. 3, the first switching element 40A has an electrode on a surface opposing the first die pad 21, and the second switching element 40B has an electrode on a surface opposing the second die pad 24. Specifically, in the first switching element 40A, the drain 42 (see FIG. 2) is arranged on the surface opposing the first die pad 21, and the source 41 and the gate 43 are arranged on a side opposite from the surface opposing the first die pad 21. In the second switching element 40B, the drain 45 (see FIG. 2) is arranged on the surface opposing the second die pad 24, and the source 44 and the gate 46 are arranged on the surface opposite to the surface opposing the second die pad 24. The gate 43 of the first switching element 40A is formed in the source 41 at the end opposing the integrated circuit element 50 on a corner opposite to the corner opposing the second switching element 40. The gate 46 of the second switching element 40B is formed on the end opposing the integrated circuit element 50 at the corner opposing the first switching element 40A.

The lead frame assembly 10 includes a first lead frame 11, a second lead frame 12, a third lead frame 13, a fourth lead frame 14, a fifth lead frame 15, a sixth lead frame 16, a seventh lead frame 17, an eighth lead frame 18, and a ninth lead frame 19. In other words, the power module 1 has nine terminals for establishing an electrical connection with the outside of the power module 1 by connecting the power module 1 to a circuit board (not shown) through, for example, soldering. The lead frame assembly 10 is formed by, for example, a copper alloy plate. The lead frame assembly 10 may have any number of lead frames. The number of the lead frames is a matter of design choice. For example, the number of lead frames in the lead frame assembly 10 may be any of two to eight or may be ten or greater.

The outer leads 10A of the lead frame assembly 10 protrude out of the encapsulation resin 60 from a first side surface 61, which serves as one side surface of the encapsulation resin 60, and are arranged along the first side surface 61. In the description hereafter, the direction in which the lead frames 11 to 19 are arranged in the lead frame assembly 10 is defined as a "sideward direction X". The direction perpendicular to the sideward direction X in a plan view of the lead frame assembly 10 is defined as a "lengthwise direction Y". A direction perpendicular to the sideward direction X and the lengthwise direction Y is defined as a "vertical direction Z".

The first lead frame 11 electrically connects the drain 42 (see FIG. 2) of the first switching element 40A to an external power supply and forms a VDC terminal. The first lead frame 11 has a first inner lead 22 connected to the first die pad 21, and a first outer lead 23 electrically connected to the first inner lead 22. The first inner lead 22 extends from the first die pad 21 toward the first side surface 61 of the encapsulation resin 60. The first outer lead 23 protrudes out of the encapsulation resin 60 from the first side surface 61 of the encapsulation resin 60. The first lead frame 11 is integrated with the first die pad 21. Specifically, the first die pad 21, the first inner lead 22, and the first outer lead 23 are integrated into a single component.

The first inner lead 22 may be separate from the first die pad 21. The first inner lead 22 is connected by, for example, welding to the first die pad 21. In short, the first inner lead 22 need only be electrically connected to the first die pad 21. The first inner lead 22 may also be separate from the first outer lead 23. The first inner lead 22 is connected by, for example, welding to the first outer lead 23. In short, the first inner lead 22 need only be electrically connected to the first outer lead 23.

The first inner lead 22 is equal in thickness to the first outer lead 23. The first die pad 21 is greater in thickness than the first inner lead 22 and the first outer lead 23.

The second lead frame 12 electrically connects the drain 45 (see FIG. 2) of the second switching element 40B to an electric appliance or an electronic component (not shown) driven by the power module 1 and forms an output terminal (OUT terminal). The second lead frame 12 has a second inner lead 25 connected to the second die pad 24, and a second outer lead 26 electrically connected to the second inner lead 25. The second inner lead 25 extends from the second die pad 24 toward the first side surface 61 of the encapsulation resin 60. The second outer lead 26 protrudes out of the encapsulation resin 60 from the first side surface 61 of the encapsulation resin 60. The second lead frame 12 is integrated with the second die pad 24. Specifically, the second die pad 24, the second inner lead 25, and the second outer lead 26 are integrated into a single component.

The second inner lead 25 may be separate from the second die pad 24. The second inner lead 25 is connected by, for example, welding to the second die pad 24. In short, the second inner lead 25 need only be electrically connected to the second die pad 24. The second inner lead 25 may also be separate from the second outer lead 26. The second inner lead 25 is connected by, for example, welding to the second outer lead 26. In short, the second inner lead 25 need only be electrically connected to the second outer lead 26.

The second inner lead 25 is equal in thickness to the second outer lead 26. The second die pad 24 is greater in thickness than the second inner lead 25 and the second outer lead 26. The second inner lead 25 and the second outer lead 26 are equal in thickness to the first inner lead 22 and the first outer lead 23 in the first lead frame 11. The second die pad 24 is equal in thickness to the first die pad 21.

The third lead frame 13 is a lead frame for grounding the integrated circuit element 50 and forms a GND terminal. The third lead frame 13 has a third inner lead 28 connected to the third die pad 27, and a third outer lead 29 electrically connected to the third inner lead 28. The third inner lead 28 extends from the third die pad 27 toward the first side surface 61 of the encapsulation resin 60. The third outer lead 29 protrudes out of the encapsulation resin 60 from the first side surface 61 of the encapsulation resin 60. The third lead frame 13 is integrated with the third die pad 27. Specifically, the third die pad 27, the third inner lead 28, and the third outer lead 29 are integrated into a single component.

The third inner lead 28 may be separate from the third die pad 27. The third inner lead 28 is connected by, for example, welding to the third die pad 27. In short, the third inner lead 28 need only be electrically connected to the third die pad 27. The third inner lead 28 may also be separate from the third outer lead 29. The third inner lead 28 is connected by, for example, welding to the third outer lead 29. In short, the third inner lead 28 need only be electrically connected to the third outer lead 29.

The third die pad 27, the third inner lead 28, and the third outer lead 29 are equal in thickness to one another. The third die pad 27, the third inner lead 28, and the third outer lead 29 are equal in thickness to the first inner lead 22 and the first outer lead 23 in the first lead frame 11. Therefore, the first die pad 21 and the second die pad 24 are greater in thickness than the third die pad 27.

The fourth lead frame 14 is a lead frame for grounding the source 44 of the second switching element 40B, and forms a PGND terminal (ground terminal). The fourth lead frame 14 has a connection portion 31 electrically connected to the second switching element 40B by a large-current connection member 71 (described later), a fourth inner lead 32 electrically connected to the connection portion 31, and a fourth outer lead 33 electrically connected to the fourth inner lead 32. The fourth inner lead 32 extends from the connection portion 31 toward the first side surface 61 of the encapsulation resin 60. The fourth outer lead 33 protrudes out of the encapsulation resin 60 from the first side surface 61 of the encapsulation resin 60. The fourth lead frame 14 is a single component into which the connection portion 31, the fourth inner lead 32, and the fourth outer lead 33 are integrated. At least one of the connection portion 31, the fourth inner lead 32, and the fourth outer lead 33 may be separate from the others. In short, the connection portion 31 need only be electrically connected to the fourth inner lead 32, and the fourth inner lead 32 need only be electrically connected to the fourth outer lead 33.

The connection portion 31, the fourth inner lead 32, and the fourth outer lead 33 are equal in thickness to one another. The connection portion 31, the fourth inner lead 32, and the fourth outer lead 33 are equal in thickness to the first inner lead 22 and the first outer lead 23 in the first lead frame 11.

The fifth lead frame 15 forms a VCC terminal to which a power supply voltage VCC is applied. The sixth lead frame 16 forms a power fault detection terminal (FOB terminal) for detecting a state in which the voltage applied to the OUT terminal is short-circuited with a high-voltage application terminal (or a corresponding high-potential terminal). The seventh lead frame 17 forms an HIN terminal. A gate signal voltage input from a gate drive circuit 211 (see FIG. 27) to the gate 43 of the first switching element 40A is applied to the HIN terminal. The eighth lead frame 18 forms an LIN terminal. A gate signal voltage input from the gate drive circuit 211 to the gate 46 of the second switching element 40B is applied to the LIN terminal. The ninth lead frame 19 forms a VB terminal which is a boost voltage VB application terminal. The boost voltage VB is a boosted power supply voltage VCC.

The portions of each of the fifth lead frame 15 to ninth lead frame 19 are equal in thickness to one another. The third lead frame 13 to the ninth lead frame 19 are equal in thickness to the first inner lead 22 and the first outer lead 23 in the first lead frame 11 and are also equal in thickness to the second inner lead 25 and the second outer lead 26 in the second lead frame 12.

The power module 1 includes a large-current connection member 71 connecting the source 41 of the first switching element 40A to the second die pad 24 by soldering, and a large-current connection member 71 connecting the source 44 of the second switching element 40B to the connection portion 31 of the third lead frame 13 by soldering. Each of the large-current connection members 71 is, for example, an aluminum wire.

The power module 1 also includes a small-current connection member 72 connecting the integrated circuit element 50 to the first switching element 40A and a small-current connection member 72 connecting the integrated circuit element 50 to the second switching element 40B. The power module 1 also includes a small-current connection member 72 connecting the integrated circuit element 50 to the first lead frame 11, and small-current connection members 72 respectively connecting the integrated circuit element 50 to the third lead frame 13 to ninth lead frame 19. Specifically, the small-current connection members 72 respectively connect the integrated circuit element 50 to the source 41 and the gate 43 in the first switching element 40A. Further, the small-current connection member 72 connects the integrated circuit element 50 to the gate 46 of the second switching element 40B. In addition, the small-current connection members 72 respectively connect the integrated circuit element 50 to the third inner lead 28, the fourth inner lead 32, a fifth inner lead 15a, a sixth inner lead 16a, a seventh inner lead 17a, an eighth inner lead 18a, and a ninth inner lead 19a. Each of the small-current connection members 72 is, for example, a gold wire. Each small-current connection member 72 to which a small current is supplied has a smaller wire diameter than each large-current connection member 71 to which a large current is supplied.

With reference to FIGS. 3 to 8, the first lead frame 11 to ninth lead frame 19 will now be described in detail.

FIG. 3 shows the layout of the power module 1 in a plan view.

Among the lead frames 11 to 19, the first lead frame 11 is located at one end (left side in FIG. 3), in the sideward direction X, of the lead frame assembly 10. Among the lead frames 11 to 19, the second lead frame 12 is located at the other end (right side in FIG. 3), in the sideward direction X, of the lead frame assembly 10. Specifically, the first inner lead 22 and first outer lead 23 of the first lead frame 11 and the second inner lead 25 and second outer lead 26 of the second lead frame 12 are respectively located at the two ends, in the sideward direction X, of the lead frame assembly 10. The first lead frame 11 and the second lead frame 12 are formed to be line symmetric about a center line CL (an alternate long and short dash line in FIG. 3) extending in the lengthwise direction Y at a center, in the sideward direction X, of the encapsulation resin 60 in a plan view of the encapsulation resin 60.

The third lead frame 13 to the ninth lead frame 19 are arranged in the order of the fifth lead frame 15, the sixth lead frame 16, the third lead frame 13, the seventh lead frame 17, the eighth lead frame 18, the ninth lead frame 19, and the fourth lead frame 14 from the first lead frame 11 toward the second lead frame 12.

The first die pad 21 and the second die pad 24 are located near a second side surface 62 of the encapsulation resin 60. The second side surface 62 is opposite to the first side surface 61 of the encapsulation resin 60 in the lengthwise direction Y. The first die pad 21 and the second die pad 24 are arranged next to each other in the sideward direction X. The first die pad 21 and the second die pad 24 protrude from the second side surface 62 of the encapsulation resin 60 in the lengthwise direction Y. The first die pad 21 and the second die pad 24 are formed to be line symmetric about the center line CL.

The third die pad 27 is located near the first side surface 61 of the encapsulation resin 60 in the lengthwise direction Y. The third die pad 27 is located at a different position in the lengthwise direction Y from the first die pad 21 and the second die pad 24. Specifically, the third die pad 27 is located closer to the first side surface 61 than the first die pad 21 and the second die pad 24. Further, the third die pad 27 is arranged overlapping the first die pad 21 and the second die pad 24 in the lengthwise direction Y. The third die pad 27 is located between the first inner lead 22 of the first lead frame 11 and the second inner lead 25 of the second lead frame 12 in the sideward direction X. The third die pad 27 is located closer to the first inner lead 22 than the second inner lead 25 in the sideward direction X.

The connection portion 31 of the fourth lead frame 14 is located between the third die pad 27 and the second inner lead 25 of the second lead frame 12 in the sideward direction X. Specifically, the connection portion 31 is located adjacent to the third die pad 27 and the second inner lead 25. The location of the connection portion 31 corresponds to that the third die pad 27 in the lengthwise direction Y. The connection portion 31 is located at a position opposing the second switching element 40B in the lengthwise direction Y in a plan view.

The distal ends of the fifth inner lead 15a of the fifth lead frame 15, the sixth inner lead 16a of the sixth lead frame 16, the seventh inner lead 17a of the seventh lead frame 17, the eighth inner lead 18a of the eighth lead frame 18, and the ninth inner lead 19a of the ninth lead frame 19 are located closer to the first side surface 61 of the encapsulation resin 60 than the third die pad 27. The distal ends of the fifth to ninth inner leads 15a to 19a are located at corresponding positions in the lengthwise direction Y. The fifth inner lead 15a to the eighth inner lead 18a oppose the third die pad 27 in the lengthwise direction Y. The fifth inner lead 15a and the sixth inner lead 16a are located closer to the first inner lead 22 than the third inner lead 28. The seventh inner lead 17a and the eighth inner lead 18a are located closer to the second inner lead 25 than the third inner lead 28. The ninth inner lead 19a is located between the eighth inner lead 18a and the connection portion 31 in the sideward direction X. Further, the ninth inner lead 19a opposes the connection portion 31 in the lengthwise direction Y.

As illustrated in FIGS. 1 and 3, the outer leads 10A of the lead frame assembly 10 are formed to be identical in shape with one another. In other words, the first outer lead 23, the second outer lead 26, the third outer lead 29, the fourth outer lead 33, a fifth outer lead 15b of the fifth lead frame 15, a sixth outer lead 16b of the sixth lead frame 16, a seventh outer lead 17b of the seventh lead frame 17, an eighth outer lead 18b of the eighth lead frame 18, and a ninth outer lead 19b of the ninth lead frame 19 are formed to be identical in shape with one another. The outer leads 10A each have a width of 0.51 mm and a pin pitch of 0.97 mm. The pin pitch refers to the distance between the centers of adjacent outer leads 10A in the sideward direction X.

Figure 4:
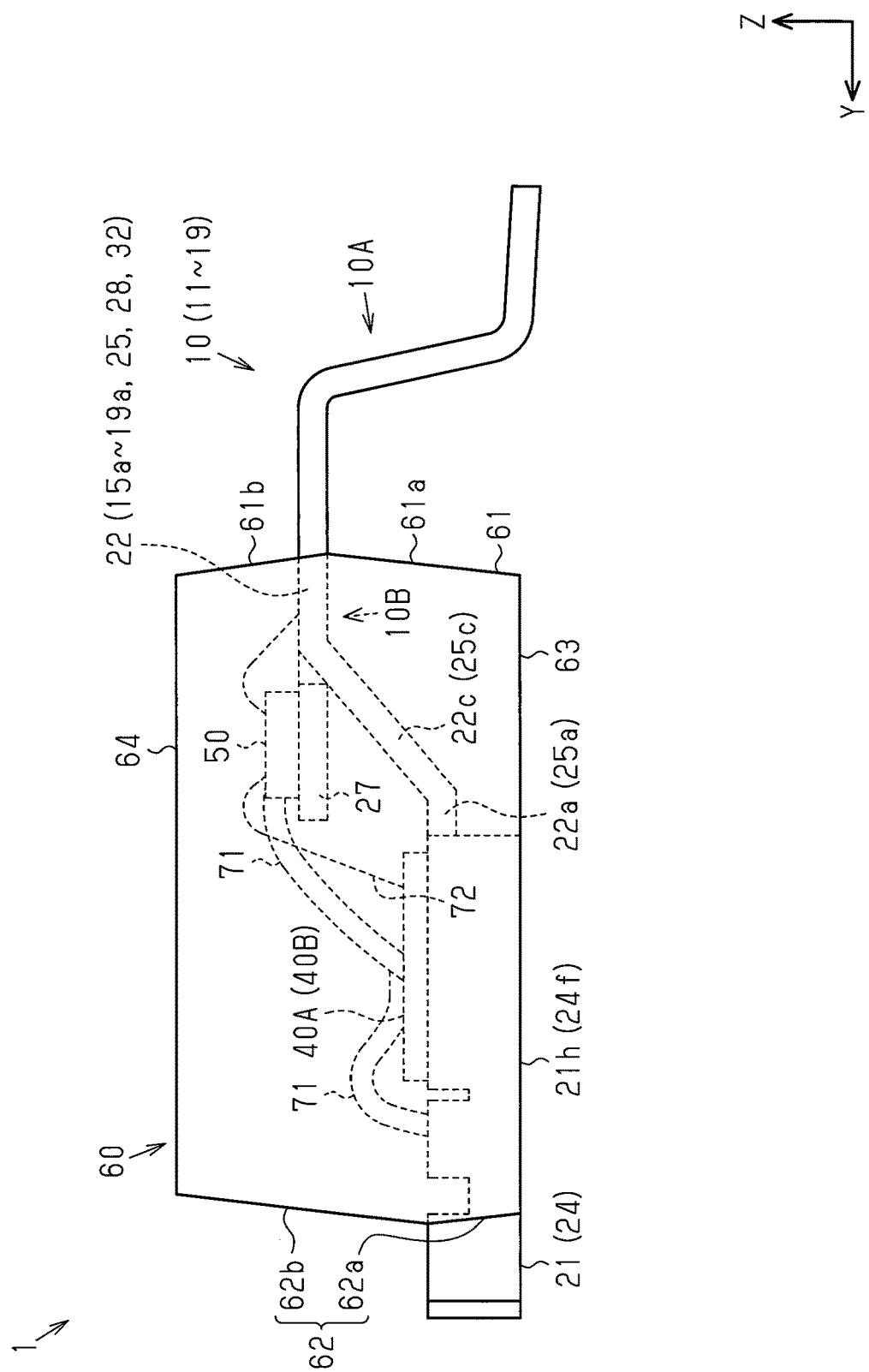
FIG. 4 is a schematic side view that illustrates the layout of the components configuring the power module of FIG. 1.
Figure 5:
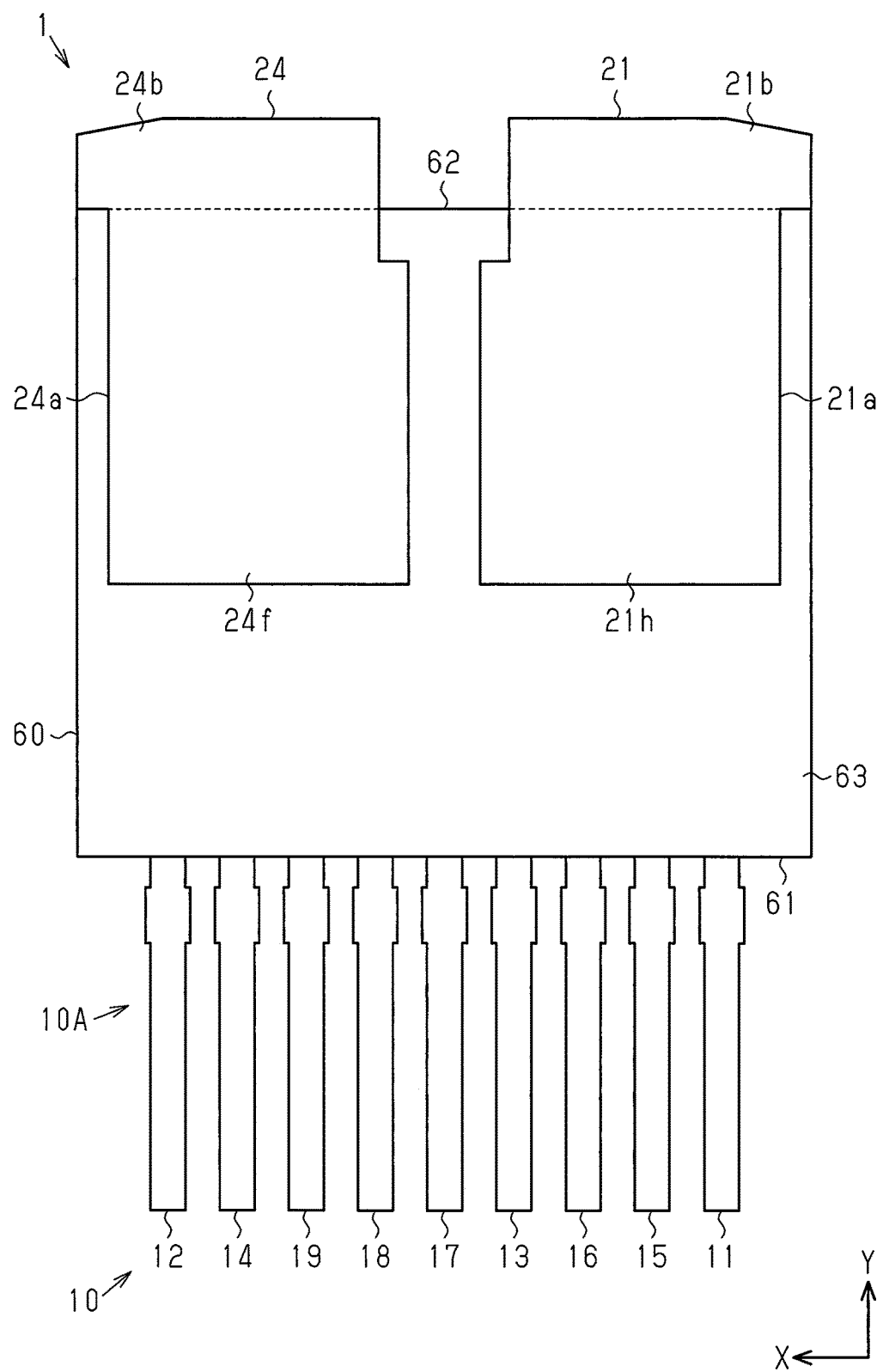
FIG. 5 is a bottom view of the power module of FIG. 1.

Referring to FIGS. 1, 4, and 5, the layout of the power module 1 in a side view will now be described.

As illustrated in FIGS. 1 and 4, the first die pad 21 and the second die pad 24 are located at the same level in the vertical direction Z. The first die pad 21 and the second die pad 24 are located near a first end surface 63 of the encapsulation resin 60 in the vertical direction Z. The first die pad 21 and the second die pad 24 are located at positions separated from the position of the third die pad 27 in the vertical direction Z. Specifically, the third die pad 27 is located closer to a second end surface 64 of the encapsulation resin 60 than the first die pad 21 and the second die pad 24 in the vertical direction Z.

As illustrated in FIG. 5, an end surface 21h of the first die pad 21 that is closer to the first end surface 63 of the encapsulation resin 60 and an end surface 24f of the second die pad 24 that is closer to the first end surface 63 of the encapsulation resin 60 are flush with the first end surface 63 of the encapsulation resin 60. In other words, the first die pad 21 and the second die pad 24 are exposed from the first end surface 63 of the encapsulation resin 60 in the vertical direction Z.

As illustrated in FIG. 4, the portions of the inner leads 10B in the lead frame assembly 10 that are closer to the outer lead 10A than the third die pad 27 are located at position separated from the positions of the first die pad 21 and the second die pad 24 in the vertical direction Z. Specifically, the ends of the first inner lead 22 and second inner lead 25 closer to the first side surface 61 and the distal ends of the third inner lead 28, fourth inner lead 32, and fifth to ninth inner leads 15a to 19a are located closer to the second end surface 64 of the encapsulation resin 60 than the first die pad 21 and the second die pad 24 in the vertical direction Z. The ends of the first inner lead 22 and second inner lead 25 that are closer to the first side surface 61 and the distal ends of the third inner lead 28, fourth inner lead 32, and fifth to ninth inner leads 15a to 19a are located at the same level as the third die pad 27 in the vertical direction Z. Therefore, the positions of the ends of the first outer lead 23, second outer lead 26, third outer lead 29, fourth outer lead 33, and fifth outer lead 15b to ninth outer lead 19b that are closer to the first side surface 61 of the encapsulation resin 60, that is, the positions where the outer leads 10A protrude from the first side surface 61 of the encapsulation resin 60 are located at the same level in the vertical direction Z.

Among, the portions of the inner leads 10B in the lead frames 11 to 19 of the lead frame assembly 10 that are connected to the small-current connection members 72 are located at the same height in the vertical direction Z as the third die pad 27. The portions connected to the small-current connection members 72 in the inner leads 10B are closer to the first side surface 61 of the encapsulation resin 60 than the third die pad 27 in the lengthwise direction Y.

The first side surface 61 and the second side surface 62 of the encapsulation resin 60 are each inclined from the outer lead protruding position relative to the vertical direction Z in order to provide a draft angle that facilitates removal of a die mold when molding the encapsulation resin 60. Specifically, the first side surface 61 includes a first inclined surface 61a, extending from the first end surface 63 of the encapsulation resin 60 to the outer lead protruding position, and a second inclined surface 61b, extending from the first inclined surface 61a to the second end surface 64. The first inclined surface 61a is inclined toward the second side surface 62 as the first inclined surface 61a approaches the first end surface 63 of the encapsulation resin 60 in the vertical direction Z. The second inclined surface 61b is inclined toward second side surface 62 as the second inclined surface 61b approaches the second end surface 64 in the vertical direction Z. The second side surface 62 includes a first inclined surface 62a at a portion corresponding to where the first die pad 21 and the second die pad 24 are located, and a second inclined surface 62b extending from the first inclined surface 62a to the first end surface 63. The first inclined surface 62a is inclined toward the first side surface 61 as the first inclined surface 62a approaches the first end surface 63 in the vertical direction Z. The first inclined surface 62a is equal in inclination angle to the first inclined surface 61a, for example. The second inclined surface 62b is inclined toward the first side surface 61 as the second inclined surface 62b approaches the second end surface 64 in the vertical direction Z. The second inclined surface 62b is equal in inclination angle to the second inclined surface 61b, for example.

The shape of the lead frame assembly 10 will now be described in detail.

Figure 6:
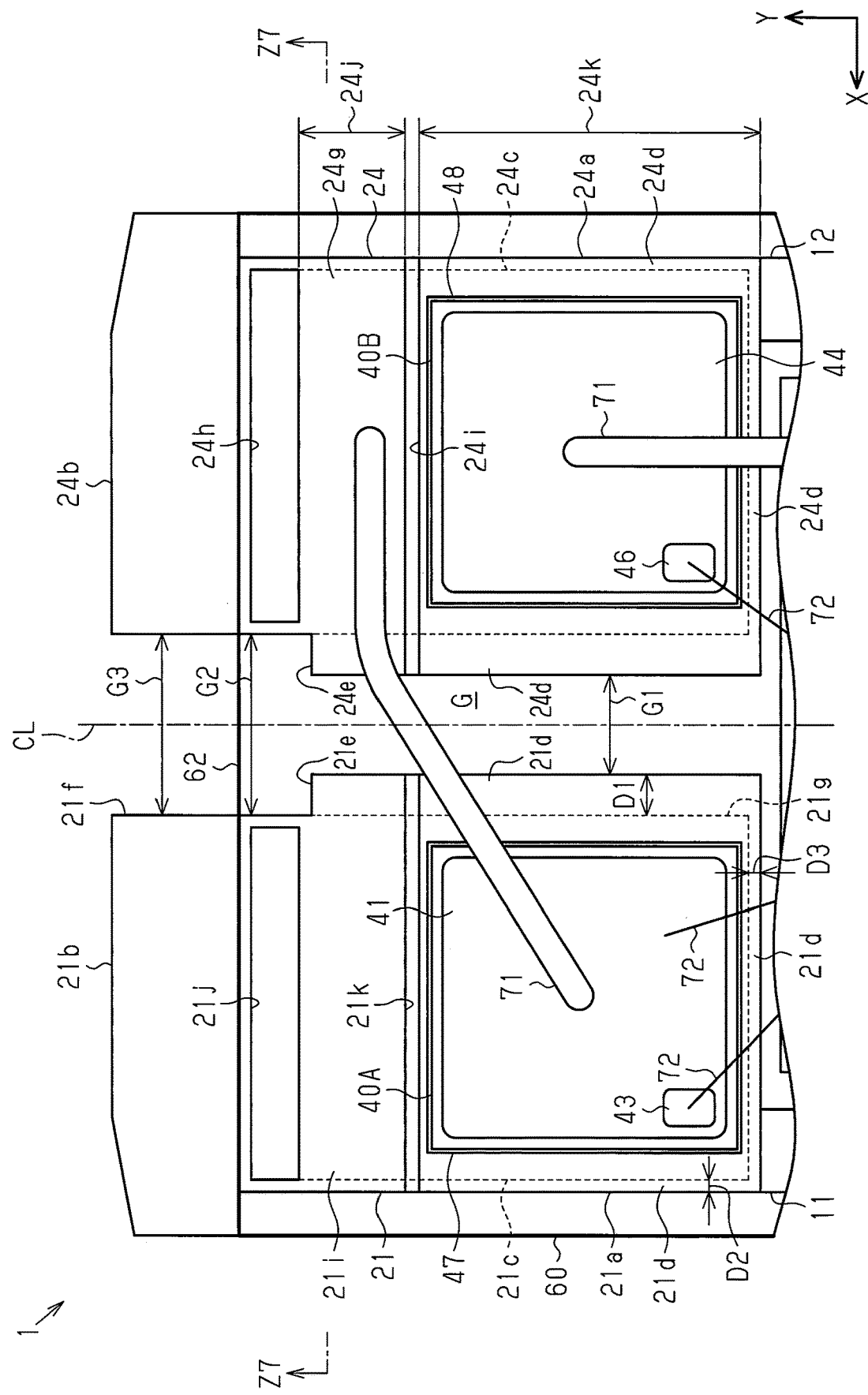
FIG. 6 is an enlarged schematic plan view of a first die pad, a second die pad, and peripheral components shown in FIG. 3.
Figure 7:
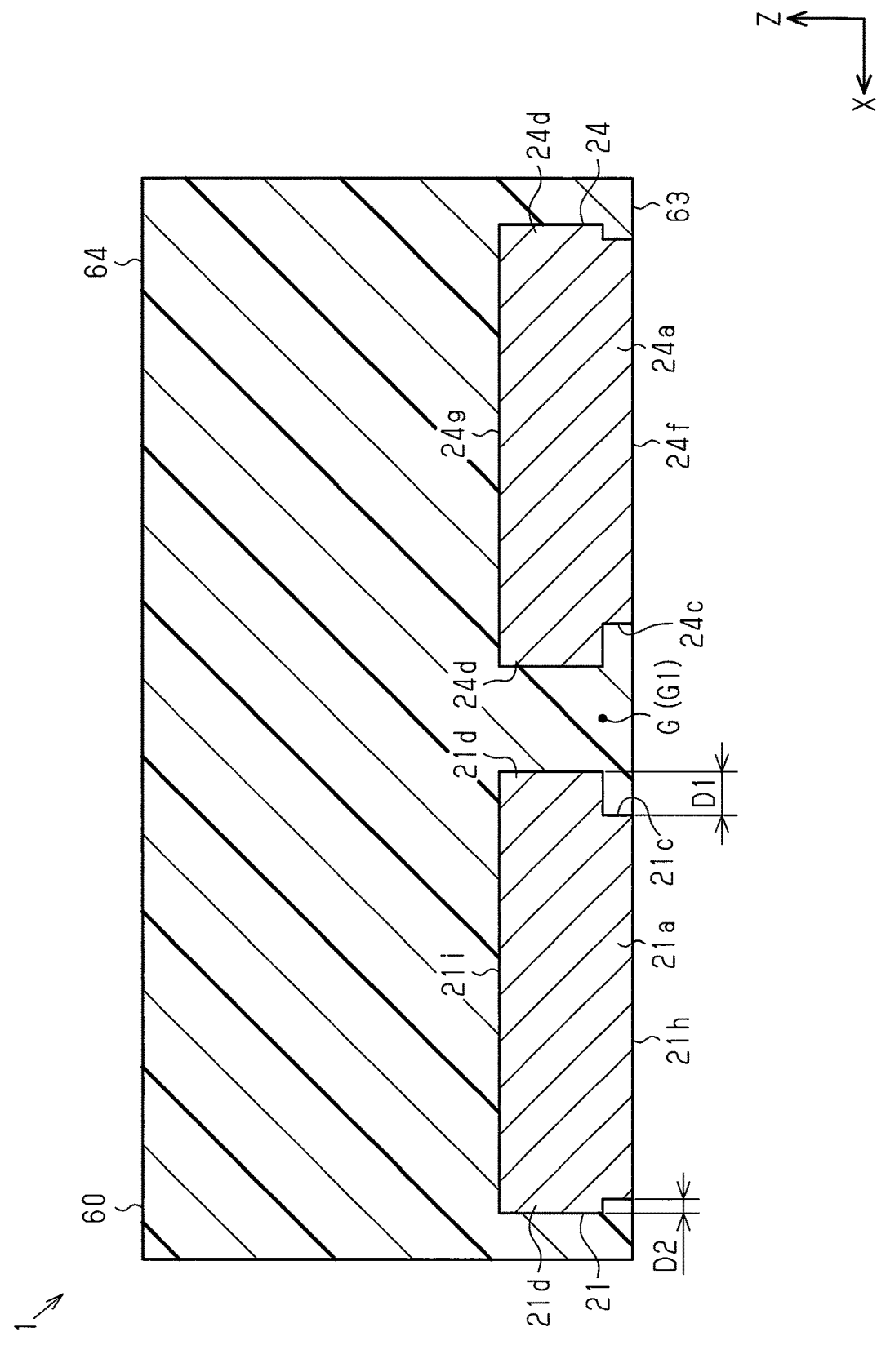
FIG. 7 is a cross-sectional view taken along line Z7-Z7 in FIG. 6.

As illustrated in FIG. 6, the first die pad 21 includes a first accommodated portion 21a, which is encapsulated in the encapsulation resin 60, and a first protruding portion 21b, which protrudes out of the encapsulation resin 60. As illustrated in FIGS. 6 and 7, the first accommodated portion 21a has a base 21c, which is shown by broken lines in FIG. 6, and a flange 21d, which extends from the end of the base 21c that is closer to the first switching element 40A in the vertical direction Z, in the sideward direction X and toward the first side surface 61 (see FIG. 3) of the encapsulation resin 60.

In the sideward direction X, a protruding length D1, in the sideward direction X, of the flange 21d protruding inward (i.e., toward center line CL in sideward direction X) from an inner peripheral edge of the base 21c in the sideward direction X is longer than a protruding length D2, in the sideward direction X, of the flange 21d protruding outward (i.e., away from center line CL in sideward direction X) from an outer peripheral edge of the base 21c in the sideward direction X and a protruding length D3, in the lengthwise direction Y, of the flange 21d protruding from the base 21c toward the first side surface 61 of the encapsulation resin 60. The flange 21d protruding inward from the inner peripheral edge of the base 21c in the sideward direction X includes a cutout portion 21e at the end closer to the second side surface 62 of the encapsulation resin 60. In other words, the flange 21d protruding inward from the inner peripheral edge of the base 21c in the sideward direction X is not formed at an end, closer to the second side surface 62 of the encapsulation resin 60, of the first die pad 21.

An inner surface 21f of the first protruding portion 21b is flush with an inner surface 21g of the base 21c in the sideward direction X. The outer side of the first protruding portion 21b is located outward (i.e., away from center line CL) from the outer side of the first accommodated portion 21a in the sideward direction X. The outer side of the first protruding portion 21b serves as a hook caught on the second side surface 62 of the encapsulation resin 60.

The first accommodated portion 21a of the first die pad 21 includes a first recess 21j in a portion close to the second side surface 62 of the encapsulation resin 60. The first recess 21j is recessed in the vertical direction Z from a support surface 21i of the first die pad 21 supporting the first switching element 40A. The first recess 21j is a groove extending in the sideward direction X. The first recess 21j and the first switching element 40A are located at different positions in the lengthwise direction Y. The first accommodated portion 21a includes a groove 21k spaced apart from the first recess 21j toward the first switching element 40A in the lengthwise direction Y. The groove 21k extends in the sideward direction X. The groove 21k is formed over the entire first die pad 21 in the sideward direction X. In other words, the groove 21k is longer in the sideward direction X than the first recess 21j. In addition, the groove 21k is shorter in the lengthwise direction Y than the first recess 21j. When molding the encapsulation resin 60, the first recess 21j and the groove 21k are filled with the resin.

In the same manner as the first die pad 21, the second die pad 24 includes a second accommodated portion 24a, which is encapsulated in the encapsulation resin 60, and a second protruding portion 24b, which protrudes out of the encapsulation resin 60. In the same manner as the first accommodated portion 21a, the second accommodated portion 24a has a base 24c, a flange 24d, and a cutout portion 24e.

The second accommodated portion 24a includes a second recess 24h and a groove 24i. The second recess 24h and the groove 24i are recessed in the vertical direction Z from a support surface 24g supporting the second switching element 40B. In the same manner as the first recess 21j, the second recess 24h is a groove extending in the sideward direction X. The second recess 24h is located at a position in the lengthwise direction Y that is separate from the second switching element 40B and the groove 24i. The groove 24i is formed between the large-current connection member 71, which is connected to the second die pad 24, and the second switching element 40B in the lengthwise direction Y. In other words, the groove 24i is closer to the second switching element 40B than the second recess 24h in the second die pad 24. The groove 24i is longer in the sideward direction X than the second recess 24h. The groove 24i is shorter in the lengthwise direction Y than the second recess 24h.

The second accommodated portion 24a of the second die pad 24 has a connection region 24j where the large-current connection member 71 is connected and a support region 24k where the second switching element 40B is supported. The connection region 24j is formed between the second recess 24h and the groove 24i in the lengthwise direction Y on the support surface 24g of the second die pad 24. The support region 24k is formed closer to the second switching element 40B than the connection region 24j on the support surface 24g. As described above, the connection region 24j and the support region 24k are arranged next to each other in the lengthwise direction Y. When molding the encapsulation resin 60, the second recess 24h and the groove 24i are filled with the resin.

A gap G is formed between the first die pad 21 and the second die pad 24 in the sideward direction X such that the first die pad 21 and the second die pad 24 are electrically insulated from each other. Specifically, a gap G1 between the inner side of the flange 21d of the first die pad 21 in the sideward direction X and the inner side of the flange 24d of the second die pad 24 in the sideward direction X is shorter than a gap G2 between the cutout portion 21e and the cutout portion 24e (G1<G2). A gap G3 between the first protruding portion 21b and the second protruding portion 24b is equal to the gap G2 (G3=G2). In this embodiment, the gap G2 is twice as large as the gap G1. The gap G1 is, for example, 1 mm, and each of the gap G2 and the gap G3 is, for example, 2 mm. The gap G2 may be shorter than the gap G3.

As described above, the shortest distance between the first protruding portion 21b and the second protruding portion 24b (length of the gap G3 in sideward direction X) is longer than the shortest distance between the first accommodated portion 21a and the second accommodated portion 24a (length of the gap G1 in sideward direction X).

As illustrated in FIG. 7, since the first accommodated portion 21a of the first die pad 21 and the second accommodated portion 24a of the second die pad 24 are molded in the encapsulation resin 60, the gap G between the first accommodated portion 21a and the second accommodated portion 24a is filled with the resin of the encapsulation resin 60. Moreover, the flange 21d of the first die pad 21 and the flange 24d of the second die pad 24 increase a contact area of the first accommodated portion 21a and a contact area of the second accommodated portion 24a with the encapsulation resin 60.

Figure 8:
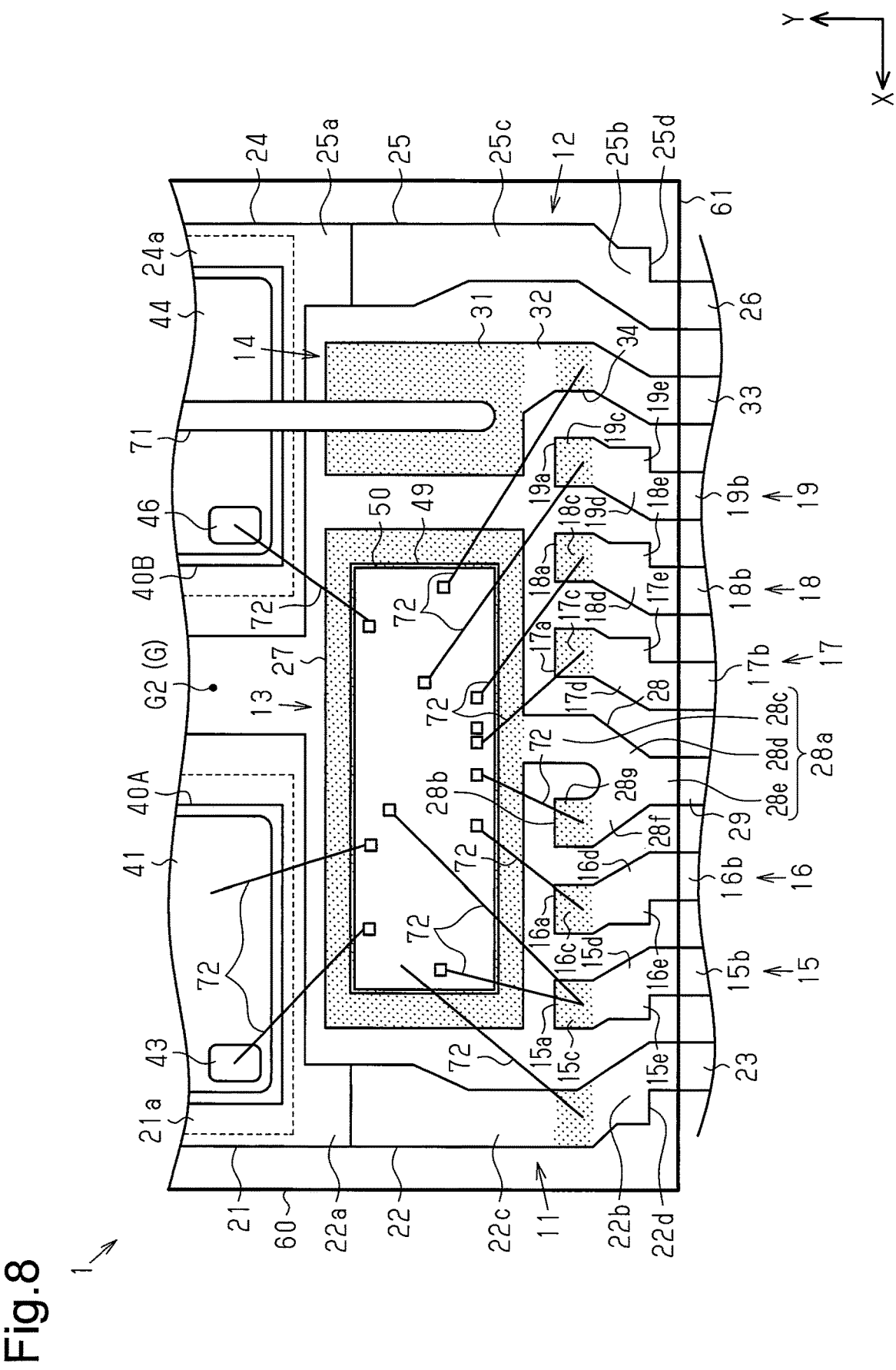
FIG. 8 is an enlarged schematic plan view of a third die pad and peripheral components in FIG. 3.

As illustrated in FIG. 8, the first inner lead 22 extends from one end surface, in the lengthwise direction Y, of the first accommodated portion 21a of the first die pad 21 at one end in the sideward direction X. The first inner lead 22 includes a first connection portion 22a, which is a portion connected with the first die pad 21, a second connection portion 22b, which is a portion connected with the first outer lead 23, and an inclined portion 22c formed between the first connection portion 22a and the second connection portion 22b in the lengthwise direction Y. The first connection portion 22a is longer in the sideward direction X than the second connection portion 22b. Specifically, the minimum dimension of the first connection portion 22a in the sideward direction X is larger than that of the second connection portion 22b.

The second connection portion 22b has a restriction 22d that restricts movement of the first inner lead 22 relative to the encapsulation resin 60 in the lengthwise direction Y toward the first side surface 61. The restriction 22d includes a surface protruding in the sideward direction X from the first outer lead 23 and extending in the sideward direction X. In this embodiment, the restriction 22d protrudes outward in the sideward direction X from the first outer lead 23.

As illustrated in FIG. 4, the inclined portion 22c is inclined toward the second end surface 64 of the encapsulation resin 60 in the vertical direction Z as the inclined portion 22c approaches the first side surface 61 of the encapsulation resin 60 in the lengthwise direction Y. As illustrated in FIG. 8, the width of the inclined portion 22c at the side closer to the first connection portion 22a (maximum dimension in sideward direction X) is equal to the dimension of the first connection portion 22a in the sideward direction X and larger than the width of the inclined portion 22c (minimum dimension in sideward direction X) at the side closer to the second connection portion 22b. An inner side of the inclined portion 22c in the sideward direction X at a section closer to the second connection portion 22b is recessed outward in the sideward direction X with from the section closer to the first connection portion 22a.

In the same manner as the first inner lead 22, the second inner lead 25 of the second lead frame 12 has a first connection portion 25a, a second connection portion 25b, an inclined portion 25c, and a restriction 25d. The second inner lead 25 extends from the end surface of the second accommodated portion 24a of the second die pad 24 in the lengthwise direction Y at the other end in the sideward direction X.

As illustrated in FIG. 8, the third die pad 27 is rectangular and elongated in the sideward direction X. The third die pad 27 is formed so that the dimension in the sideward direction X is two times or greater and three times or less than the dimension in the lengthwise direction Y (in this embodiment, dimension in sideward direction X is 2.7 times as large as dimension in lengthwise direction Y). The third die pad 27 has a larger dimension in the sideward direction X than the first die pad 21 and the second die pad 24. The third die pad 27 is smaller in dimension in the lengthwise direction Y than the first accommodated portion 21a of the first die pad 21 and the second accommodated portion 24a of the second die pad 24. The integrated circuit element 50 is mounted on the center of the third die pad 27. An outer peripheral edge of the integrated circuit element 50 is located inward from an outer peripheral edge of the third die pad 27. The integrated circuit element 50 is located toward the first switching element 40A from the second switching element 40B in the sideward direction X.

The third inner lead 28 includes a main body 28a connecting the third die pad 27 to the third outer lead 29, and a projecting portion 28b having a section projecting from a side surface of the main body 28a in a direction that differs from the lengthwise direction Y in a plan view. The third inner lead 28 is bifurcated in the sideward direction X into the main body 28a and the projecting portion 28b. The main body 28a includes a first portion 28c extending in the lengthwise direction Y from the third die pad 27 toward the first side surface 61 of the encapsulation resin 60, a second portion 28d inclined toward the first inner lead 22 as the second portion 28d approaches from the first portion 28c to the first side surface 61 of the encapsulation resin 60, and a third portion 28e extending in the lengthwise direction Y from the end of the second portion 28d closer to the first side surface 61 toward the first side surface 61. The projecting portion 28b is hook-shaped from the main body 28a. Specifically, the projecting portion 28b includes a first projection 28f, which is inclined from the end of the second portion 28d closer to the first side surface 61 of the encapsulation resin 60 toward the first inner lead 22 as the first projection 28f approaches the third die pad 27, and a second projection 28g, which extends in the lengthwise direction Y toward the third die pad 27 from the end of the first projection 28f closer to the third die pad 27. The second projection 28g forms a distal end of the projecting portion 28b. The second projection 28g and the first portion 28c are adjacent to each other and spaced apart from each other in the sideward direction X.

The connection portion 31 of the fourth lead frame 14 is rectangular and elongated in the lengthwise direction Y. The connection portion 31 is equal in dimension in the lengthwise direction Y to the third die pad 27. The connection portion 31 is smaller in dimension in the sideward direction X than the first die pad 21 and the second die pad 24.

A bent portion 34 is defined by an inner peripheral edge of the fourth inner lead 32 (i.e., edge closer to ninth lead frame 19 in fourth inner lead 32). The bent portion 34 is recessed toward the second inner lead 25. An outer edge of a portion of the fourth inner lead 32 (i.e., edge closer to second inner lead 25 in fourth inner lead 32) that is close to the connection portion 31 extends in the lengthwise direction Y. With this configuration, the width (i.e., dimension in sideward direction X) of the fourth inner lead 32 at the section close to the connection portion 31 in the bent portion 34 decreases toward the first side surface 61 of the encapsulation resin 60.

The fifth inner lead 15a has a distal end 15c, which extends in the lengthwise direction Y, and an inclined portion 15d, which is inclined toward the second inner lead 25 as the inclined portion 15d approaches the first side surface 61 of the encapsulation resin 60 from the distal end 15c. The fifth inner lead 15a has a restriction 15e restricting movement of the fifth lead frame 15 toward the first side surface 61 in the lengthwise direction Y. The restriction 15e has a surface protruding in the sideward direction X from the inclined portion 15d of the fifth outer lead 15b and extending in the sideward direction X. Likewise, the sixth inner lead 16a to the ninth inner lead 19a respectively have distal ends 16c, 17c, 18c, and 19c, inclined portions 16d, 17d, 18d, and 19d, and restrictions 16e, 17e, 18e, and 19e. The inclined portion 16d and the inclined portion 15d are inclined in the same direction. The inclined portions 17d, 18d, and 19d are inclined in a direction opposite to the direction in which the inclined portion 15d is inclined. That is, the inclined portions 17d, 18d, and 19d are inclined toward the first inner lead 22 as the inclined portions 17d, 18d, and 19d approach the first side surface 61.

The distal end 19c of the ninth lead frame 19 partially overlaps the connection portion 31 in the lengthwise direction Y. The bent portion 34 of the fourth inner lead 32 forms an appropriate gap between the ninth inner lead 19a and the fourth inner lead 32 in the sideward direction X.

The structure connecting the lead frame assembly 10 to the first switching element 40A, the second switching element 40B, the integrated circuit element 50, and the small-current connection members 72 will now be described.

As illustrated in FIG. 6, the first switching element 40A is supported on the first die pad 21 by a solder paste 47, which is one example of a first conductive paste, and thus connected to the first die pad 21. Likewise, the second switching element 40B is supported on the second die pad 24 by a solder paste 48, which is one example of a second conductive paste, and thus connected to the second die pad 24.

As illustrated in FIG. 8, the integrated circuit element 50 is connected to the third die pad 27 by a silver paste 49, which is one example of a third conductive paste. In this case, optimal pastes are used as the first conductive paste and the second conductive paste, which respectively connect the first switching element 40A and the second switching element 40B to the first die pad 21 and the second die pad 24, and the third conductive paste, which connect the integrated circuit element 50 to the third die pad 27. In this embodiment, the first conductive paste is the same as the second conductive paste. Moreover, the third conductive paste differs from the first conductive paste and the second conductive paste. The first to third conductive pastes may be the same. The first to third conductive pastes may be conductive adhesives.

In this embodiment, the support surface 21i of the first die pad 21 and the support surface 24g of the second die pad 24 are not plated. The third die pad 27 is plated with silver. The connection portion 31 is plated with silver.

The small-current connection members 72 connected to the integrated circuit element 50 are respectively connected to the second projection 28g of the third inner lead 28, the fourth inner lead 32, and the distal end 15c of the fifth inner lead 15a to the distal end 19c of the ninth inner lead 19a.

As shown by the shading in FIG. 8, in the third lead frame 13 to the ninth lead frame 19, portions to which the small-current connection members 72 are connected are plated with silver. Specifically, the second projection 28g of the third inner lead 28, part of the bent portion 34 of the fourth inner lead 32, and the distal ends 15c to 19c of the fifth to ninth inner leads 15a to 19a are plated with silver. The silver plating may be substituted by nickel plating or a palladium pre-plated lead frame (PPF).

Method for Manufacturing Power Module

With reference to FIGS. 9 and 10A to 10D, a method for manufacturing the power module 1 will now be described.

Figure 9:
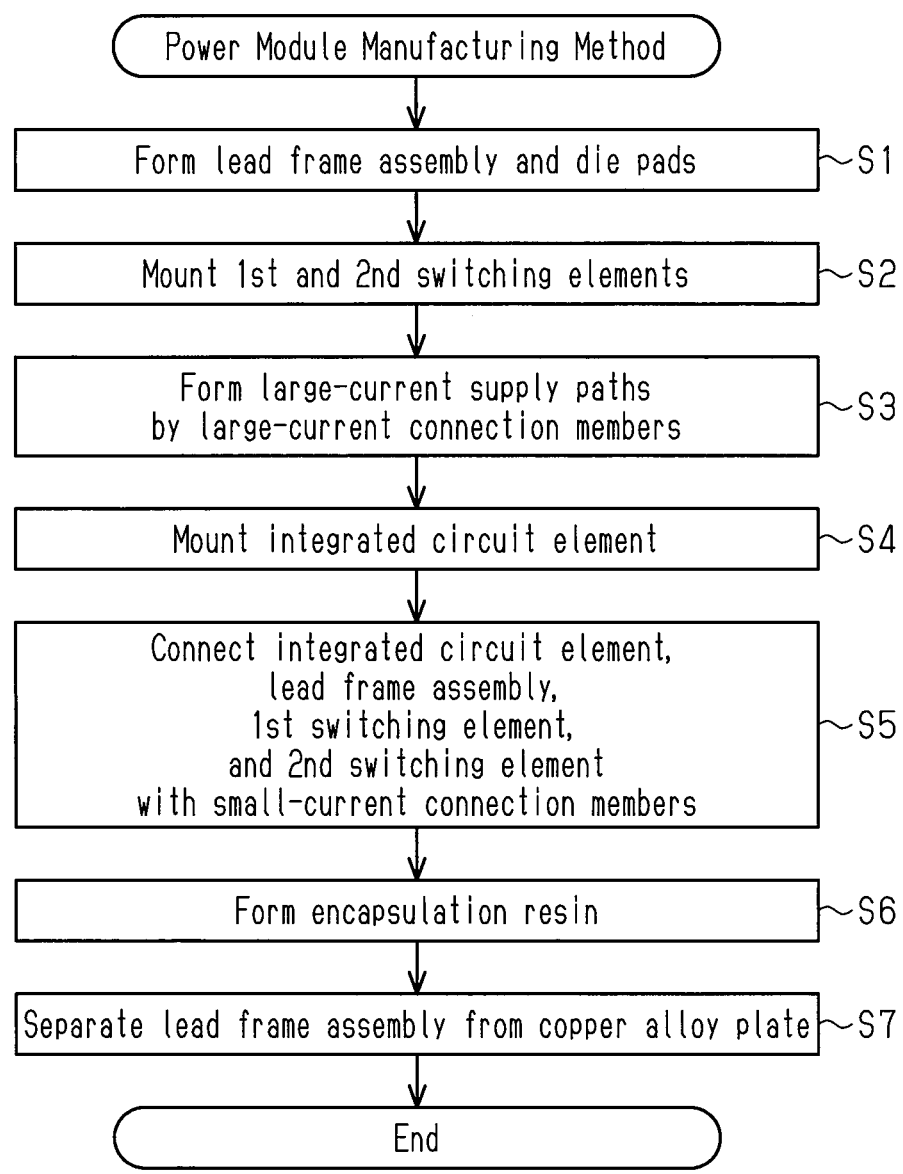
FIG. 9 is a flowchart that illustrates a method for manufacturing the power module of FIG. 1.

FIG. 9 is a flowchart illustrating the method for manufacturing the power module 1. FIGS. 10A to 10D illustrate the steps of manufacturing the power module 1 in sequential order.

Figure 10A:
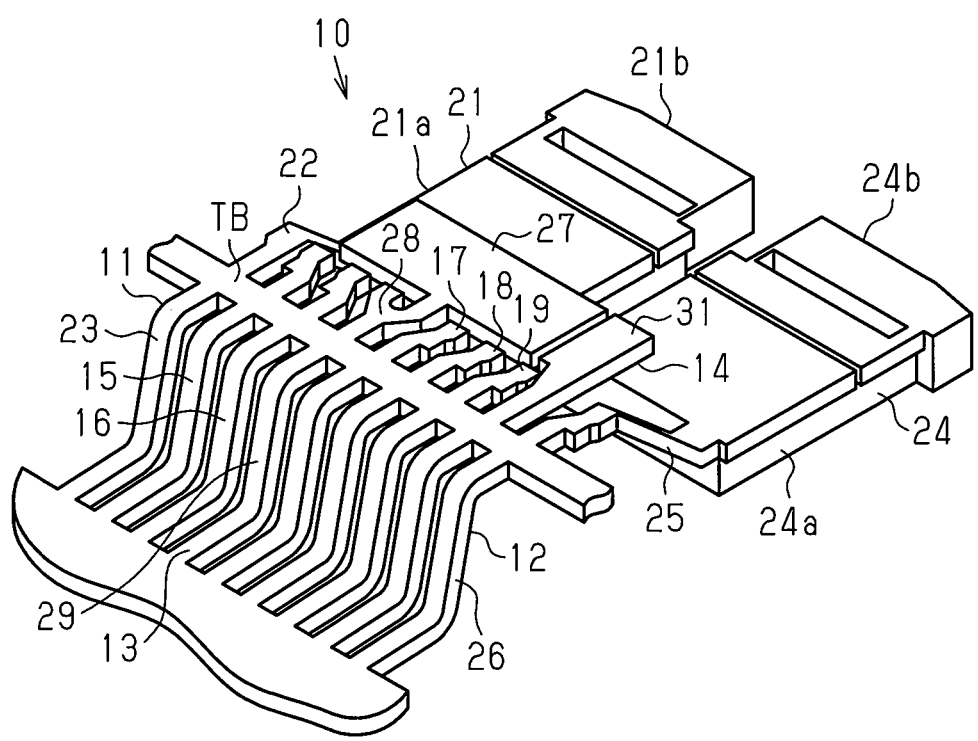
FIG. 10A illustrates part of a step for manufacturing the power module of FIG. 1.

First, the lead frame assembly 10 and the die pads 21, 24, and 27 are formed (step S1 of FIG. 9). Specifically, as illustrated in FIG. 10A, a copper alloy plate is pressed to form the first lead frame 11 to the ninth lead frame 19. In this case, a tie bars TB couples the first lead frame 11 to the ninth lead frame 19 to one another and to the copper alloy plate. In this embodiment, the first die pad 21, the first inner lead 22, and the first outer lead 23 are integrated into a single component. Further, the second die pad 24, the second inner lead 25, and the second outer lead 26 are integrated into a single component. In addition, the third die pad 27, the third inner lead 28, and the third outer lead 29 are integrated into a single component.

Figure 10B:
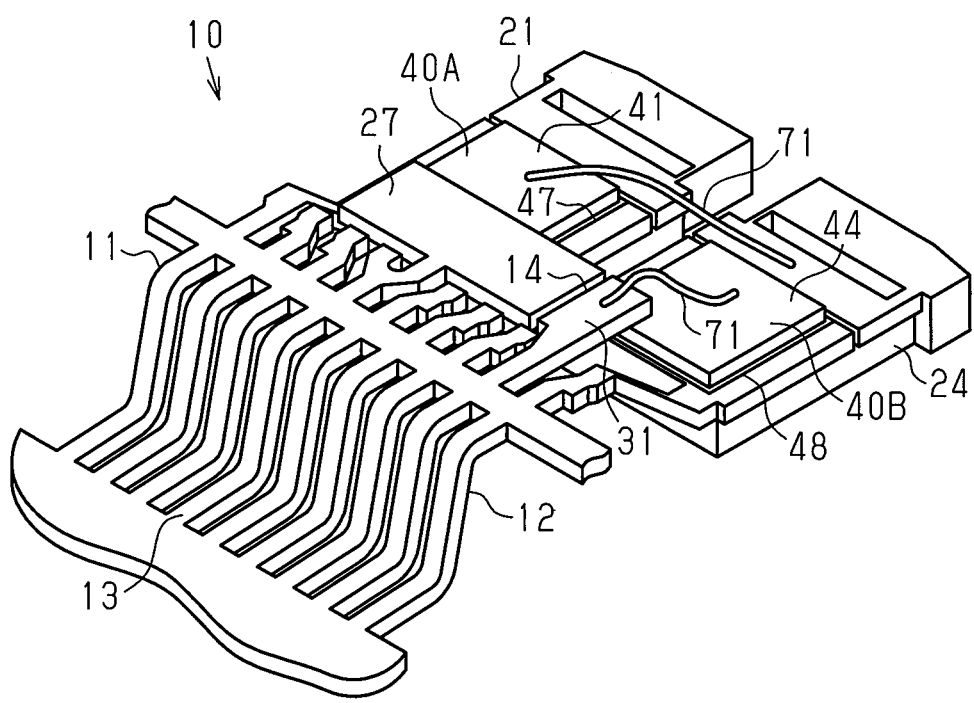
FIG. 10B illustrates a step subsequent to the step of FIG. 10A.

As illustrated in FIG. 10B, next, the first switching element 40A is mounted on the first die pad 21, and the second switching element 40B is mounted on the second die pad 24 (step S2 of FIG. 9). Specifically, the first switching element 40A and the second switching element 40B are picked up by a die bonder device (not shown), and the solder paste 47 and the solder paste 48 are respectively applied to the first die pad 21 and the second die pad 24. The first switching element 40A and the second switching element 40B are then respectively fixed onto the solder paste 47 and the solder paste 48 by the die bonder device.

Next, large-current supply paths are formed by the large-current connection members 71 (step S3 of FIG. 9). Specifically, as illustrated in FIG. 10B, for example, wire bonding is performed to connect the source 41 of the first switching element 40A and the second die pad 24 with the large-current connection member 71. Likewise, wire bonding is performed to connect the source 44 of the second switching element 40B and connection portion 31 of the fourth lead frame 14 with the large-current connection member 71.

Figure 10C:
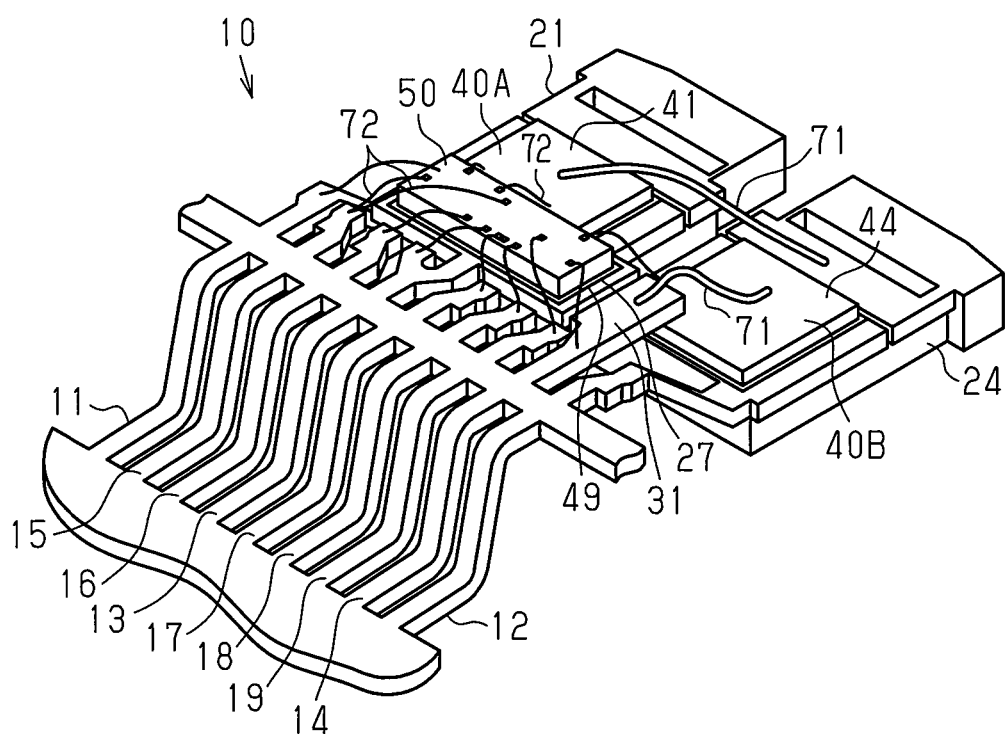
FIG. 10C illustrates a step subsequent to the step of FIG. 10B.

As illustrated in FIG. 10C, next, the integrated circuit element 50 is mounted on the third die pad 27 of the third lead frame 13 (step S4 of FIG. 9). Specifically, the integrated circuit element 50 is picked up by the die bonder device, and the silver paste 49 is applied to the third die pad 27. The integrated circuit element 50 is then fixed onto a silver paste 49 by the die bonder device.

Next, the integrated circuit element 50 is connected to the lead frame assembly 10, the first switching element 40A, and the second switching element 40B by the small-current connection members 72 (step S5 of FIG. 9). Specifically, as illustrated in FIG. 10C, wire bonding is performed to connect the integrated circuit element 50 to the source 41 of the first switching element 40A, the gate 43 of the first switching element 40A (see FIG. 6), the gate 46 of the second switching element 40B (see FIG. 6), and the third lead frame 13 to the ninth lead frame 19 with the small-current connection members 72. After step S3 of FIG. 9, silver plating (or nickel plating, PPF) may be applied to the third die pad 27, connection portion 31, and lead frame assembly 10 where the small-current connection members 72 are connected.

Figure 10D:
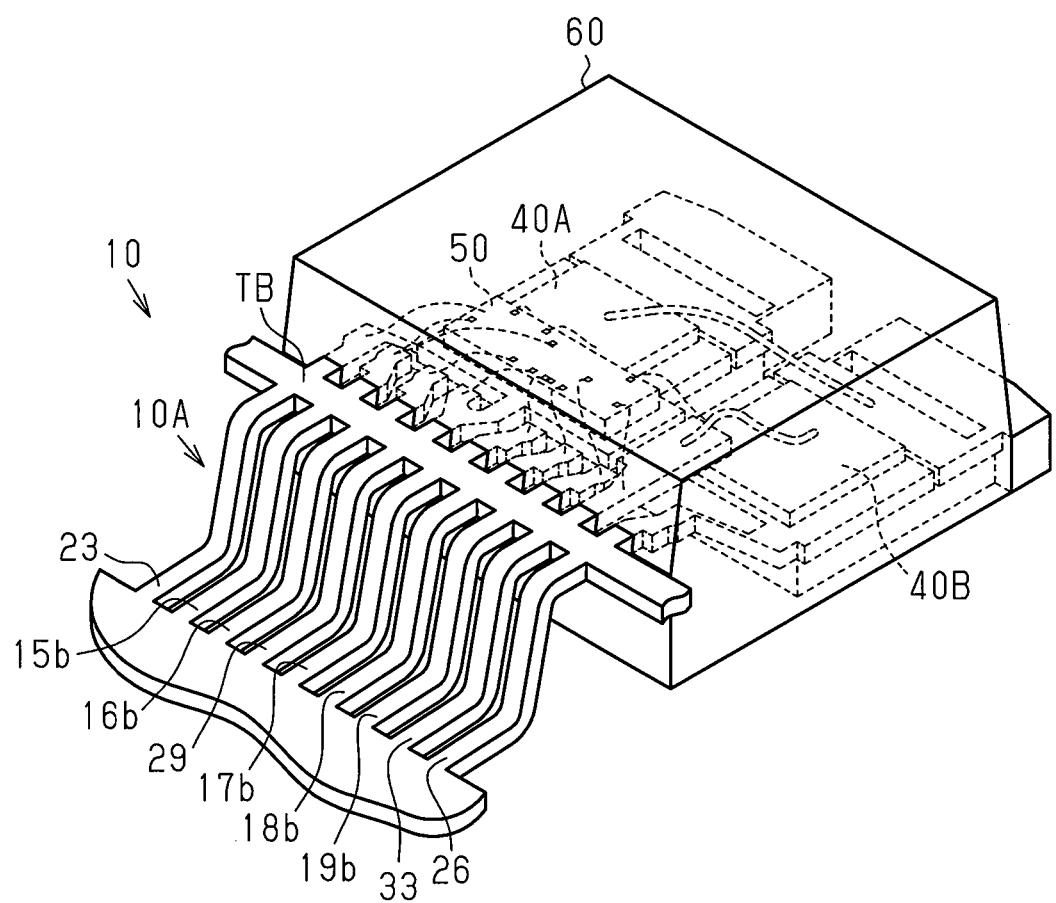
FIG. 10D illustrates a step subsequent to the step of FIG. 10C.

As illustrated in FIG. 10D, next, for example, a molding device is used to mold the encapsulation resin 60 (step S6 of FIG. 9). Specifically, in a state in which the assembly manufactured in step S5 of FIG. 9 is arranged in a cavity of a mold in the molding apparatus, the mold cavity is filled with molten epoxy resin. This forms the encapsulation resin 60 that encapsulates the first switching element 40A, the second switching element 40B, and the integrated circuit element 50. At this time, the tie bar TB prevents the resin configuring the encapsulation resin 60 from moving toward the outer leads 10A of the lead frame assembly 10.

Finally, the lead frame assembly 10 is separated from the copper alloy plate (step S7 of FIG. 9). Here, the tie bar TB is also cut away. As a result, the outer leads 10A are electrically insulated from one another. The steps described above obtain the power module 1 illustrated in FIG. 1.

Advantages

The power module 1 has the advantages described below.

(1) In the power module 1, the first switching element 40A, the second switching element 40B, and the integrated circuit element 50 controlling the switching operation of the first switching element 40A and the switching operation of the second switching element 40B are encapsulated in the encapsulation resin 60. This modularizes the first switching element 40A, the second switching element 40B, and the integrated circuit element 50 in a single package and reduces the mounting area on a circuit board as compared with when the first switching element 40A, the second switching element 40B, and the integrated circuit element 50 are independently mounted on the circuit board.

(2) The first switching element 40A is mounted on the support surface 21i of the first die pad 21 with the solder paste 47 arranged in between, and the second switching element 40B is mounted on the support surface 24g of the second die pad 24 with the solder paste 48 arranged in between. In this configuration, heat from the first switching element 40A easily transfers to the first die pad 21 via the solder paste 47, and heat from the second switching element 40B easily transfers to the second die pad 24 via the solder paste 48. This limits temperature increases in the first switching element 40A and the second switching element 40B.

As described above, the drain 42 of the first switching element 40A is connected to the first die pad 21, and the drain 45 of the second switching element 40B is connected to the second die pad 24. The gap G is formed between the first die pad 21 and the second die pad 24 such that the first die pad 21 and the second die pad 24 are electrically insulated from each other. This avoids short-circuiting between the drain 42 of the first switching element 40A and the drain 45 of the second switching element 40B.

(3) With regard to the gap G between the first die pad 21 and the second die pad 24, the shortest distance between the first protruding portion 21b and the second protruding portion 24b (length of the gap G3 in sideward direction X) is longer than the shortest distance between the first accommodated portion 21a and the second accommodated portion 24a (length of the gap G1 in sideward direction X). In this configuration, the resin of the encapsulation resin 60 between the first accommodated portion 21a and the second accommodated portion 24a restricts contact of the first accommodated portion 21a and the second accommodated portion 24a. This ensures electrical insulation between the first accommodated portion 21a and the second accommodated portion 24a even when the gap G1 between the first accommodated portion 21a and the second accommodated portion 24a is decreased in the sideward direction X. Thus, the area of the support surface 21i of the first die pad 21 and the area of the support surface 24g of the second die pad 24 may be increased. The first die pad 21 and the second die pad 24 can thus support the first switching element 40A and the second switching element 40B over a large area in a plan view. When the length of the gap G3, serving as open space, in the sideward direction X between the first protruding portion 21b and the second protruding portion 24b is increased, contact of the first protruding portion 21b with the second protruding portion 24b is further restricted. This ensures electrical insulation between the first protruding portion 21b and the second protruding portion 24b.

(4) The first lead frame 11 is a single component into which the first die pad 21, the first inner lead 22, and the first outer lead 23 are integrated. Thus, current flows through the first die pad 21, the first inner lead 22, and the first outer lead 23 with low electric resistance as compared with when the first die pad, the first inner lead, and the first outer lead are separate. In addition, the second lead frame 12 is a single component into which the second die pad 24, the second inner lead 25, and the second outer lead 26 are integrated. Thus, current flows through the second die pad 24, the second inner lead 25, and the second outer lead 26 with low electric resistance as compared with when the second die pad, the second inner lead, and the second outer lead are separate.

(5) The first lead frame 11 is easily heated via the first die pad 21 by the heat generated from the first switching element 40A, and the second lead frame 12 is easily heated via the second die pad 24 by the heat generated from the second switching element 40B. In this embodiment, therefore, the first lead frame 11 and the second lead frame 12 are respectively located at both the ends of the lead frame assembly 10 in the sideward direction X. This reduces the thermal influence of the first lead frame 11 and the second lead frame 12 on the third lead frame 13 to the ninth lead frame 19.

(6) The first die pad 21 and the second die pad 24 are located at positions separated from the position of the third die pad 27 in the vertical direction Z. This allows the first die pad 21, the second die pad 24, and the third die pad 27 to be located at optimum positions in the vertical direction Z.

(7) In the third lead frame 13, the third die pad 27 on which the integrated circuit element 50 is mounted is located at a position in the lengthwise direction Y that differs from that of the first die pad 21 and the second die pad 24. In other words, the third die pad 27 is located closer to the first side surface 61 of the encapsulation resin 60 in the lengthwise direction Y than the first die pad 21 and the second die pad 24. This allows the encapsulation resin 60 to be reduced in size in the sideward direction X as compared with when the first die pad 21, the second die pad 24, and the third die pad 27 are arranged next to one another in the sideward direction X. Thus, the power module 1 can be downsized in the sideward direction X.

(8) The first die pad 21 and the second die pad 24 are greater in thickness than the third die pad 27. Thus, the first die pad 21 and the second die pad 24, which are easily heated by the heat from the first switching element 40A and the heat from the second switching element 40B, have a greater volume than the third die pad 27. That is, the first die pad 21 and the second die pad 24 have a larger heat capacity than the third die pad 27. This limits temperature increases in the first die pad 21 and the second die pad 24 and facilitates heat dissipation from the first switching element 40A and the second switching element 40B.

In addition, the end surface 21h of the first die pad 21 and the end surface 24f of the second die pad 24 are exposed from the first end surface 63 of the encapsulation resin 60. This facilitates heat dissipation from the first die pad 21 and the second die pad 24. In addition, the first protruding portion 21b of the first die pad 21 and the second protruding portion 24b of the second die pad 24 protrude out of the encapsulation resin 60. This further facilitates heat dissipation from the first die pad 21 and the second die pad 24.

(9) The third die pad 27 is equal in thickness to the first lead frame 11 excluding the first die pad 21, the second lead frame 12 excluding the second die pad 24, and the third lead frame 13 to the ninth lead frame 19. This facilitates the manufacturing of the lead frame assembly 10.

(10) The integrated circuit element 50 is located inward from the outer peripheral edge of the third die pad 27. The third die pad 27 is rectangular, elongated in the sideward direction X, and located between the first inner lead 22 of the first lead frame 11 and the second inner lead 25 of the second lead frame 12 in the sideward direction X. This allows for reduction in the area occupied by the first die pad 21, the second die pad 24, and the third die pad 27 in the lengthwise direction Y as compared with when the third die pad is rectangular, elongated in the lengthwise direction Y, and located between the first inner lead 22 and the second inner lead 25. This minimizes enlargement of the encapsulation resin 60 in the lengthwise direction Y.

(11) The first connection portion 22a of the first inner lead 22 extends from the end surface, in the lengthwise direction Y, of the first die pad 21 at one end in the sideward direction X. The first connection portion 25a of the second inner lead 25 extends from the end surface, in the lengthwise direction Y, of the second die pad 24 at the other end in the sideward direction X. This increases the space for the third die pad 27 in the sideward direction X. Therefore, even though the integrated circuit element 50, has a large size in the sideward direction X, the integrated circuit element 50 can be supported at the inner side of the outer peripheral edge of the third die pad 27.

(12) The third inner lead 28 of the third lead frame 13 and the fourth inner lead 32 of the fourth lead frame 14 are electrically connected to the integrated circuit element 50 by the small-current connection members 72. The fifth inner lead 15a of the fifth lead frame 15 to the ninth inner lead 19a of the ninth lead frame 19 are electrically connected to the integrated circuit element 50 by the small-current connection members 72. The inner leads 28, 32, and 15a to 19a are located at the same level in the vertical direction Z as the third die pad 27. This simplifies the configurations of the inner leads 28, 32, and 15a to 19a as compared with when the third inner lead to the ninth inner lead are located at separate positions in the vertical direction Z. Further, the integrated circuit element 50 can easily be connected to the inner leads 28, 32, and 15a to 19a by the small-current connection members 72.

(13) The fourth lead frame 14 is adjacent to the second lead frame 12 in the sideward direction X. Thus, when connecting the integrated circuit element 50 to the fourth inner lead 32 of the fourth lead frame 14 with the small-current connection member 72, the small-current connection member 72 does not have to traverse other inner leads. This allows the integrated circuit element 50 to be easily connected to the fourth inner lead 32 by the small-current connection member 72. The connection reliability is also increased between the small-current connection member 72 and the fourth inner lead 32.

(14) The third die pad 27 and the connection portion 31 of the fourth lead frame 14 are arranged next to each other in the sideward direction X. This limits enlargement of the encapsulation resin 60 in the lengthwise direction Y as compared with when the third die pad 27 and the connection portion 31 are arranged next to each other in the lengthwise direction Y.

In addition, the third die pad 27 and the connection portion 31 are located in the proximity of the first die pad 21 and the second die pad 24 in the lengthwise direction Y in a plan view. This allows the large-current connection members 71 and the small-current connection members 72 to be shortened in length.

(15) When the temperature of the power module 1 increases, the difference in thermal expansion coefficient between different elements may separate the resin of the encapsulation resin 60 from around the integrated circuit element 50 at the silver paste 49 applied to the third die pad 27. The separation further occurs along the third inner lead 28 from the portion where the silver paste 49 and the resin of the encapsulation resin 60 are separated.

In this embodiment, the third inner lead 28 includes the projecting portion 28b that projects from the main body 28a. The integrated circuit element 50 is connected to the projecting portion 28b by the small-current connection member 72. With this configuration, the connection position of the small-current connection member 72 and the third inner lead 28 increases the distance of the path along the third inner lead 28 from the integrated circuit element 50 to the connection position. This limits decreases in the connection reliability of the small-current connection member 72 and the third inner lead 28.

In addition, the projecting portion 28b serves to indicate where to connect the small-current connection member 72. Therefore, a worker can easily recognize where to connect the small-current connection member 72 to the third inner lead 28. Thus, when manufacturing the power module 1, for example, one can easily check whether the small-current connection member 72 is connected to the third inner lead 28 at the correct position.

(16) In the first die pad 21, the first recess 21j and the first switching element 40A are located at different positions in the lengthwise direction Y. In other words, the first recess 21j is located at the end closer to the second side surface 62 of the encapsulation resin 60 in the first die pad 21. This increases the area in which the first die pad 21 is joined with the resin of the encapsulation resin 60. Thus, adhesion is increased between the first die pad 21 and the encapsulation resin 60. In addition, the first recess 21j, which is groove-shaped, extends in the sideward direction X. This further increases the adhesion between the first die pad 21 and the encapsulation resin 60.

(17) In the second die pad 24, the second recess 24h and the second switching element 40B are located at different positions in the lengthwise direction Y. In other words, the second recess 24h is located at the end closer to the second side surface 62 of the encapsulation resin 60 in the second die pad 24. This increases the area in which the second die pad 24 is joined with the resin of the encapsulation resin 60. Thus, adhesion is increased between the second die pad 24 and the encapsulation resin 60. In addition, the second recess 24h, which is groove-shaped, extends in the sideward direction X. This further increase the adhesion between the second die pad 24 and the encapsulation resin 60.

(18) The second die pad 24 includes the connection region 24j where the large-current connection member 71 is connected and the support region 24k where the second switching element 40B is supported. The connection region 24j and the support region 24k are arranged next to each other in the lengthwise direction Y. This reduces the size of the second die pad 24 in the sideward direction X as compared with when the connection region and the support region are arranged next to each other in the sideward direction X. This limits enlargement of the encapsulation resin 60 in the sideward direction X.

(19) In the second die pad 24, the connection region 24j is located between the second recess 24h and the groove 24i in the lengthwise direction Y. With this configuration, the connection region 24j, which is surrounded by the second recess 24h and the groove 24i, serves to indicate where to connect the large-current connection member 71. Therefore, the worker can easily recognize where to connect the large-current connection member 71 to the second die pad 24. Thus, when manufacturing the power module 1, for example, one can easily check whether the large-current connection member 71 is connected to the second die pad 24 at the correct position.

In soldering the large-current connection member 71 to the second die pad 24, the solder flows into the groove 24i. This restricts the flow of solder toward the second switching element 40B.

(20) The groove 24i is smaller in dimension in the lengthwise direction Y than the second recess 24h. This obtains advantages (17) and (19) and limits enlargement of the second die pad 24 in the lengthwise direction Y.

(21) The portions of the lead frame assembly 10 to which the small-current connection members 72 are connected are plated with silver. This limits oxidation of the portions to which the small-current connection members 72 are connected.

(22) The first connection portion 22a, which is close to the first die pad 21, of the first inner lead 22 in the first lead frame 11 is larger in width (minimum dimension in sideward direction X) than the second connection portion 22b, which is close to the first outer lead 23, of the first inner lead 22. The large width of the first connection portion 22a where the first inner lead 22 requires strength increases the strength of the first connection portion 22a. Further, the small width of the second connection portion 22b in the first inner lead 22, which is provided with space that is limited in the sideward direction X, allows the first inner lead 22 to be arranged in the limited space.

The first connection portion 25a, which is close to the second die pad 24, of the second inner lead 25 in the second lead frame 12 is larger in width (minimum dimension in sideward direction X) than the second connection portion 25b, which is close to the second outer lead 26, of the second inner lead 25. The large width of the first connection portion 25a where the second inner lead 25 requires strength increases the strength of the first connection portion 25a. Further, the small width of the second connection portion 25b in the second inner lead 25, which is provided with space that is limited in the sideward direction X, allows the second inner lead 25 to be arranged in the limited space.

(23) The fifth to ninth inner leads 15a to 19a respectively include the restrictions 15e to 19e. This restricts movement of the fifth to ninth lead frames 15 to 19 in the lengthwise direction Y relative to the encapsulation resin 60 and separation of the fifth to ninth lead frames 15 to 19 from the encapsulation resin 60 when manufacturing the power module 1 or when mounting the power module 1 on the circuit board.

Moreover, the first inner lead 22 includes the restriction 22d, and the second inner lead 25 includes the restriction 25d. This restricts movement of the first lead frame 11 and the second lead frame 12 in the lengthwise direction Y relative to the encapsulation resin 60 when manufacturing the power module 1 or when mounting the power module 1 on the circuit board.

(24) In the method for manufacturing the power module 1, the large-current connection member 71 is connected to the connection portion 31, and then the connection portion 31 is plated with silver (or nickel plating, PPF). This increases the connection reliability of the large-current connection member 71 and the connection portion 31.

First Switching Element

With reference to FIGS. 11 to 14, the first switching element 40A will now be described in detail. The second switching element 40B is identical in structure with the first switching element 40A and this will not be described here.

Figure 11:
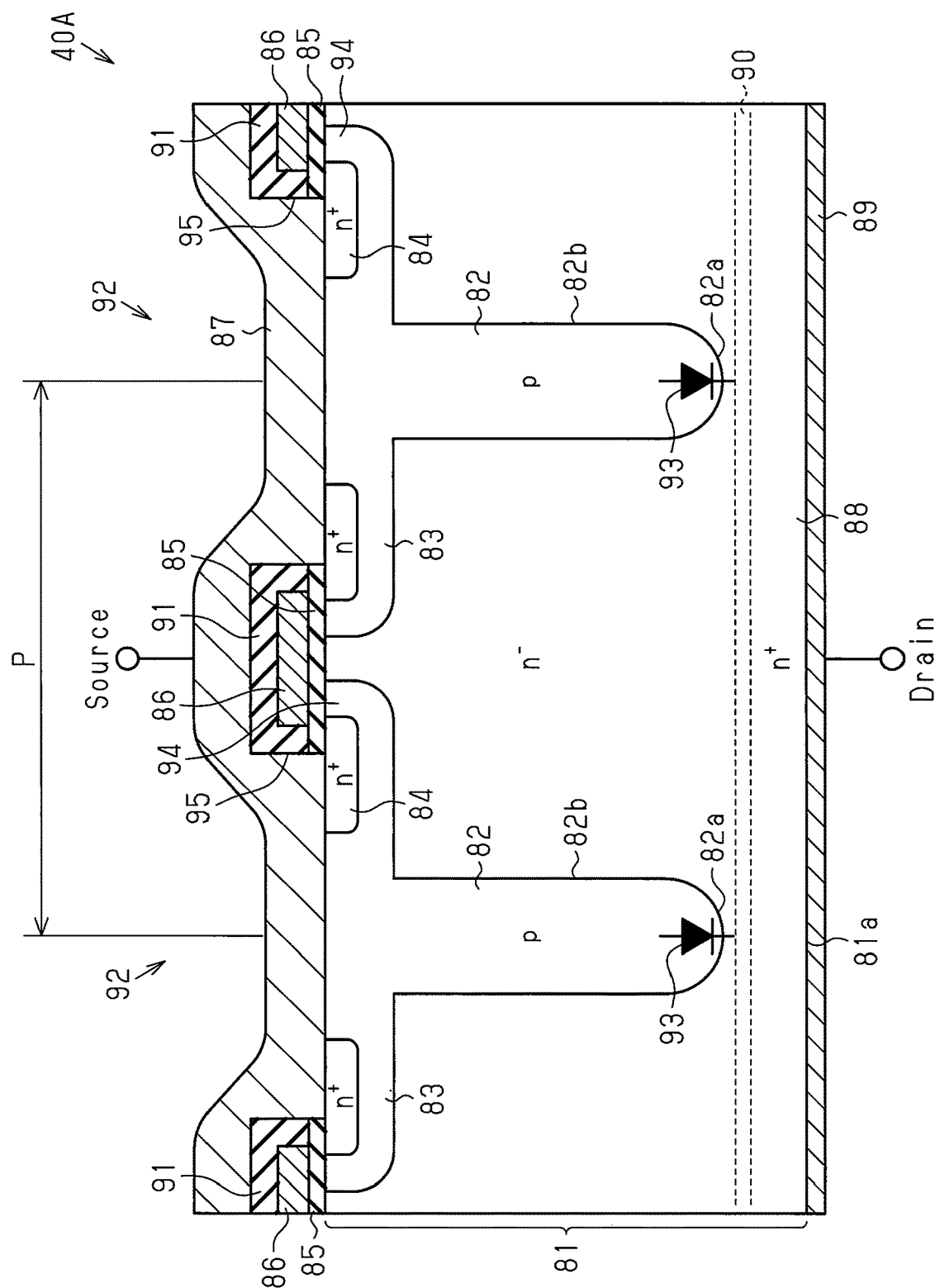
FIG. 11 is a schematic cross-sectional view of a first switching element shown in FIG. 1.

As illustrated in FIG. 11, a MOSFET that forms the first switching element 40A has a superjunction structure. Specifically, the first switching element 40A includes an n⁻-type base layer 81, p-type column layers 82, p-type base layers 83, n⁺-type source layers 84, gate insulative films 85, gate electrodes 86, a source electrode 87, an n⁺-type contact layer 88 serving as a first conduction-type contact layer, a drain electrode 89, and a trap level region 90. Interlayer insulative films 91 are arranged on the gate electrodes 86.

The source electrode 87 forms the source 41 (see FIG. 3), and the drain electrode 89 forms the drain 42 (see FIG. 2). In addition, the gate electrodes 86 are connected to the gate 43 in a state insulated from the source electrode 87.

The n⁻-type base layer 81 is a semiconductor layer into which n-type impurities are implanted. Specifically, the n⁻-type base layer 81 is an n-type epitaxial layer that has undergone epitaxial growth by implanting n-type impurities. Examples of the n-type impurities may include P (phosphorus), As (arsenic), SB (antimony), and the like.

Each of the p-type column layers 82 and p-type base layers 83 is a semiconductor layer into which p-type impurities are implanted. Specifically, each of the p-type column layer 82 and p-type base layer 83 is a semiconductor layer formed by ion-implanting p-type impurities in the n⁻-type base layer 81. Examples of the p-type impurities may include B (boron), Al (aluminum), Ga (gallium), and the like.

Figure 12:
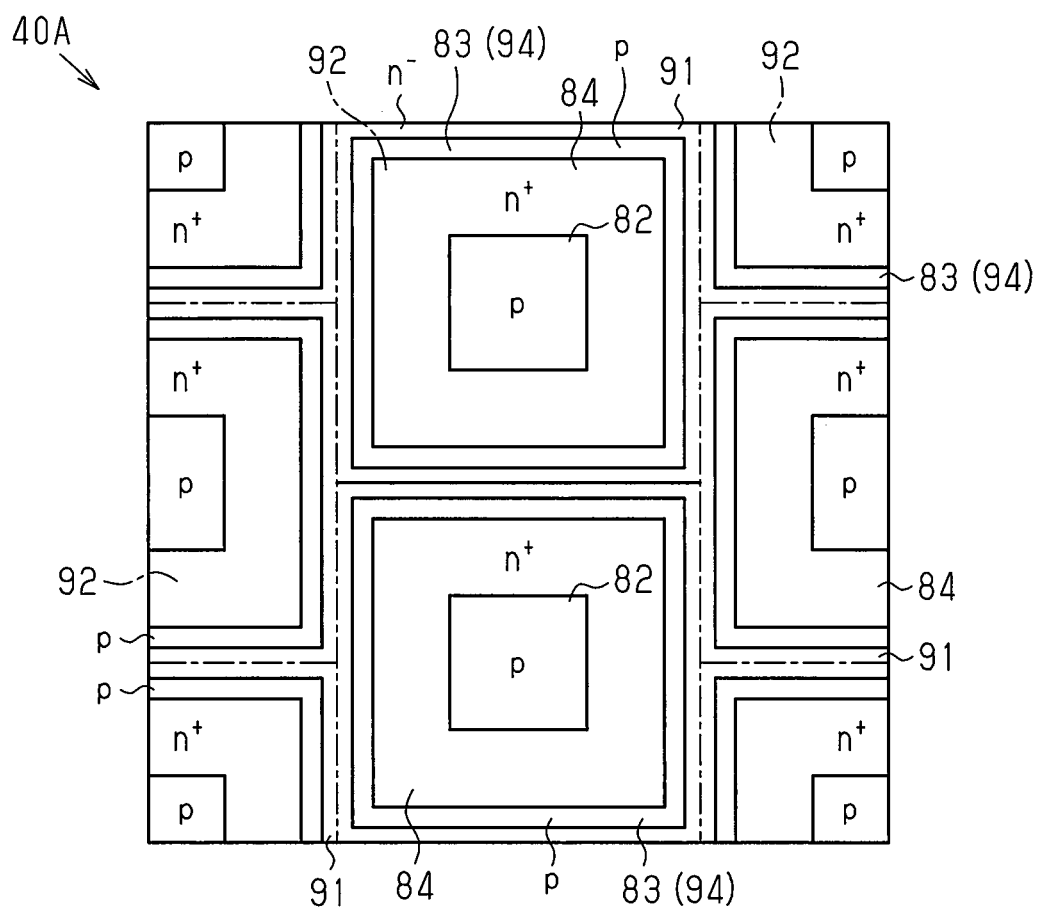
FIG. 12 is a plan view that illustrates one example of a planar layout of a semiconductor layer shown in FIG. 11.
Figure 13:
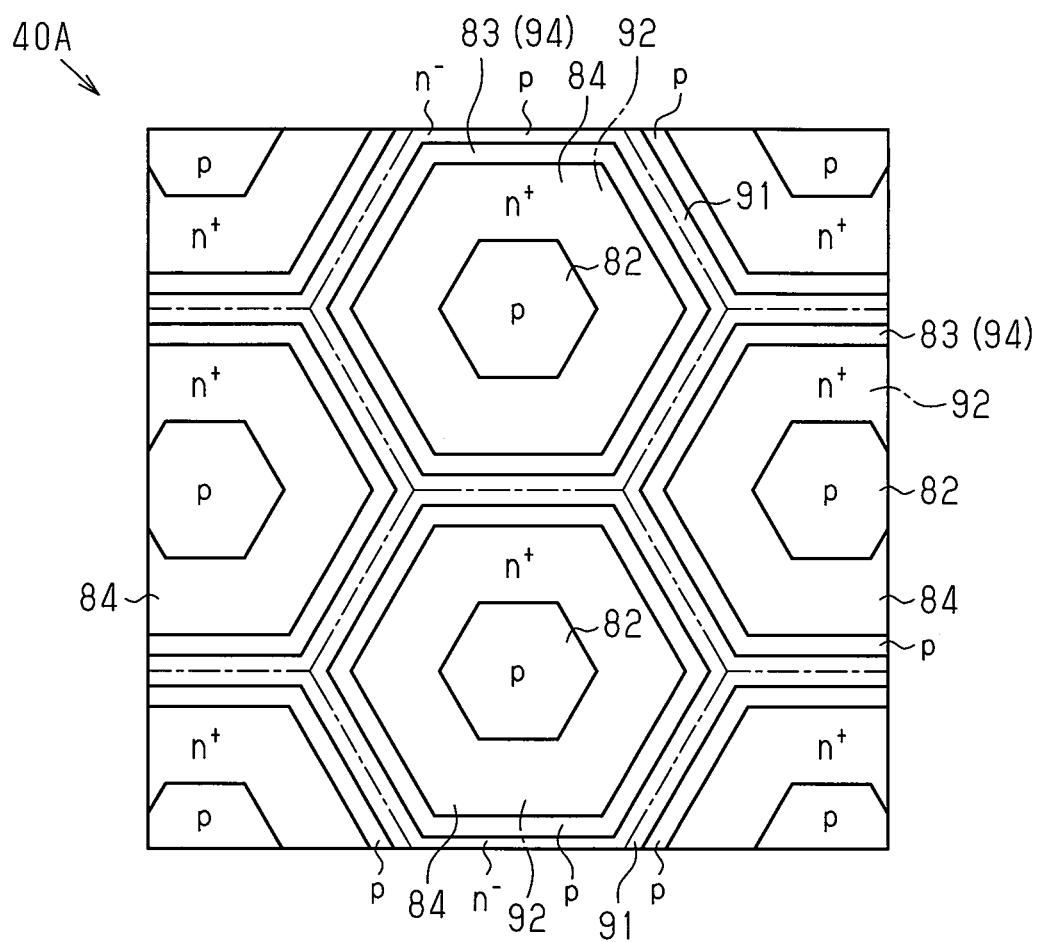
FIG. 13 is a plan view that illustrates another example of a planar layout of the semiconductor layer shown in FIG. 11.
Figure 14:
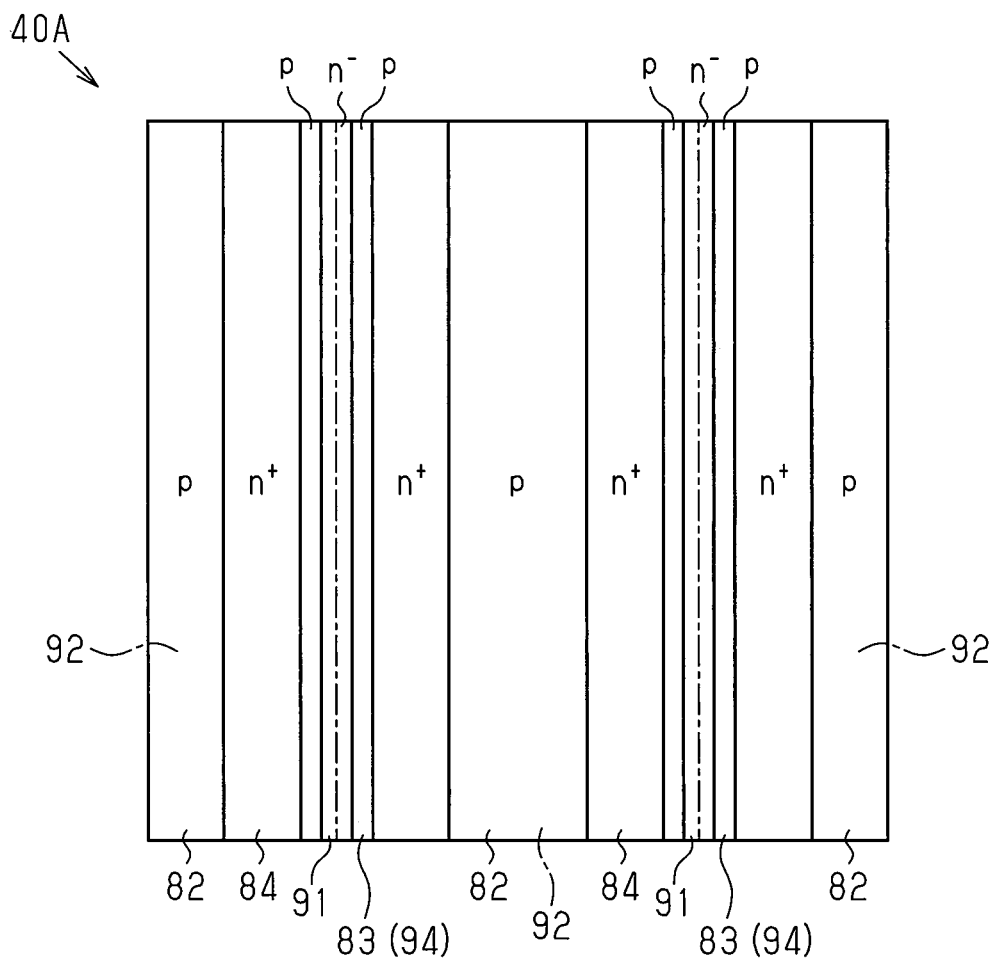
FIG. 14 is a plan view that illustrates a further example of a planar layout of the semiconductor layer shown in FIG. 11.

The p-type base layers 83 are selectively formed in the surface of the n⁻-type base layer 81 in a plurality of regions that are discretely arranged in a regular manner in a plan view of the first switching element 40A (hereinafter simply referred to as "in a plan view"). For example, as illustrated in FIG. 12, square p-type base layers 83 may be arranged in a staggered pattern in a plan view. As illustrated in FIG. 13, for example, hexagonal p-type base layers 83 may be arranged in a staggered pattern in a plan view. As illustrated in FIG. 14, for example, linear p-type base layers 83 may be arranged in a stripe pattern. As illustrated in FIGS. 12 to 14, each region including the p-type base layer 83 and the n⁻-type base layer 81 extending around the p-type base layer 83 (see FIG. 11) forms a cell 92. Specifically, in the layouts of FIGS. 12 and 13, the first switching element 40A has a large number of (plurality of) cells 92 arranged in a lattice pattern in a plan view. In the layout of FIG. 14, the first switching element 40A has a large number of (plurality of) cells 92 arranged in a stripe pattern as seen in a plan view. A pitch P (cell width) between adjacent cells 92 is 5.0 µm to 20 µm.

As illustrated in FIGS. 12 to 14, the p-type column layer 82 is formed in a region inside the p-type base layer 83 in each cell 92 in a plan view. In this embodiment, the p-type column layer 82 is formed in a central region of the p-type base layer 83 with a shape similar to the shape of the p-type base layer 83 (substantially square shape in a plan view in the layout of FIG. 12, hexagonal shape in a plan view in the layout of FIG. 13, linear shape in a plan view in the layout of FIG. 14). As illustrated in FIG. 11, the p-type column layer 82 is formed to be continuous with the p-type base layer 83. In the n⁻-type base layer 81, the p-type column layer 82 extends toward a rear surface 81a of the n⁻-type base layer 81 and to a deeper position than the p-type base layer 83. That is, the p-type column layer 82 is formed in a substantially columnar manner or layered manner (shape of generally quadrangular column in layout of FIG. 12, shape of generally hexagonal column in layout of FIG. 13, shape of generally quadrangular layer in layout of FIG. 14). The thickness T of the n⁻-type base layer 81 from a bottom surface 82a of the p-type column layer 82 to the rear surface 81a of the n⁻-type base layer 81 is preferably 15 µm or greater. When the thickness T is 15 µm or greater, a withstand voltage of 600 V or greater can be obtained. Each p-type column layer 82 includes a side surface 82b (interface with n⁻-type base layer 81) opposing the side surface 82b of another p-type column layer 82 with the n⁻-type base layer 81 located in between.

As illustrated in FIG. 11, the interface of the p-type base layers 83 and p-type column layers 82 with the n⁻-type base layer 81 is a pn junction surface that forms a parasitic diode 93 (body diode).

As illustrated in FIGS. 12 to 14, the n⁺-type source layer 84 is formed in a region inside the p-type base layer 83 in each cell 92 in a plan view. The n⁺-type source layer 84 is selectively formed in the surface of the p-type base layer 83. The n⁺-type source layer 84 may be formed by selectively ion-implanting n-type impurities into the p-type base layer 83. Examples of the n-type impurities are the same as those described above. The n⁺-type source layer 84 is formed in the p-type base layer 83 so as to be located inward by a predetermined distance from the interface between the p-type base layer 83 and the n⁻-type base layer 81. In a surface layer region of the semiconductor layer including the n⁻-type base layer 81, the p-type base layers 83, and the like, the surface of the p-type base layer 83 located between the n⁺-type source layer 84 and the n⁻-type base layer 81 forms a channel region 94.

In this embodiment, the n⁺-type source layer 84 is ring-shaped or linear in a plan view (shape of rectangular ring in layout of FIG. 12, shape of hexagonal ring in layout of FIG. 13, linear shape in layout of FIG. 14). Moreover, the n⁺-type source layer 84 is formed in a region outside the side surface 82b of the p-type column layer 82 in a plan view. The channel region 94 is ring-shaped or linear in a plan view (shape of rectangular ring in layout of FIG. 12, shape of hexagonal ring in layout of FIG. 13, linear shape in layout of FIG. 14) in accordance with the shape of the n'-type source layer 84.

As illustrated in FIG. 11, the gate insulative film 85 is formed to cover at least the channel region 94 in the surface of the p-type base layer 83. In this embodiment, the gate insulative film 85 is formed to cover part of the n'-type source layer 84, the channel region 94, and the n⁻-type base layer 81. In short, the gate insulative film 85 is formed in a pattern having an opening continuously extending from a central region of the p-type base layer 83 to an inner edge region of the n⁺-type source layer 84 in each cell 92. The gate insulative film 85 is formed by, for example, a silicon oxide film, a silicon nitride film, a silicon oxynitride film, a hafnium oxide film, an alumina film, or a tantalum oxide film.

The gate electrode 86 is formed to oppose the channel region 94 with the gate insulative film 85 located between the gate electrode 86 and the channel region 94. The gate electrode 86 is made of, for example, polysilicon of which resistance is lowered by implanted impurities. In this embodiment, the gate electrode 86 is formed in substantially the same pattern as the gate insulative film 85, and is formed to cover the surface of the gate insulative film 85. In other words, the gate electrode 86 is located above part of the n⁺-type source layer 84, the channel region 94, and the surface of the n⁻-type base layer 81. In short, the gate electrode 86 is formed in a pattern having an opening continuously extending from the central region of the p-type base layer 83 to the inner edge region of the n⁺-type source layer 84 in each cell 92. In other words, the gate electrode 86 is formed to commonly control the plurality of cells 92. This configures a planar gate structure.

The interlayer insulative film 91 is formed from, for example, an insulative material such as a silicon oxide film, a silicon nitride film, or TEOS (tetraethoxysilane). The interlayer insulative film 91 is formed to cover an upper surface and side surfaces of the gate electrode 86 and is formed in a pattern having a contact hole 95 continuously extending from the central region of the p-type base layer 83 to the inner edge region of the n⁺-type source layer 84 in each cell 92.

The source electrode 87 is made of aluminum or another metal. The source electrode 87 is formed to cover the surface of the interlayer insulative film 91 and fill the contact hole 95 in each cell 92. This ohmic-connects the source electrode 87 to the n⁺-type source layer 84. Accordingly, the source electrode 87 is connected in parallel to the cells 92 so that the current flowing through the cells 92 all flows in the source electrode 87. Moreover, the ohmic connection of the source electrode 87 and the p-type base layer 83 of each cell 92 through the contact hole 95 stabilizes the potential at the p-type base layer 83.

The n⁺-type contact layer 88 is formed in the vicinity (rear portion) of the rear surface 81a of the n⁻-type base layer 81 over the entire rear surface 81a. The n⁺-type contact layer 88 is formed to a depth at which the n⁺-type contact layer 88 is spaced apart from the bottom surfaces 82a of the p-type column layers 82. The n⁻-type base layer 81 is thus located between the p-type column layers 82 and the n⁺-type contact layer 88.

The drain electrode 89 is made of aluminum or another metal. The drain electrode 89 is formed on the rear surface 81a of the n⁻-type base layer 81 in contact with the n⁺-type contact layer 88. The drain electrode 89 is thus connected in parallel to the cells 92 so that the current flowing through the cells 92 all flow through the drain electrode 89. In this embodiment, the n⁺-type contact layer 88 is formed in the vicinity of the rear surface 81a of the n⁻-type base layer 81. Therefore, the drain electrode 89 is in ohmic contact with the n⁻-type base layer 81 in a satisfactory manner.

When a direct-current power supply is connected between the source electrode 87 and the drain electrode 89 with the drain electrode 89 located a higher potential side and the source electrode 87 located a lower potential side, a reverse bias is applied to the parasitic diode 93. At this time, when a control voltage that is lower than a predetermined threshold voltage is applied to the gate electrode 86, a current path is not formed between the drain and the source. That is, the first switching element 40A is turned off. When a control voltage that is greater than or equal to the predetermined threshold voltage is applied to the gate electrode 86, electrons are attracted to the surface of the channel region 94 to form an inversion layer (channel). The n⁺-type source layer 84 and the n⁻-type base layer 81 are thus electrically connected. In other words, a current path is formed from the source electrode 87 to the drain electrode 89 via the n⁺-type source layer 84, the inversion layer of the channel region 94, and the n⁻-type base layer 81 in this order. That is, the first switching element 40A is turned on.

In this manner, the p-type column layer 82, which is continuous with the p-type base layer 83, extends toward the rear surface 81a of the n⁻-type base layer 81 and forms the MOSFET having the superjunction structure.

The first switching element 40A (second switching element 40B) is applied to an inverter circuit (motor drive circuit) that drives an inductive load such as an electric motor. In this inverter circuit, the potential at the source electrode 87 becomes higher than that at the drain electrode 89. This turns on the parasitic diode 93 so that current flows through the parasitic diode 93. Then, when the potential at the source electrode 87 becomes lower than that at the drain electrode 89, the parasitic diode 93 is shifted to a reverse bias state and turned off. When turned off, a depletion layer expands from a pn junction of the parasitic diode 93, and carriers (holes) in the p-type base layer 83 and p-type column layer 82 move toward the source electrode 87. The movement of the carriers causes current to flow in a direction opposite to the direction when the parasitic diode 93 is turned on. That is, the parasitic diode 93 functions as a reflux diode. The current in the reverse direction is referred to as a reverse recovery current. The reverse recovery current increases once and then decreases. The time until the magnitude of a reverse recovery current decreases to 10% of the maximum value after a forward current of a diode becomes zero is referred to as a reverse recovery time. When a large change occurs in the reverse recovery current (di/dt), vibration (linking) may occur before the current converges to zero. Such a reverse recovery characteristic is referred to as hard recovery, which may cause noise and an erratic action.

The trap level region 90 shortens the reverse recovery time. The trap level region 90 is formed by the emission of charged particles from the rear surface 81a of the n⁻-type base layer 81. The trap level region 90 includes many recombination centers that trap the carriers and recombine the carriers, thereby eliminating the carriers. With this configuration, the carriers can be quickly eliminated when the parasitic diode 93 is turned off. This allows the reverse recovery time to be shortened and the reverse recovery current to be reduced.

The trap level region 90 is formed locally in the n⁻-type base layer 81 so as to spread thinly (with a thickness of, for example, about 1 μm to about 3 μm) from the rear surface 81a of the n⁻-type base layer 81 at a preset depth position. The trap level region 90 may be in contact with the p-type column layer 82. Alternatively, the trap level region 90 may be located between the bottom surface 82a of the p-type column layer 82 and the n⁺-type contact layer 88 without being in contact with the p-type column layer 82. The trap level region 90 is located near the bottom surface 82a of the p-type column layer 82, which is effective for reducing the reverse recovery time. However, the trap level region 90 that is separated from the bottom surface 82a of the p-type column layer 82 is effective for reducing a drain-source leakage current. In order to reduce both the reverse recovery time and the drain-source leakage current, preferably, a center position of the trap level region 90 in the thickness direction is located within a range of 5 μm to 10 μm from the bottom surface 82a of the p-type column layer 82 toward the n⁺-type contact layer 88.

The trap level region 90 can be formed by the emission of charged particles such as protons, $^3\text{He}^{++}$, or $^4\text{He}^{++}$. Particularly, helium nuclei having a larger mass ($^3\text{He}^{++}$ or $^4\text{He}^{++}$) is preferably used since the helium nuclei can narrow a distribution region of recombination centers in the thickness direction and can locally distribute the recombination centers in a narrower range with respect to the thickness direction.

Method for Manufacturing First Switching Element

A method for manufacturing the first switching element 40A will now be described. FIGS. 15A to 15E illustrate some of the manufacturing steps of the first switching element 40A in sequential order. The second switching element 40B is manufactured in the same manner as the first switching element 40A.

Figure 15A:
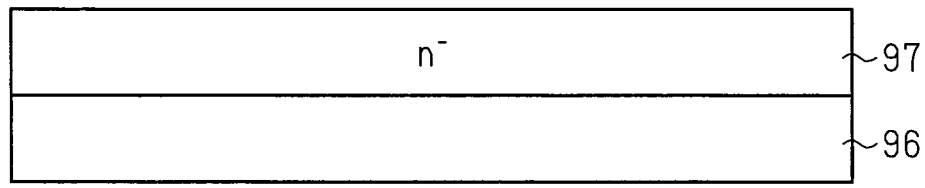
FIG. 15A illustrates a step of manufacturing the first switching element of FIG. 1.

First, as illustrated in FIG. 15A, an initial base layer 97 is formed on a substrate 96 through epitaxial growth by implanting n-type impurities. The epitaxial growth is performed under the conditions of, for example, 5.0 Ω·cm and 50 μm in thickness. The substrate 96 may be an n-type silicon substrate. However, the substrate 96 is to be removed in a later process and, therefore, does not require high quality. The substrate 96 may be an inexpensive substrate.

Figure 15B:
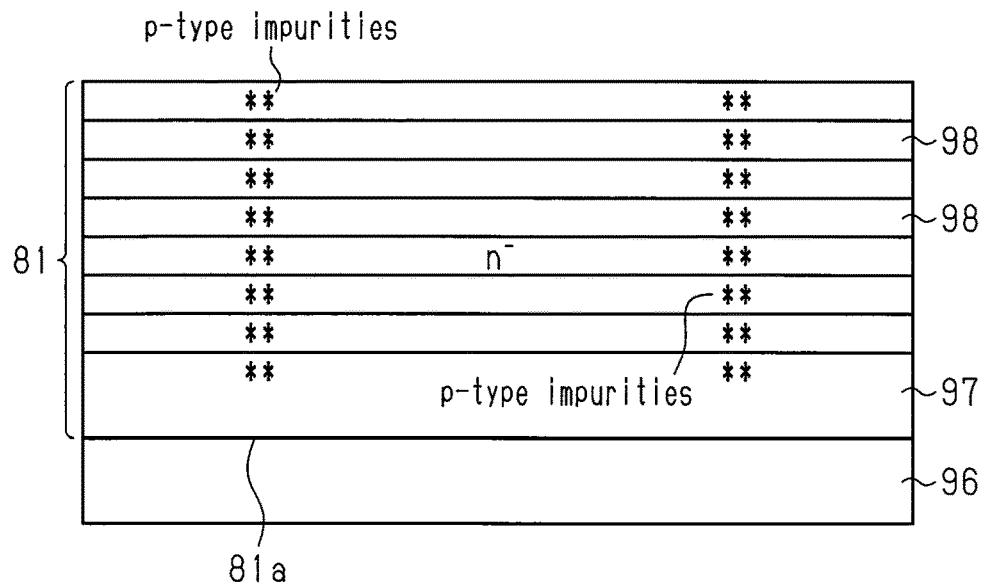
FIG. 15B illustrates a step subsequent to the step of FIG. 15A.

Next, as illustrated in FIG. 15B, multiple epitaxial growth is performed. The multiple epitaxial growth involves repeatedly executing a step of forming a thin n-type semiconductor layer 98 of 5 Ω·cm/6 μm on the initial base layer 97 while selectively implanting p-type impurities into a predetermined position (implanting B ions at 50 keV, $5.3 \times 10^{13}$ cm$^{-2}$, 0 degrees). As a result, a plurality of n-type semiconductor layers 98 are stacked with the positions, where the p-type impurities are implanted, superimposed vertically on each other. The n-type semiconductor layers 98 and the initial base layer 97 are thus integrated to form an n$^-$-type base layer 81.

Figure 15C:
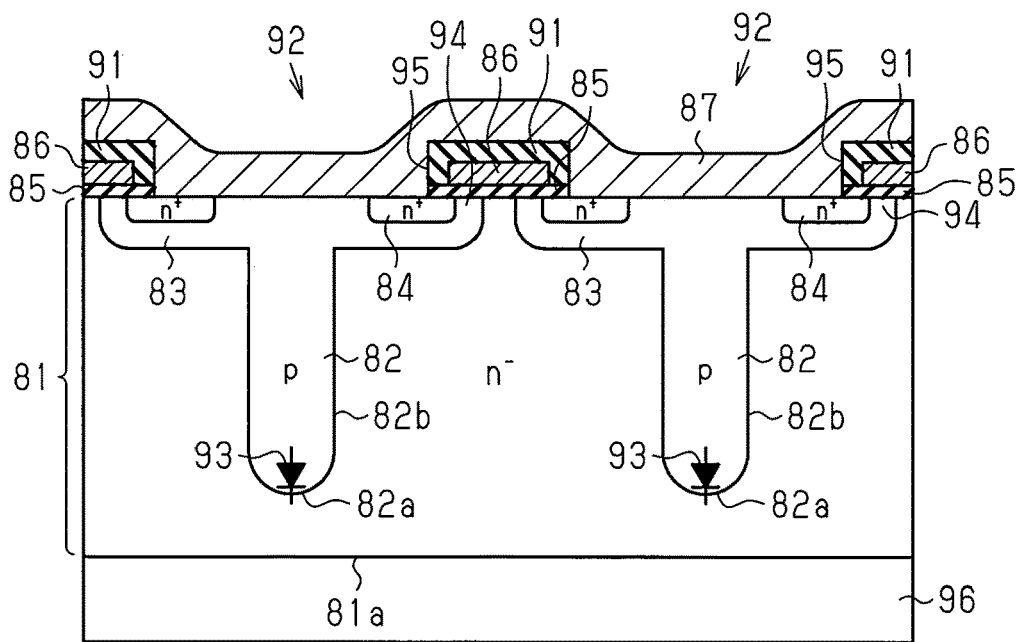
FIG. 15C illustrates a step subsequent to the step of FIG. 15B.

Next, as illustrated in FIG. 15C, an annealing treatment (1000° C. to 1200° C.) is performed to drive-diffuse the p-type impurities in the plurality of n-type semiconductor layers 98. A p-type column layer 82 is thus formed.

Next, p-type impurities are selectively implanted (B ions are implanted at 50 keV, $5.0 \times 10^{15}$ cm$^{-2}$, 7 degrees) in the surface of the n$^-$-type base layer 81 with relatively low energy. A p-type base layer 83 is thus formed. Moreover, n-type impurities are selectively implanted (P ions are implanted at 130 keV, $2.0 \times 10^{15}$ cm$^{-2}$, 7 degrees) in an ring-shaped region of a predetermined width having an outer edge at a position retreated inward by a predetermined distance from an outer peripheral edge of the p-type base layer 83 in the p-type base layer 83 in a plan view. An n$^+$-type source layer 84 is thus formed.

Next, a gate insulative film 85 is formed to cover the surfaces of the n$^-$-type base layer 81 and p-type base layer 83 (surface of semiconductor crystal). This gate insulative film 85 may be formed through thermal oxidation on the surface of the semiconductor crystal. In addition, a gate electrode 86 is formed on the gate insulative film 85. The gate electrode 86 may be formed by, for example, forming a polysilicon film, of which resistance is lowered by addition of impurities, on the entire surface of the gate insulative film 85, and then selectively etching the polysilicon film through photolithography. In this etching, the gate insulative film 85 may be subjected to patterning at the same time so that the gate electrode 86 and the gate insulative film 85 are formed in the same pattern. In addition, an interlayer insulative film 91 (e.g., 32000 angstroms in thickness) is formed to cover the gate electrode 86. A source electrode 87 is formed on the interlayer insulative film 91. If necessary, heat treatment is performed for forming an ohmic junction by alloying. Forming the source electrode 87 may include, for example, a step of forming a barrier film of Ti/TiN (e.g., 250/1300 angstroms) and a step of depositing an AlCu film (e.g., 4.2 μm) on the barrier film. Thereafter, a surface protection film (not shown) (e.g., 16000 angstroms in thickness) is formed, and a pad opening, from which part of the source electrode 87 is exposed as a pad, is formed in the surface protection film.

Figure 15D:
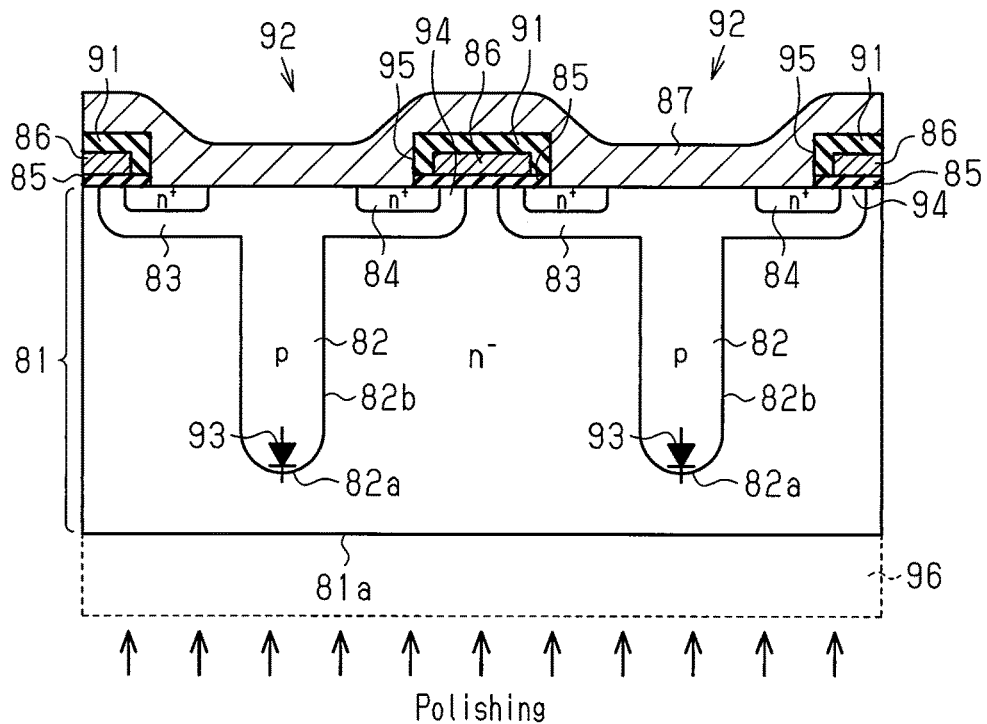
FIG. 15D illustrates a step subsequent to the step of FIG. 15C.

Next, as illustrated in FIG. 15D, the substrate 96 is polished from the back side using, for example, a polisher. The polishing is performed so that the n$^-$-type base layer 81 immediately below the p-type column layer 82 remains 30 μm or greater in thickness T after a rear surface 81a of the n$^-$-type base layer 81 is exposed by completely removing the substrate 96. After the polishing, the rear surface 81a of the n$^-$-type base layer 81 undergoes spin-etching to mirror-finish the rear surface 81a.

As described above, the n$^-$-type base layer 81 is supported on the substrate 96 until the step of FIG. 15D is performed. It is therefore possible to easily transport and handle the n$^-$-type base layer 81. In addition, the polishing of the n$^-$-type base layer 81 and the polishing of the substrate 96 can be continuously performed. It is therefore possible to easily adjust the thickness T of the n$^-$-type base layer 81 immediately below the p-type column layer 82.

Figure 15E:
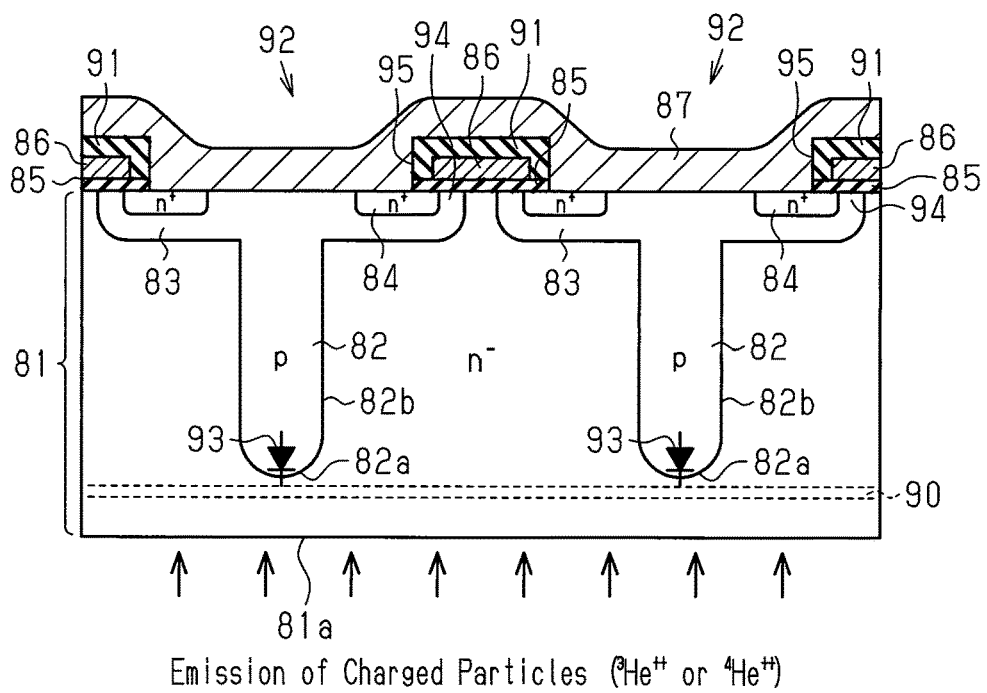
FIG. 15E illustrates a step subsequent to the step of FIG. 15D.

Next, as illustrated in FIG. 15E, charged particles are emitted from the rear surface 81a of the n$^-$-type base layer 81. Charged particles having a relatively large mass, for example, helium nuclei ($^3$He$^{++}$ or $^4$He$^{++}$), are emitted. Then, low-temperature heat treatment (low temperature annealing) is performed. As a result, the emitted charged particles are activated. When helium nuclei ($^3$He$^{++}$ or $^4$He$^{++}$) are selected as the charged particles, the introduced helium nuclei can be activated by heat treatment at 320° C. to 380° C. (e.g., 350° C.) for about 30 minutes to 120 minutes (e.g., 60 minutes).

A trap level region 90 is thus formed. When the energy at the time of charged particle emission is increased, the diffusion length of the charged particles becomes longer, so that the trap level region 90 is formed at a distant position from the rear surface 81a of the n$^-$-type base layer 81. When the energy is decreased, the diffusion length of the charged particles becomes shorter so that the trap level region 90 is formed at a position close to the rear surface 81a of the n$^-$-type base layer 81. Accordingly, the charged particle emission energy is set in accordance with the layout of the trap level region 90. For example, the charged particle emission energy is set (e.g., about 23 MeV) such that the trap level region 90 is located between a bottom surface 82a of the p-type column layer 82 and the n$^+$-type contact layer 88. A dose amount of the charged particles may be, for example, about $5.0 \times 10^{10}$ pieces/cm$^2$ to $5.0 \times 10^{12}$ pieces/cm$^2$.

Next, n-type impurities are implanted (As ions are implanted at 30 keV, $1.0 \times 10^{15}$ cm$^{-2}$, 0 degrees) in the entire rear surface 81a of the n$^-$-type base layer 81, and then annealing treatment is performed. An n$^+$-type contact layer 88 (see FIG. 11) is thus formed. The first switching element 40A illustrated in FIG. 11 can be obtained through the above steps.

Advantages

The first switching element 40A has the advantages described below. The second switching element 40B is identical in configuration to the first switching element 40A and has the same advantages.

(25) The first switching element 40A includes the n$^-$-type base layer 81 serving as a first conduction type base layer, the p-type base layer 83 serving as a second conductive type base layer partially formed on the surface of the n$^-$-type base layer 81, and the n$^+$-type source layer 84 serving as a first conduction type source layer partially formed on the surface of the p-type base layer 83. The first switching element 40A also includes the gate insulative film 85 formed on the surface of the p-type base layer 83 between the n+-type source layer 84 and the n−-type base layer 81, and the gate electrode 86 formed on the gate insulative film 85 so as to oppose the p-type base layer 83 between the n+-type source layer 84 and the n−-type base layer 81 with the gate insulative film 85 located between the gate electrode 86 and the p-type base layer 83. The first switching element 40A also includes the p-type column layer 82 as a second conductive type column layer formed in the n−-type base layer 81 so as to be continuous with the p-type base layer 83, the p-type column layer 82 extending from the p-type base layer 83 toward the rear surface 81a of the n−-type base layer 81. As described above, the p-type column layer 82, which is continuous with the p-type base layer 83, extends toward the rear surface 81a of the n−-type base layer 81. This forms the MOSFET having the superjunction structure.

With this configuration, the depletion layer can expand in the direction along the interface between the p-type column layer 82 and the n−-type base layer 81 (i.e., the thickness direction of the n−-type base layer 81) over the entire interface. It is therefore possible to reduce the ON resistance of the first switching element 40A and to increase the withstand voltage of the first switching element 40A.

(26) The drain electrode 89 is in contact with the solder paste 47 applied to the first die pad 21 (see FIG. 3) of the first lead frame 11. The drain electrode 89 is thus electrically connected to the first die pad 21. As described above, the drain electrode 89 is arranged on the rear surface of the n−-type base layer 81, and the gate electrode 86 and the source electrode 87 are arranged on the surface of the n−-type base layer 81. It is therefore possible to reduce the size of the first switching element 40A in a plan view as compared with when the drain electrode, the gate electrode, and the source electrodes are arranged on the surface of the n−-type base layer 81. It is also possible to reduce the number of components of the power module 1 as compared with a configuration in which the drain electrode 89 is connected to the first die pad 21 via the large-current connection member 71 (see FIG. 3).

(27) The trap level region 90 reduces the reverse recovery time and reverse recovery current of the parasitic diode 93. It is therefore possible to use the parasitic diode 93 as a reflux diode and to simplify the configuration.

More specifically, when the power module 1 is applied to an inductive load such as a coil, it is necessary to return a current to prevent generation of excessively high counter electromotive force. When the power module 1 forms a motor drive circuit that drives, for example, a brushless motor having multiple-phase coils, the power module 1 requires a reflux diode that returns a current at the time of turning off the first switching element 40A (second switching element 40B).

If the parasitic diode 93 is used as a reflux diode, as the reverse recovery time of the parasitic diode 93 becomes longer, the responsiveness of the motor drive circuit decreases. In contrast, for example, a dedicated reflux diode, which has better recovery characteristics than the parasitic diode 93, may be reverse-connected to the first switching element 40A (second switching element 40B). However, the employment of the reflux diode that is separate from the first switching element 40A (second switching element 40B) will enlarge the power module 1.

In this regard, this embodiment employs the trap level region 90. Thus, the recovery characteristic of the parasitic diode 93 can be improved. This improves the responsiveness without adding a separate dedicated reflux diode.

Detailed Circuit Configuration of Integrated Circuit Element and Entire Power Module With reference to FIGS. 16 to 24, the circuit configuration of the integrated circuit element 50 and the entire power module 1 will now be described in detail.

Figure 16:
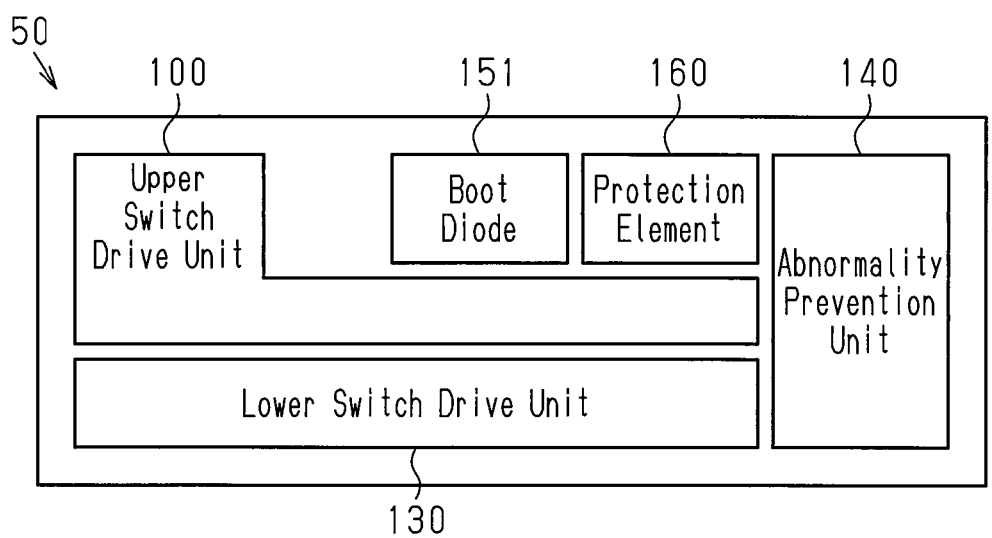
FIG. 16 is a schematic block diagram that illustrates the internal structure of an integrated circuit element shown in FIG. 1.

FIG. 16 illustrates one example of the layout of circuit elements in the integrated circuit element 50. The integrated circuit element 50 includes an upper switch drive unit 100, a lower switch drive unit 130, and an abnormality prevention unit 140. In addition, the integrated circuit element 50 is a monolithic semiconductor integrated circuit element that includes a boot diode 151 and a protection element 160 for reverse connection protection of an external power supply.

Figure 17:
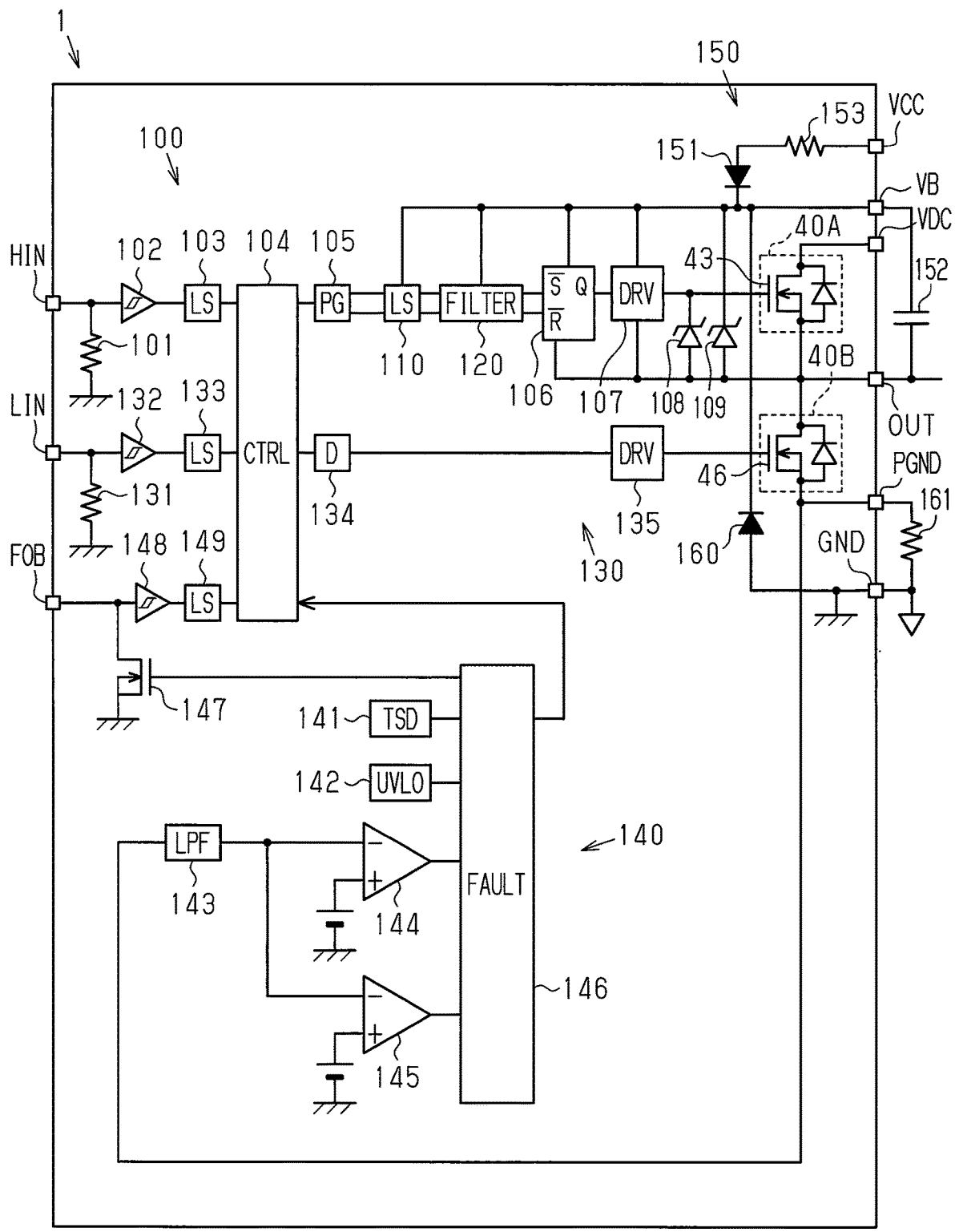
FIG. 17 is a block diagram that illustrates in detail the circuit configuration of the power module of FIG. 1.

FIG. 17 illustrates a circuit configuration in the power module 1 and electronic components connected to the power module 1. Examples of the electronic components to be connected to the power module 1 include a current detecting resistor 161 and a boot capacitor 152. The current detecting resistor 161 is located between the source 44 of the second switching element 40B and ground. The boot capacitor 152 is located between the VB terminal and the OUT terminal.

As illustrated in FIG. 17, the upper switch drive unit 100 includes a resistor 101, a Schmitt trigger 102, a level shifter 103, a controller 104, a pulse generator 105, a level shift circuit 110, a filter circuit 120, an RS flip-flop circuit 106, and a driver 107 arranged in this order from an input side toward an output side.

The resistor 101 pulls down the HIN terminal to the ground terminal. When the HIN terminal is in an open state, therefore, an upper input signal HIN, which serves as a gate signal voltage input to the HIN terminal from the gate drive circuit 211 (see FIG. 27), becomes a low level (logic level for turning off first switching element 40A). As a result, the first switching element 40A is not unintentionally turned on.

The Schmitt trigger 102 transmits an upper input signal HIN, which is input to the HIN terminal, to the level shifter 103. A predetermined hysteresis is given to a threshold voltage of the Schmitt trigger 102. This configuration increases noise resistance.

The level shifter 103 shifts the level of an output signal of the Schmitt trigger 102 to a voltage level (VCC-GND) suitable for input to the controller 104 and then outputs the signal.

The controller 104 determines whether to transmit the output signal from the level shifter 103 to the pulse generator 105 (consequently, whether to drive first switching element 40A) based on an abnormality signal input from an abnormality signal generation circuit 146 and an external abnormality signal input from the FOB terminal.

The pulse generator 105 generates pulse signals of an ON signal $S_{ON}$ (gate signal of a transistor 111 (described later) in the level shift circuit 110) and an OFF signal $S_{OFF}$ (gate signal of a transistor 112 (described later) in the level shift circuit 110) based on an output signal from the controller 104. Specifically, the pulse generator 105 sets the ON signal $S_{ON}$ at a high level only for a predetermined ON period $T_{ON1}$ using a rising edge of the output signal from the controller 104 as a trigger. The pulse generator 105 also sets the OFF signal $S_{OFF}$ at the high level only for a predetermined ON period $T_{ON2}$ using a falling edge of the controller 104 as a trigger.

The output signal from the controller 104 (signal responsive to the upper input signal HIN), the ON period $T_{ON1}$ and the ON period $T_{ON2}$ are set such that both the ON signal $S_{ON}$ and the OFF signal $S_{OFF}$ do not become the high level at the same time. In other words, when the power module 1 is operating normally, at least one of the ON signal $S_{ON}$ and the OFF signal $S_{OFF}$ shifts to a high level, whereas the other signal shifts to a low level.

The level shift circuit 110 shifts the level of a signal and transmits the signal from a low potential block, which includes the pulse generator 105, to a high potential block, which includes the filter circuit 120, the RS flip-flop circuit 106, and the driver 107. Specifically, the level shift circuit 110 receives the pulse signals of the ON signal $S_{ON}$ and OFF signal $S_{OFF}$ from the pulse generator 105 of the low potential block. The level shift circuit 110 shifts the levels of the signals and outputs the signals to the filter circuit 120. The high potential block operates between a boost voltage VB, which is applied to the VB terminal, and a switch voltage VS, which is applied to the OUT terminal.

The filter circuit 120 performs a predetermined filtering process on a signal input from the level shift circuit 110 and outputs the processed signal to the RS flip-flop circuit 106.

The RS flip-flop circuit 106 has a set terminal (S terminal) that receives a set signal $S_{SET}$, a reset terminal (R terminal) that receives a reset signal $S_{RESET}$, and an output terminal (Q terminal) that outputs an output signal $S_Q$. The RS flip-flop circuit 106 sets the output signal $S_Q$ at the high level using a falling edge of the set signal $S_{SET}$ as a trigger. The RS flip-flop circuit 106 also sets the output signal $S_Q$ at the low level using a falling edge of the reset signal $\bar{S}_{RESET}$ as a trigger.

Figure 18:
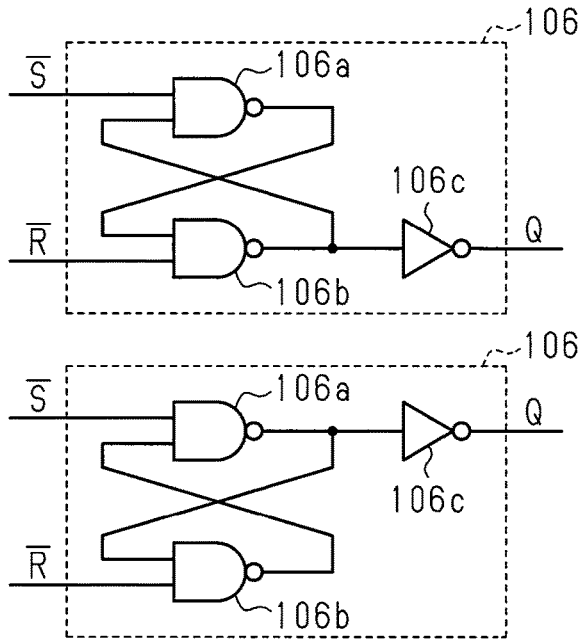
FIG. 18 is a diagram that illustrates in further detail the configuration of an RS flip-flop circuit shown in FIG. 17.

The set signal $S_{SET}$ and the reset signal $S_{RESET}$ are both input from the level shift circuit 110. As illustrated in FIG. 18, the RS flip-flop circuit 106 includes two NAND circuits 106a and 106b, and a NOT circuit 106c. Regarding the form of the RS flip-flop circuit 106, the RS flip-flop circuit 106 may be of a reset priority type as illustrated in the upper side of FIG. 18 or a set priority type as illustrated in the lower side of FIG. 18.

As illustrated in FIG. 17, the driver 107 outputs an upper output signal HO to the gate 43 of the first switching element 40A based on an output signal from the RS flip-flop circuit 106. The upper output signal HO, which is held at the high level, corresponds to a boost voltage VB. The upper output signal HO, which is held at the low level, corresponds to a switch voltage VS.

The upper switch drive unit 100 also includes a first diode 108 and a second diode 109.

The first diode 108 is a Zener diode including an anode electrically connected to the OUT terminal and a cathode electrically connected to the gate 43 (an output side of the driver 107) of the first switching element 40A. The first diode 108 functions as a protection element that limits the application of an overvoltage from the driver 107 to the gate 43 of the first switching element 40A.

The second diode 109 is a Zener diode including an anode electrically connected to the OUT terminal and a cathode electrically connected to the VB terminal. The second diode 109 functions as a protection element that limits the application of an overvoltage from the VCC terminal to the RS flip-flop circuit 106 and the driver 107.

The lower switch drive unit 130 includes a resistor 131, a Schmitt trigger 132, a level shifter 133, a delay portion 134, and a driver 135 arranged in this order from an input side toward an output side. The controller 104 of the upper switch drive unit 100 is located between the level shifter 133 and the delay portion 134.

The controller 104 may include a controller of the upper switch drive unit 100 and a controller of the lower switch drive unit 130 that are separate. In this case, the controller of the lower switch drive unit 130 may be connected between the delay portion 134 and the driver 135. When an abnormality occurs, the second switching element 40B can be quickly turned off since the delay portion 134 is not included.

The resistor 131 pulls down the LIN terminal to the ground terminal. When the LIN terminal is in an open state, therefore, a lower input signal LIN, which serves as a gate signal voltage from the gate drive circuit 211, shifts to a low level (logic level for turning off second switching element 40B). As a result, the second switching element 40B is not unintentionally turned on.

The Schmitt trigger 132 transmits a lower input signal LIN, which is input to the LIN terminal, to the level shifter 133. A predetermined hysteresis is given to a threshold voltage of the Schmitt trigger 132. This configuration increases noise resistance.

The level shifter 133 shifts a level of an output signal from the Schmitt trigger 132 to a voltage level (VCC-GND) suitable for input to the controller 104 and outputs the the signal.

The controller 104 determines whether to transmit an output signal from the delay portion 134 to the driver 135 (consequently, whether to drive second switching element 40B) based on an abnormality signal input from the abnormality signal generation circuit 146 and an external abnormality signal input from the FOB terminal.

The delay portion 134 adds a predetermined delay (corresponding to a circuit delay occurring at the pulse generator 105, level shift circuit 110, and RS flip-flop circuit 106 of the upper switch drive unit 100) to an output signal from the controller 104 and transmits the signal to the driver 135.

The driver 135 outputs a lower output signal LO to the gate 46 of the second switching element 40B based on the output signal from the controller 104 delayed by the delay portion 134. The lower output signal LO, which is held at the high level, corresponds to a power supply voltage VCC, and the lower output signal LO, which is held at the low level, corresponds to a ground voltage VGND.

The abnormality prevention unit 140 includes a thermal shutdown (TSD) circuit 141, a voltage-reduction prevention circuit 142, a low-pass filter circuit 143, a current limiter circuit 144, a power fault prevention circuit 145, the abnormality signal generation circuit 146, a transistor 147, a Schmitt trigger 148, and a level shifter 149.

When a junction temperature of the power module 1 exceeds a predetermined threshold temperature, the TSD circuit 141 switches a thermal shutdown signal from a logic level corresponding to a normal condition (e.g., low level) to a logic level corresponding to an abnormal condition (e.g., high level).

When a power supply voltage VCC becomes less than a predetermined threshold voltage, the voltage-reduction prevention circuit 142 switches a voltage-reduction prevention signal from a logic level corresponding to the normal condition (e.g., low level) to a logic level corresponding to an abnormal condition (e.g., high level).

The low-pass filter circuit 143 outputs a detection voltage CIN to the current limiter circuit 144 and the power fault prevention circuit 145.

When the detection voltage CIN exceeds a first threshold value, the current limiter circuit 144 switches a current limiting signal from a logic level corresponding to a normal condition (e.g., low level) to a logic level corresponding to an abnormal condition (e.g., high level).

When the detection voltage CIN exceeds a second threshold value, the power fault prevention circuit 145 switches a power fault prevention signal from a logic level corresponding to a normal condition (e.g., low level) to a logic level corresponding to an abnormal condition (e.g., high level). One example of the second threshold value is, for example, higher than the first threshold value.

The abnormality signal generation circuit 146 monitors a temperature shutdown signal input from the TSD circuit 141, a voltage-reduction prevention signal input from the voltage-reduction prevention circuit 142, a current limiting signal input from the current limiter circuit 144, a power fault prevention signal input from the power fault prevention circuit 145, and an external abnormality signal input from the FOB terminal. When an abnormality occurs at the current limiter circuit 144, the abnormality signal generation circuit 146 switches a first abnormality signal from a logic level corresponding to a normal condition (e.g., low level) to a logic level corresponding to an abnormal condition (e.g., high level). When an abnormality also occurs at any one of the TSD circuit 141, the voltage-reduction prevention circuit 142, and the power fault prevention circuit 145 or when receiving an external abnormality signal, the abnormality signal generation circuit 146 switches a second abnormality signal from a logic level corresponding to a normal condition (e.g., low level) to a logic level corresponding to an abnormal condition (e.g., high level). The abnormality signal generation circuit 146 outputs the first abnormality signal and the second abnormality signal to the controller 104.

When receiving the first abnormality signal, the controller 104 limits, for example, the current flowing through at least one of the first switching element 40A and the second switching element 40B. When receiving the second abnormality signal, the controller 104 turns off both of the first switching element 40A and the second switching element 40B. When receiving the current limiting signal, the abnormality signal generation circuit 146 may switch the first abnormality signal to a logic level corresponding to an abnormal condition. When receiving the temperature shutdown signal, the voltage-reduction prevention signal, the power fault prevention signal, and the external abnormality signal, the abnormality signal generation circuit 146 may switch the second abnormality signal to a logic level corresponding to an abnormal condition.

The transistor 147 forms an open drain output stage for outputting an external abnormality signal from the FOB terminal. When there is no abnormality at the power module 1, the transistor 147 is turned off by the abnormality signal generation circuit 146, and the external abnormality signal is set at a high level. If an abnormality occurs at the power module 1, the transistor 147 is turned on by the abnormality signal generation circuit 146, and the external abnormality signal is set at a low level.

The Schmitt trigger 148 transmits to the level shifter 149 an external abnormality signal input to the FOB terminal (e.g., an external abnormality signal output from an FOB terminal of another power module 1). A predetermined hysteresis is given to a threshold voltage of the Schmitt trigger 148. The configuration increases noise resistance.

The level shifter 149 shifts the level of the output signal of the Schmitt trigger 148 to a voltage level (VCC-GND) suitable for input to the controller 104 and outputs the signal.

Bootstrap Circuit

The power module 1 includes part of a bootstrap circuit 150 which is a means for generating a boost voltage VB (drive voltage of high potential block including driver 107 and the like). The bootstrap circuit 150 includes a boot diode 151, which has an anode connected to the power supply voltage VCC application end via a resistor 153, and a boot capacitor 152, which is connected between a cathode of the boot diode 151 and the source 41 of the first switching element 40A. The boot capacitor 152 is connected between the OUT terminal and the VB terminal. As described above, the boot diode 151 and the resistor 153 are arranged inside the power module 1, and the boot capacitor 152 is located outside the power module 1.

The bootstrap circuit 150 generates a boost voltage VB at a connection node (VB terminal) between the boot diode 151 and the boot capacitor 152. The resistor 153 limits the current supplied from the external power supply to the boot diode 151 via the VCC terminal. This limits a charge current that flows to the boot capacitor 152.

When a switch voltage VS at the OUT terminal is set at the low level (GND) so that the first switching element 40A is turned off and the second switching element 40B is turned on, a current IB from the power supply voltage VCC application end flows through a path via the boot diode 151, the boot capacitor 152, and the second switching element 40B. The boot capacitor 152, which is connected between the VB terminal and the OUT terminal, is thus charged. At this time, a boost voltage VB at the VB terminal (i.e., a charge voltage of the boot capacitor 152) has a voltage value (=VCC−Vf) obtained by subtracting a forward drop voltage Vf of the boot diode 151 from a power supply voltage VCC.

The first switching element 40A is turned on and the second switching element 40B is turned off when the boot capacitor 152 is charged so that the switch voltage VS is boosted from the low level (GND) to the high level (HV). The boost voltage VB is boosted to a voltage value (=HV+(VCC−Vf)) that is higher by the charge voltage (VCC−Vf) of the boot capacitor 152 than the high level (HV) of the switch voltage VS. Accordingly, the boost voltage VB is used as the drive voltage for the high potential block (RS flip-flop circuit 106 and the driver 107) and the level shift circuit 110 so that the ON/OFF control (particularly, ON control), which is the switching operation of the first switching element 40A, can be performed.

In the configuration described above, a relatively high voltage is applied to the boot diode 151. Therefore, the boot diode 151 requires high withstand voltage. In particular, the boot diode 151 is switched from a state in which a voltage is applied in a forward direction to a state in which a voltage is applied in the reverse direction. Therefore, the boot diode 151 receives a large load, which may cause lower the withstand voltage.

Detailed Configurations of Level Shift Circuit and Filter Circuit

Figure 19:
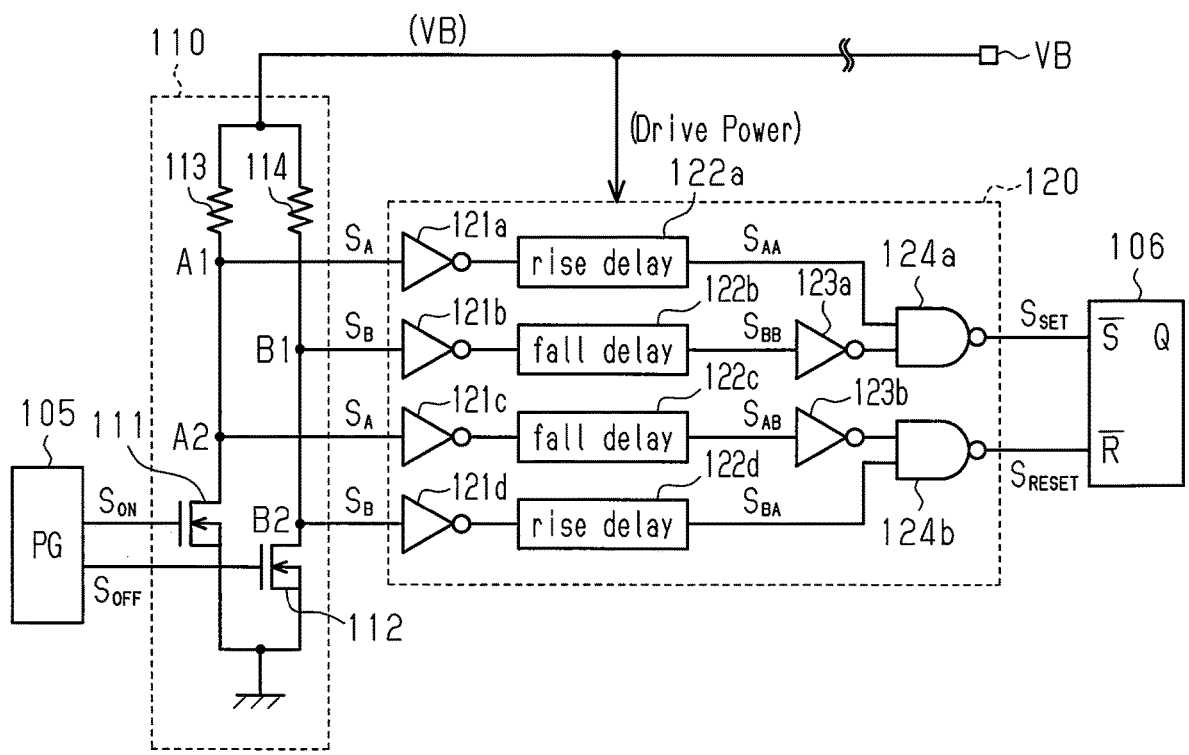
FIG. 19 is a diagram that illustrates the configuration of a level shift circuit and a filter circuit shown in FIG. 17.

With reference to FIG. 19, the configuration of the level shift circuit 110 and filter circuit 120 will now be described in detail.

The level shift circuit 110 includes a transistor 111, a transistor 112, a resistor 113, and a resistor 114. Each of the transistors 111 and 112 is an N-type double-diffused MOSFET (DMOSFET).

The source and back gate of each of the transistors 111 and 112 is connected to a ground terminal GND. The drain of the transistor 111 is connected to two input terminals (NOT circuit 121a and NOT circuit 121c) of the filter circuit 120 and to the VB terminal via the resistor 113. The drain of the transistor 112 is connected to two input terminals (NOT circuit 121b and NOT circuit 121d) of the filter circuit 120 and to the VB terminal via the resistor 114. Each of the transistors 111 and 112 is designed to have a higher withstand voltage (e.g., resistance of 600 V) than the transistor forming the low potential block.

The gate of the transistor 111 receives an ON signal $S_{ON}$ from the pulse generator 105. The gate of the transistor 112 receives an OFF signal $S_{OFF}$ from the pulse generator 105.

As described above, the level shift circuit 110 includes a first series circuit, in which the transistor 111 is opened and closed in accordance with the ON signal $S_{ON}$ and in which the resistor 113 are connected in series, and a second series circuit, in which the transistor 112 to be opened and closed in accordance with the OFF signal $S_{OFF}$ and in which the resistor 114 are connected in series. The first series circuit and the second series circuit are arranged in parallel between the VB terminal (which can be regarded as a power supply for the voltage VB) and the ground terminal GND.

The level shift circuit 110 outputs voltages at locations (point A1 and point A2 illustrated in FIG. 19) closer to the ground terminal GND than the resistor 113 in the first series circuit, as set signals $S_A$ (shifted signals) generated by the level-shift of the ON signal $S_{ON}$, to the filter circuit 120 (NOT circuit 121a and NOT circuit 121c). The level shift circuit 110 also outputs voltages at locations (point B1 and point B2 illustrated in FIG. 19) closer to the ground terminal GND than the resistor 114 in the second series circuit, as signals $S_B$ (shifted signals) obtained by the level-shift of the OFF signal $S_{OFF}$, to the filter circuit 120 (NOT circuit 121b and NOT circuit 121d). Point A1 and point A2 may be the same, and the point B1 and the point B2 may be the same.

The filter circuit 120 includes the NOT circuits 121a to 121d, 123a, and 123b, rising delay circuits 122a and 122d, falling delay circuits 122b and 122c, and NAND circuits 124a and 124b.

The NOT circuits 121a, 121b, 121c, and 121d respectively receive signals $S_A$, $S_B$, $S_A$, and $S_B$ from the level shift circuit 110. An output terminal of the NOT circuit 121a is connected to one of input terminals of the NAND circuit 124a via the rising delay circuit 122a. An output terminal of the NOT circuit 121b is connected to the other input terminal of the NAND circuit 124a via the falling delay circuit 122b and the NOT circuit 123a in this order. An output terminal of the NOT circuit 121c is connected to one of input terminals of the NAND circuit 124b via the falling delay circuit 122c and the NOT circuit 123b in this order. An output terminal of the NOT circuit 121d is connected to the other input terminal of the NAND circuit 124b via the rising delay circuit 122d.

An output signal from the NAND circuit 124a is output as a set signal $S_{SET}$ for the RS flip-flop circuit 106 to the set terminal (S terminal) of the RS flip-flop circuit 106. An output signal from the NAND circuit 124b is output as a reset signal $S_{RESET}$ for the RS flip-flop circuit 106 to the reset terminal (R terminal) of the RS flip-flop circuit 106.

The rising delay circuit 122a performs a rising delay process for delaying the rising timing by a preset time on a pulse signal input from the preceding stage. The rising delay circuit 122a then outputs the processed signal as a signal $S_{AA}$ to the subsequent stage. The falling delay circuit 122b performs a falling delay process for delaying the falling timing by a preset time on a pulse signal input from the preceding stage. The falling delay circuit 122b then outputs the processed signal as a signal $S_{BB}$ to the subsequent stage. The signal $S_{AA}$ is used as a main signal on the set side of the RS flip-flop circuit 106. The signal $S_{BB}$ is used as a mask signal on the set side (signal for masking an erroneous pulse).

The "rising delay process" is, for example, a process for delaying the starting timing of each pulse in the pulse signal that is subject to processing (pulse start delay process). A delay in the starting timing decreases the width of the pulse for an amount corresponding to the delay. The "falling delay process" is, for example, a process for delaying the ending timing of each pulse in the pulse signal that is subject to processing (pulse end delay process). A delay in the ending timing increases the width of the pulse for an amount corresponding to the delay.

The falling delay circuit 122c performs a falling delay process for delaying the falling timing by a preset time on a pulse signal input from the preceding stage. The falling delay circuit 122c then outputs the processed signal as a signal $S_{AB}$ to the subsequent stage. The rising delay circuit 122d performs a rising delay process for delaying the timing of rising by a preset time on a pulse signal input from the preceding stage. The rising delay circuit 122d then outputs the processed signal as a signal $S_{BA}$ to the subsequent stage. The signal $S_{AB}$ is used as a main signal on the reset side of the RS flip-flop circuit 106. The signal $S_{BA}$ is used as a mask signal on the reset side.

The filter circuit 120 performs, as a filtering process, a process for canceling pulses that substantially overlap each other timewise, as erroneous pulses, among the pulses of the signal $S_A$ and signal $S_B$ input from the level shift circuit 110.

Figure 20:
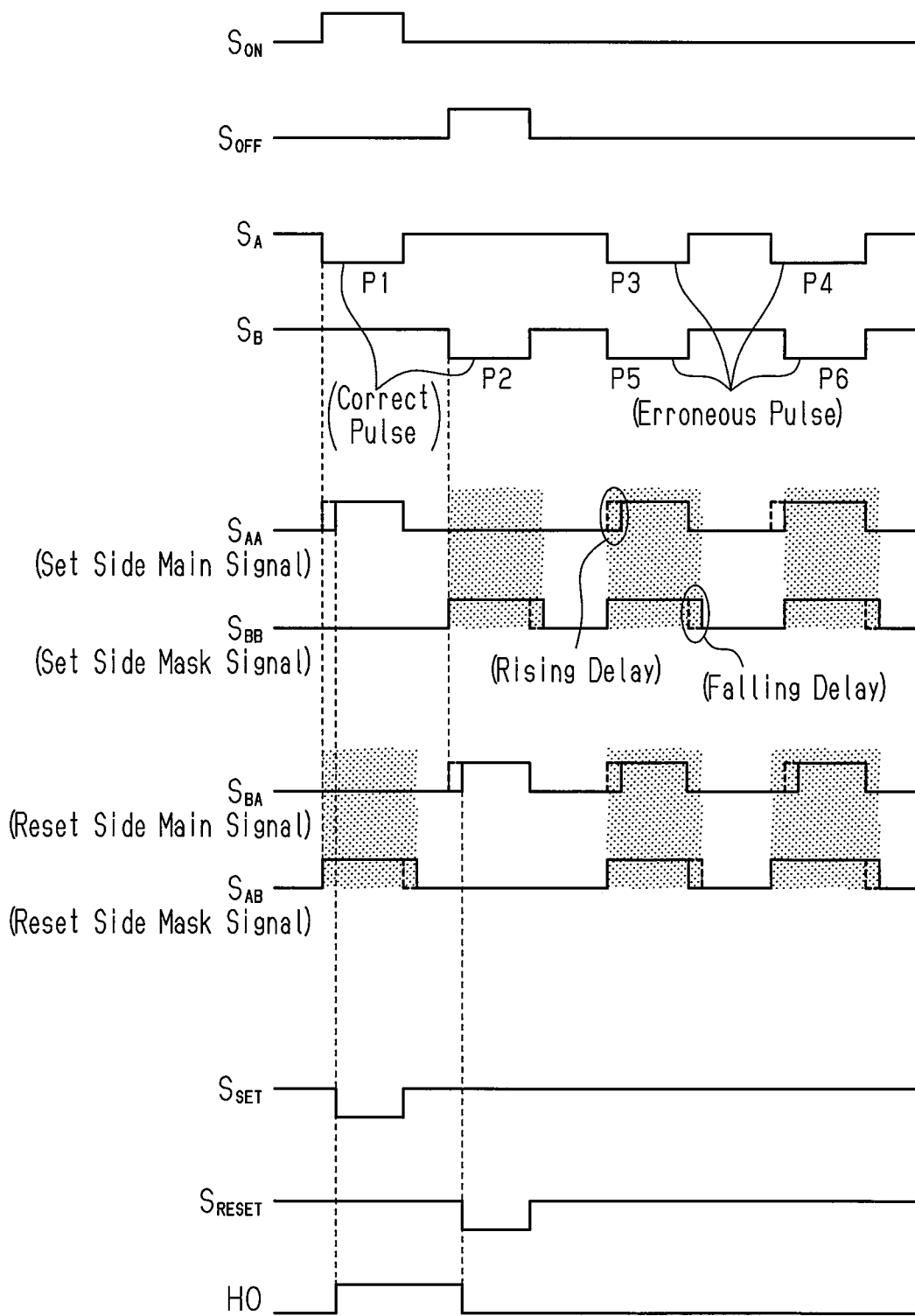
FIG. 20 is a timing chart related to a filtering process.

FIG. 20 illustrates an example of a timing chart of each signal that undergoes the filtering process. In FIG. 20, correct pulses (normal pulses) P1 and P2 are generated in signals $S_A$ and $S_B$ in accordance with an ON signal $S_{ON}$ and an OFF signal $S_{OFF}$. In addition, erroneous pulses P3 to P6 are generated as described above.

As illustrated in FIG. 20, with regard to a main signal $S_{AA}$ on the set side (signal obtained by performing rising delay process on signal $S_A$), the pulse is canceled in a pulse period (shaded period in FIG. 20) for a mask signal $S_{BB}$ on the set side (signal obtained by performing falling delay process on signal $S_B$). As a result, no pulse based on the erroneous pulses P3 and P4 is generated in a set signal $S_{SET}$. With regard to a main signal $S_{BA}$ on the reset side (signal obtained by performing rising delay process on signal $S_B$), the pulse is canceled in a pulse period (shaded period in FIG. 20) of a mask signal $S_{AB}$ on the reset side (signal obtained by performing falling delay process on signal $S_A$). As a result, no pulse based on the erroneous pulses P5 and P6 is generated in a reset signal $S_{RESET}$.

The filter circuit 120 performs the filtering process and avoids the generation of an erroneous signal of an upper output signal HO that would result from an erroneous pulse such as that described above. The main signals (signal $S_{AA}$ and the signal $S_{BA}$) undergo the rising delay process. The mask signals (signal $S_{BB}$ and the signal $S_{AB}$) undergo the falling delay process. Therefore, even if the period of the erroneous pulse in the main signal deviates from the pulse period of the mask signal, the erroneous pulse can be canceled as long as the extent of the deviation falls within a margin (determined in accordance with delay time) obtained by each delay process. It is therefore possible to perform the filtering process in a further suitable manner (more reliable manner).

One of or both of the rising delay process and the falling delay process may be omitted. The delay time in the rising delay process or the falling delay process is appropriately set in advance so that the correct pulse is not erroneously canceled to the signal $S_A$ and signal $S_B$.

Generating Erroneous Signal

As described above, the power module 1 includes the filter circuit 120 capable of avoiding the generation of an erroneous signal of an upper output signal HO that would result from an erroneous pulse of a shifted signal.

With reference to the timing charts of FIGS. 21 to 24, examples of the generation of an erroneous signal of the upper output signal HO will now be described under the assumption that the power module 1 does not include the filter circuit 120. The timing charts are each related with a lower input signal LIN, an upper input signal HIN, a boost voltage VB, a switch voltage VS, a set signal $S_{SET}$, a reset signal $S_{RESET}$, an output signal $S_Q$ from the RS flip-flop circuit 106, and an upper output signal HO.

Figure 21:
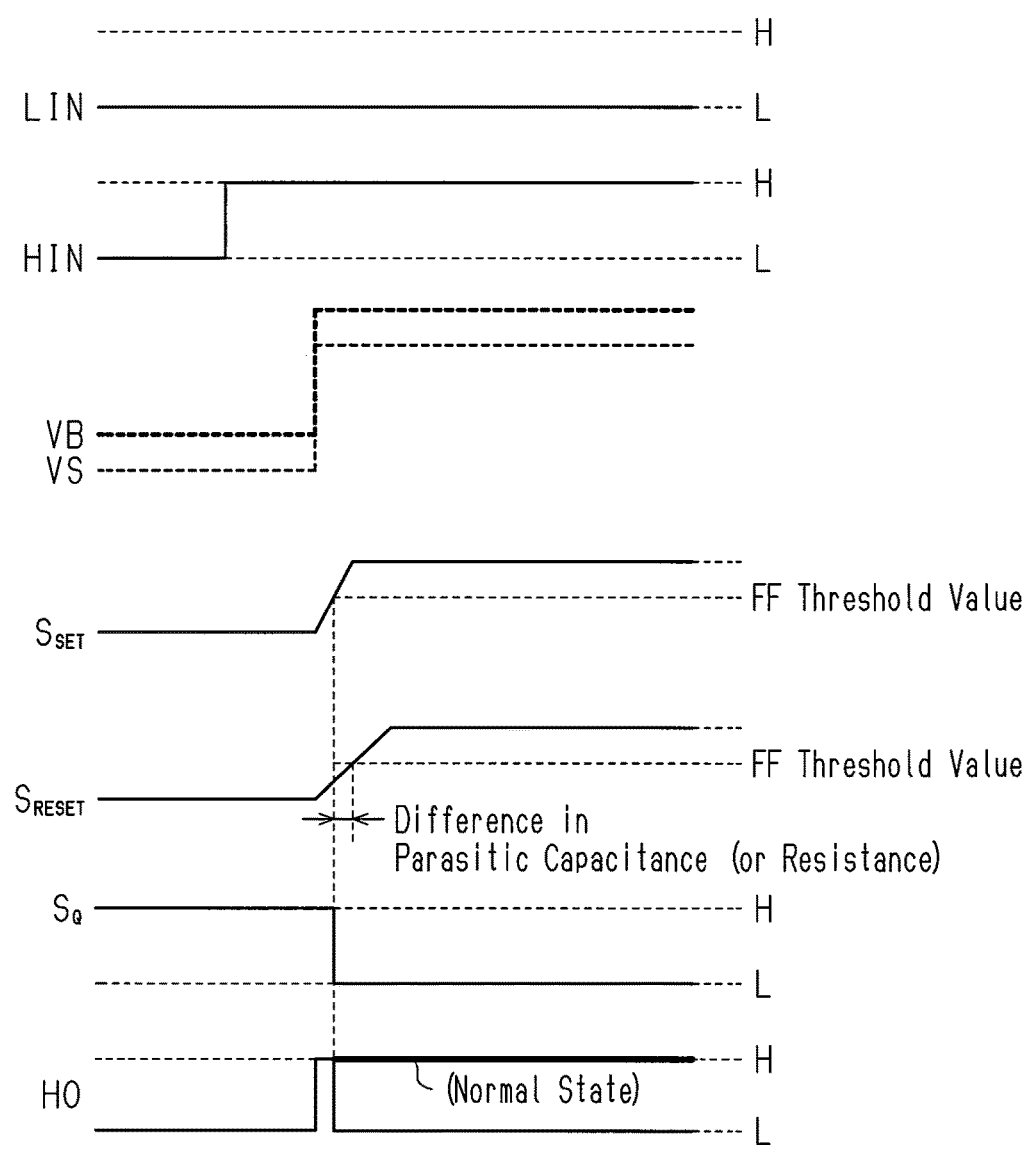
FIGS. 21 to 24 are charts illustrating the generation of an erroneous signal of an upper output signal.

FIG. 21 illustrates the timing chart during the occurrence of a voltage change of high dVS/dt (>0) when the upper switch drive unit 100 is ON. As illustrated in FIG. 21, when a boost voltage VB suddenly changes as a switch voltage VS changes, the rising of a set signal $S_{SET}$ and the rising of a reset signal $S_{RESET}$ are delayed because of charging of parasitic capacitances of the transistors 111 and 112. The degree of this delay differs depending on the difference in parasitic capacitance. The degree of the delay of rising may differ depending on the variations of the resistors 113 and 114.

The difference in the degree of the delay causes a difference between the timing at which the set signal $S_{SET}$ reaches an FF threshold value (threshold value of a voltage at which the RS flip-flop circuit 106 recognizes a signal change) and the timing at which the reset signal $S_{RESET}$ reaches the FF threshold value. As illustrated in FIG. 21, when the set signal $S_{SET}$ reaches the FF threshold value, the upper output signal HO, which would normally be held at the high level as indicated by the bold line in FIG. 21, shifts to a low level. An erroneous signal of the upper output signal HO is thus generated.

Figure 22:
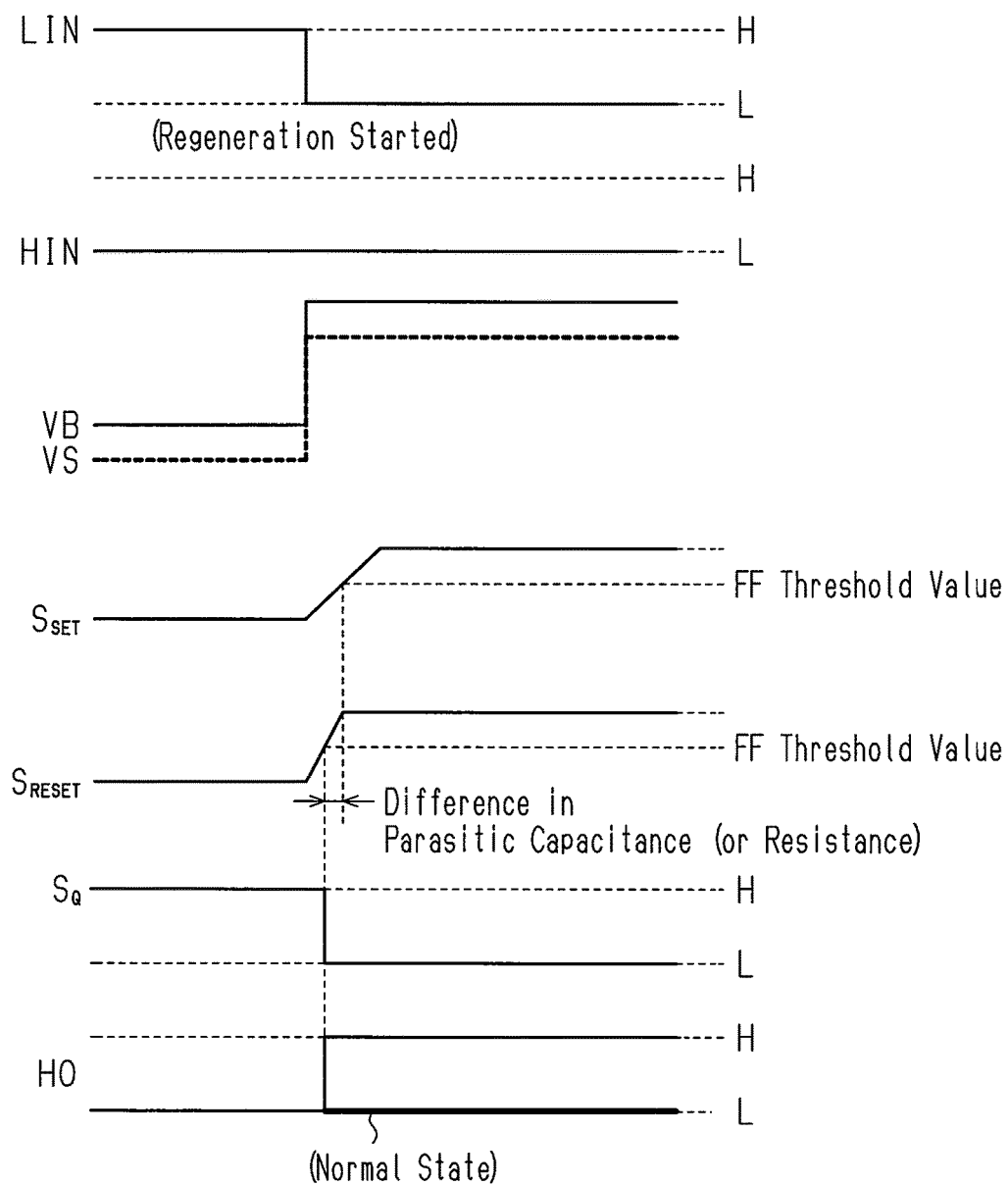

FIG. 22 illustrates the timing chart during the occurrence of a voltage change of high dVS/dt (>0) during regeneration of the upper switch drive unit 100. As illustrated in FIG. 22, when the boost voltage VB suddenly changes as the switch voltage VS changes, in the same manner as shown in FIG. 21, the timing at which the set signal $S_{SET}$ reaches the FF threshold value differs from the timing at which the reset signal $S_{RESET}$ reaches the FF threshold value.

As illustrated in FIG. 22, when the reset signal $S_{RESET}$ reaches the FF threshold value, the upper output signal HO, which would normally be held at the low level as indicated by the bold line in FIG. 22, shifts to a high level. An erroneous signal of the upper output signal HO is thus generated. If the lower input signal LIN shifts to a high level after the upper output signal HO shifts to a high level, the power module may be damaged due to a short circuit of the upper and lower arms.

Figure 23:
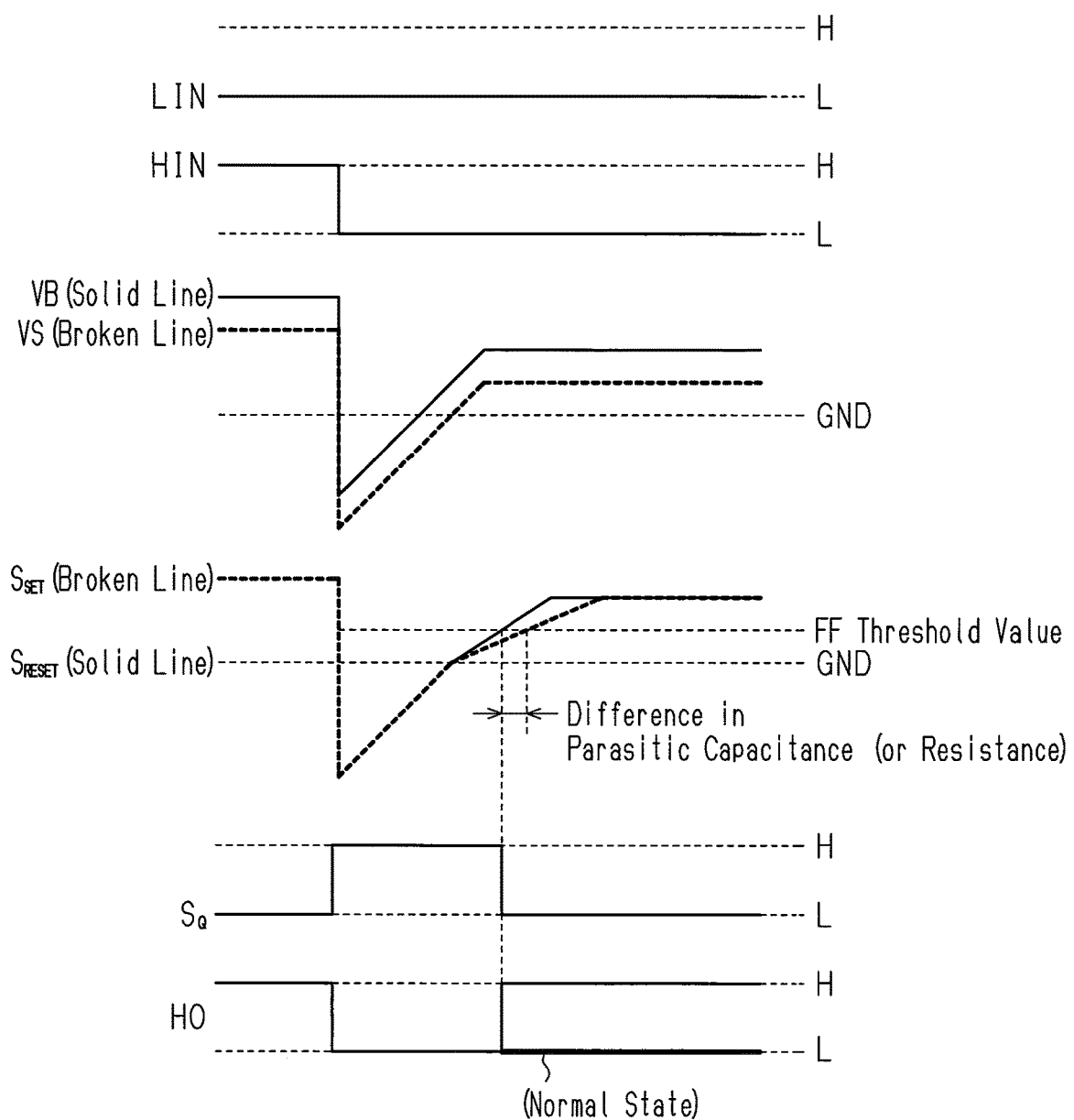

FIG. 23 illustrates the timing chart during the occurrence of a voltage change of dVS/dt (<0) (particularly when focusing on difference in parasitic capacitance). As illustrated in FIG. 23, when the boost voltage VB suddenly changes, as the switch voltage VS changes, and undershoots to a negative voltage, forward bias is applied to body diodes of the transistors 111 and 112 so that a reverse recovery current from the ground terminal GND is generated.

At this time, the rising of the set signal $S_{SET}$ and the rising of the reset signal $S_{RESET}$ are delayed because of charging of the parasitic capacitances of the transistors 111 and 112. The degree of this delay differs depending on the difference in parasitic capacitance. The degree of the delay of rising may also differ depending on the variations of the resistors 113 and 114.

The difference in the degree of delay causes a difference between the timing at which the set signal $S_{SET}$ reaches the FF threshold value and the timing at which the reset signal $S_{RESET}$ reaches the FF threshold value. As illustrated in FIG. 23, when the reset signal $S_{RESET}$ reaches the FF threshold value, the upper output signal HO, which would normally be held at the low level as indicated by the bold line in FIG. 23, shifts to a high level. An erroneous signal of the upper output signal HO is thus generated.

Figure 24:
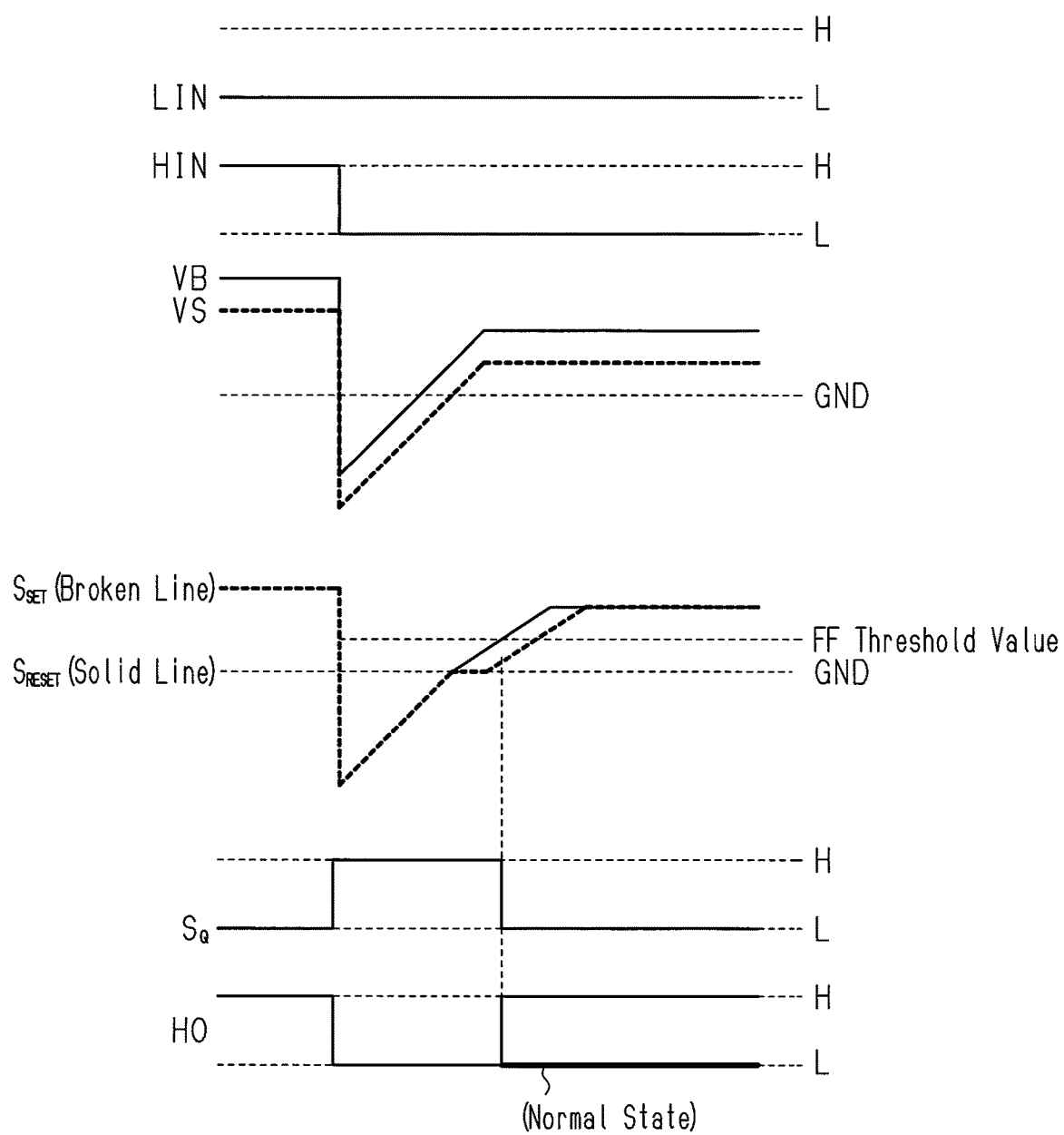

FIG. 24 illustrates the timing chart during the occurrence of a voltage change of dVS/dt (<0) (particularly attention is paid to an influence of the parasitic diode). As illustrated in FIG. 24, when the boost voltage VB suddenly changes, as the switch voltage VS changes, and undershoots to the negative voltage, forward bias is applied to the body diodes of the transistors 111 and 112 so that a reverse recovery current from the ground terminal GND is generated.

At this time, the rising of the set signal $S_{SET}$ and the rising of the reset signal $S_{RESET}$ are delayed because of the charging of the parasitic capacitances of the transistors 111 and 112. Even if the parasitic capacitances are equal to each other, since the reverse recovery current flows in the transistor 111, the degree of the delay of rising differs due to the influence of the parasitic diode. Therefore, an erroneous signal of the upper output signal HO is generated in the same manner as the case of FIG. 23.

According to the power module 1, the filter circuit 120 can avoid generation of an erroneous signal of the upper output signal HO in any of the patterns described above.

The sudden change in the switch voltage VS is more likely to occur as the arm output from the power module 1 is switched at higher speed. Therefore, conventionally, the speed of this switching has been reduced to suppress generation of an erroneous signal. However, this causes an increase in switching loss and a reduction in inverter efficiency. In this regard, the power module 1 according to this embodiment includes the means for avoiding the generation of an erroneous signal. Therefore, the power module 1 according to this embodiment can perform high-speed switching of the arm output and improve the inverter efficiency.

Boot Diode

Figure 25:
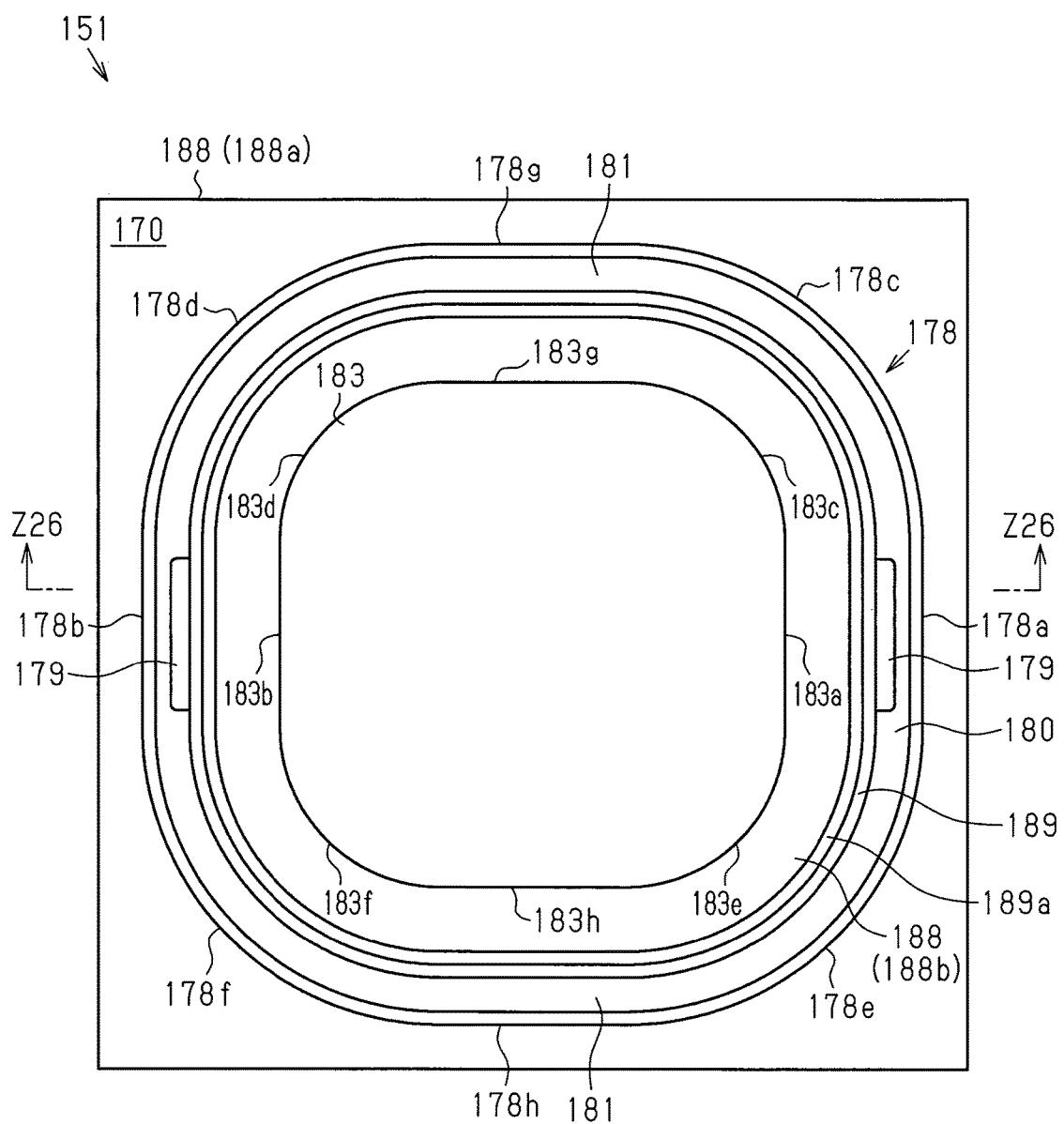
FIG. 25 is a plan view of a boot diode shown in FIG. 17.
Figure 26:
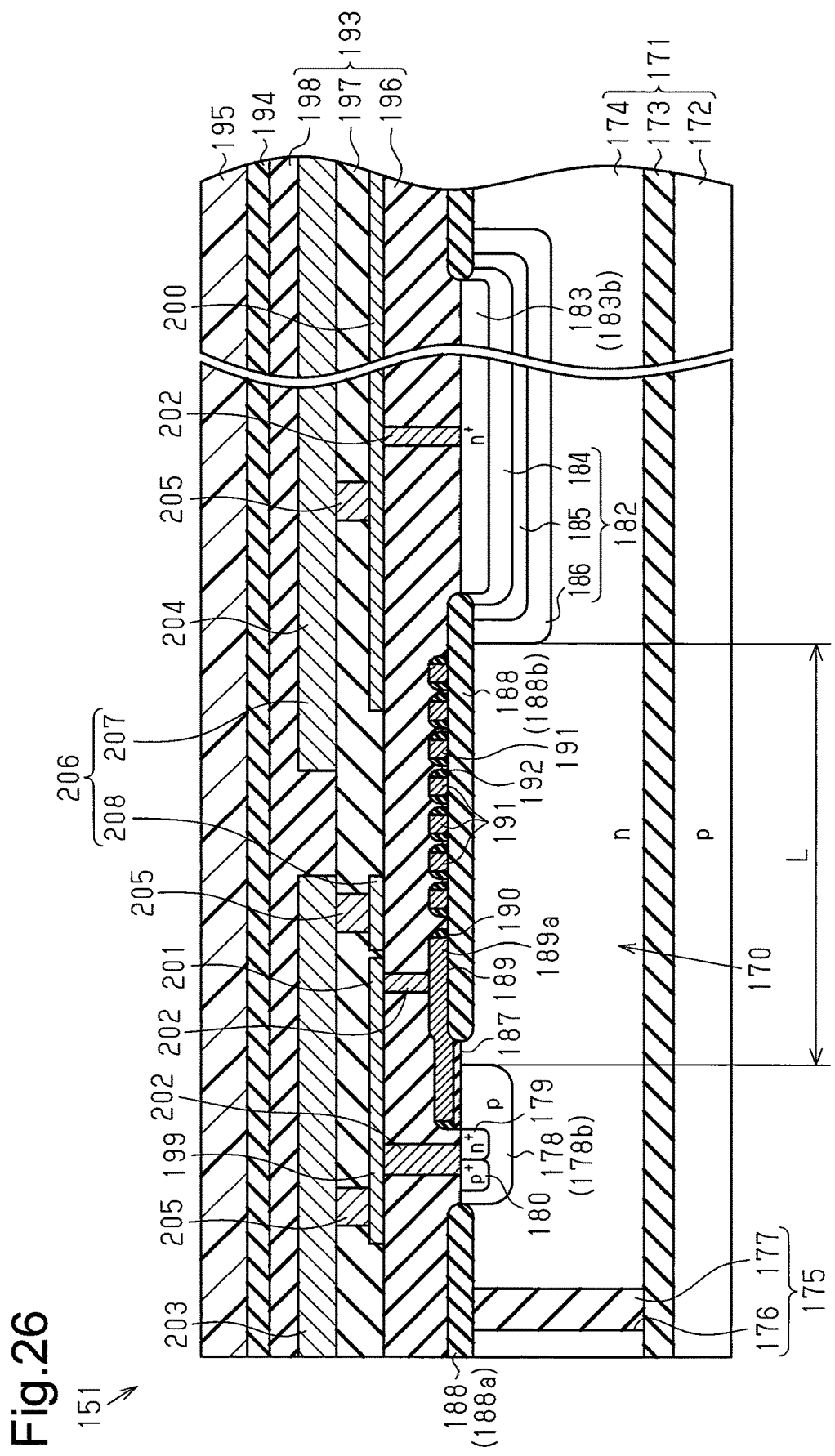
FIG. 26 is a cross-sectional view taken along line Z26-Z26 in FIG. 25.

With reference to FIGS. 25 and 26, the boot diode 151 configuring the bootstrap circuit 150 will now be described.

It is assumed in the description hereafter that n-type impurities (n-type) mainly include pentavalent elements (e.g., phosphorus (P), arsenic (As)) and p-type impurities (p-type) mainly include trivalent elements (e.g., boron (B), indium (In), gallium (Ga)).

The boot diode 151 is a diode-connected MOSFET or a body diode thereof. For example, the boot diode 151 is a semiconductor element including a laterally diffused metal insulator semiconductor (LDMIS) region 170 with an LDMIS having a source (anode)-drain (cathode) voltage Vds of 400 V or greater to 1500 V or less. Specifically, as illustrated in FIG. 26, the boot diode 151 includes a silicon-on-insulator (SOI) substrate 171. The SOI substrate 171 includes a semiconductor substrate 172 of the p-type, a buried insulative layer 173 formed on the semiconductor substrate 172, and an epitaxial layer 174 formed on the buried insulative layer 173.

The semiconductor substrate 172 is, for example, a silicon substrate. The semiconductor substrate 172 has a p-type impurity concentration of, for example, $1.0 \times 10^{14}$ cm$^{-3}$ or greater to $1.0 \times 10^{16}$ cm$^{-3}$ or less. The buried insulative layer 173 may be a buried oxide (BOX) layer containing a silicon oxide formed by oxidation of a surface of the semiconductor substrate 172, for example. The buried insulative layer 173 has a thickness of, for example, 3 μm or greater to 5 μm or less.

The epitaxial layer 174 has an n-type impurity concentration of, for example, $1.0 \times 10^{14}$ cm$^{-3}$ or greater to $1.0 \times 10^{16}$ cm$^{-3}$ or less. The epitaxial layer 174 has a resistance value of, for example, 10 Ω·cm or greater to 40 Ω·cm or less. The epitaxial layer 174 has a thickness of, for example, 20 μm or greater to 40 μm or less. This embodiment employs the SOI substrate 171. Instead of the SOI substrate 171, this embodiment may employ a so-called bulk substrate on which an epitaxial layer 174 of the n-type is formed on a semiconductor substrate 172 of the p-type so as to be in contact with the semiconductor substrate 172.

As illustrated in FIG. 26, the epitaxial layer 174 has a deep trench isolation (DTI) structure 175 serving as an element isolation structure that partitions the LDMIS region 170 from other regions.

The DTI structure 175 is formed to be substantially ring-shaped in a plan view from a normal direction of a surface of the epitaxial layer 174 (hereinafter, simply referred to as "plan view"). The DTI structure 175 includes an insulator 177 buried in a trench 176 formed in the epitaxial layer 174. The trench 176 is formed by digging down the epitaxial layer 174 to reach the buried insulative layer 173. The insulator 177 contains a silicon oxide, for example, and is continuous with the buried insulative layer 173 in the trench 176. The LDMIS region 170 is set in the region surrounded by the DTI structure 175. This embodiment employs the DTI structure 175 as the element isolation structure. Alternatively, the element isolation structure may be set by a diffusion isolation method including a ring-shaped p-type diffusion region that partitions the LDMIS region 170, that is, a pn junction isolation method.

A body region 178 of the p-type is formed on a surface of the epitaxial layer 174 in the LDMIS region 170 so as to be spaced apart from the DTI structure 175. The body region 178 is formed to be substantially ring-shaped in a plan view (see FIG. 25) and forms a pn junction with the epitaxial layer 174. Specifically, as illustrated in FIG. 25, the body region 178 includes two parallel strip-shaped first straight portions 178a and 178b, four strip-shaped curved portions 178c, 178d, 178e, and 178f, and two parallel strip-shaped second straight portions 178g and 178h. The second straight portions 178g and 178h extend in a direction perpendicular to the first straight portions 178a and 178b. One of the ends of the curved portions 178c to 178f is continuous with one of the ends of the corresponding one of the two first straight portions 178a and 178b. The other one of the ends of the curved portions 178c to 178f is continuous with one of the ends of the two second straight portions 178g and 178h. In other words, the body region 178 is formed to have a substantially rectangular ring shape in a plan view, in which the curved portions 178c to 178f connect the two opposing first straight portions 178a and 178b and the two opposing second straight portions 178g and 178h.

In this embodiment, lengths of the first straight portions 178a and 178b are set to be equal to the lengths of the second straight portions 178g and 178h. However, the present invention is not limited thereto. The lengths of the first straight portions 178a and 178b may be different from the lengths of the second straight portions 178g and 178h. Inner peripheral edges of the curved portions 178c to 178f are set to have the same radius of curvature. The radius of curvature is, for example, 80 μm or greater to 120 μm or less.

As illustrated in FIG. 26, a source region 179 of the n-type and a body contact region 180 of the p-type are formed on a surface of the body region 178 so as to be adjacent to each other.

On the body region 178, a plurality of source regions 179 are spaced apart from an inner peripheral edge of the body region 178. Specifically, as illustrated in FIG. 25, the source regions 179 are formed on the first straight portions 178a and 178b of the body region 178 linearly along the first straight portions 178a and 178b. The source regions 179 are not formed on the four curved portions 178c to 178f and second straight portions 178g and 178h of the body region 178. That is, in this embodiment, each of the curved portions 178c to 178f and second straight portions 178g and 178h of the body region 178 includes a withstand voltage holding part 181 where the source region 179 does not exist.

The body contact region 180 is formed to be substantially ring-shaped in a plan view along the body region 178. In the two first straight portions 178a and 178b of the body region 178, the body contact region 180 is formed between an outer peripheral edge of the body region 178 and the source region 179. In the four curved portions 178c to 178f and two second straight portions 178g and 178h of the body region 178, the body contact region 180 is formed between the outer peripheral edge and an inner peripheral edge of the body region 178. The body contact region 180 has a p-type impurity concentration being higher than an impurity concentration of the body region 178.

A drain region 183 of the n-type is formed in a region surrounded by the body region 178 on the surface of the epitaxial layer 174 so as to be spaced apart from the body region 178. In a plan view, the drain region 183 is formed inward from the body region 178 having a rectangular ring shape in a plan view. The drain region 183 has a rectangular shape in which the corner portion is curved in a plan view. The inner peripheral edge of the body region 178 is similar in shape to an outer peripheral edge of the drain region 183. More specifically, the outer peripheral edge of the drain region 183 includes two first straight portions 183a and 183b formed linearly along the two first straight portions 178a and 178b, curved portions 183c, 183d, 183e, and 183f formed to be curved along the four curved portions 178c to 178f, and two second straight portions 183g and 183h formed linearly along the two second straight portions 178g and 178h. One of the ends of each of the curved portions 183c to 183f is continuous with one of the ends of the corresponding one of the two first straight portions 183a and 183b. The other one of the ends of each of the curved portions 183c to 183f is continuous with the other one of the ends of the corresponding one of the two second straight portions 183g and 183h. In other words, the drain region 183 is formed to have a substantially rectangular shape in a plan view, in which the curved portions 183c to 183f connect the two first straight portions 183a and 183b and the two second straight portions 183g and 183h. The drain region 183 has an n-type impurity concentration that is substantially the same as an impurity concentration of the source region 179. A distance L (see FIG. 26) between the body region 178 and the drain region 183 is, for example, 50 μm or greater to 200 μm or less (60 μm in this embodiment).

As described above, the first straight portions 178a and 178b of the body region 178 respectively oppose the first straight portions 183a and 183b of the drain region 183. Moreover, the second straight portions 178g and 178h of the body region 178 respectively oppose the second straight portions 183g and 183h of the drain region 183. In addition, the curved portions 178c to 178f of the body region 178 respectively oppose the curved portions 183c to 183f of the drain region 183. Since the curved portions 178c to 178f of the body region 178 are located outward from the curved portions 183c to 183f of the drain region 183, inner peripheral edges of the curved portion 178c to 178f of the body region 178 are larger in radius of curvature than the curved portions 183c to 183f at the outer peripheral edge of the drain region 183. In other words, the curved portions 183c to 183f at the outer peripheral edge of the drain region 183 are larger in curvature than the inner peripheral edges at the curved portions 178c to 178f of the body region 178.

The first straight portion 183a exists between the curved portions 183c and 183e. The first straight portion 183b exists between the curved portions 183d and 183f. The second straight portion 183g exists between the curved portions 183c and 183d. The second straight portion 183h exists between the curved portions 183e and 183f. In other words, the curved portions 183c to 183f are spaced apart from one another with the corresponding straight portion located in between.

In this embodiment, the lengths of the first straight portions 183a and 183b are set to be the same as the lengths of the second straight portions 183g and 183h. Alternatively, the lengths of the first straight portions 183a and 183b may differ from the lengths of the second straight portions 183g and 183h. The curved portions 183c to 183f at the outer peripheral edge of the drain region 183 are set to be identical in radius of curvature with one another. The radius of curvature is, for example, 20 μm or greater to 60 μm or less.

Each of the curved portions 183c to 183f is arcuate. Preferably, each of the curved portions 183c to 183f is set to have a central angle of 90° or less. In this embodiment, the central angle of each of the curved portions 183c to 183f is set at 90°.

The shape of the drain region 183 in a plan view is not limited to a rectangular shape, and the drain region 183 may have any shape in a plan view. For example, the drain region 183 may have a polygonal shape, such as a pentagonal shape, and include five or more curved portions. In this case, each curved portion may be set to have a central angle of less than 90°. The drain region 183 may be ring-shaped in a plan view. For example, the drain region 183 may be similar in shape to the body region 178.

As illustrated in FIG. 26, a gate insulative film 187 and a local-oxidation-of-silicon (LOCOS) film 188 are formed on the surface of the epitaxial layer 174. The gate insulative film 187 is formed to be substantially ring-shaped so as to be in contact with the body region 178 between the source region 179 and the drain region 183. More specifically, the gate insulative film 187 extends from a peripheral edge, closer to the drain region 183, of the source region 179 and a peripheral edge, closer to the drain region 183, of the body contact region 180 toward the drain region 183. Moreover, the gate insulative film 187 is formed to traverse the inner peripheral edge of the body region 178. The gate insulative film 187 is, for example, a silicon oxide film.

The LOCOS film 188 includes an outer LOCOS film 188a formed along the outer peripheral edge of the body region 178 and an inner LOCOS film 188b covering the epitaxial layer 174 between the body region 178 and the drain region 183. The outer LOCOS film 188a covers the DTI structure 175 at the outside of the body region 178. The inner LOCOS film 188b is formed to be substantially ring-shaped in a plan view so as to cover the epitaxial layer 174 between the drain region 183 and the gate insulative film 187. An inner peripheral edge of the inner LOCOS film 188b surrounds the drain region 183. An outer peripheral edge of the inner LOCOS film 188b is continuous with the gate insulative film 187 at a position spaced closer to the drain region 183 with respect to the inner peripheral edge of the body region 178. The outer LOCOS film 188a and the inner LOCOS film 188b cover a surface of a first body region 184, a surface of a second body region 185, and a surface of a well region 186.

The LOCOS film 188 is greater in thickness than the gate insulative film 187. The thickness of the gate insulative film 187 is, for example, 300 angstroms to 1000 angstroms (600 angstroms in this embodiment). The thickness of the LOCOS film 188 is, for example, 400 angstroms to 15000 angstroms (6000 angstroms in this embodiment).

A gate electrode 189 opposing the body region 178 is formed on the gate insulative film 187. The gate electrode 189 is formed to be substantially ring-shaped along the outer peripheral edge of the inner LOCOS film 188b. The gate electrode 189 has a cover part 189a extending continuously from the gate insulative film 187 to the inner LOCOS film 188b and covering the outer peripheral edge of the inner LOCOS film 188b. The gate electrode 189 is made of, for example, polysilicon doped with impurities. Both side surfaces of the gate electrode 189 are covered with sidewalls 190 each made of, for example, an insulative material such as a silicon oxide or a silicon nitride.

A plurality of (seven in this embodiment) field plates 191 are formed on the inner LOCOS film 188b so as to be spaced apart from one another. The field plates 191 suppress the disturbance of an electric field in the epitaxial layer 174. The field plates 191 are formed to have similar ring shapes that differ in circumferential length from one another. Specifically, the field plates 191 are spaced apart from one another such that a field plate 191 having a relatively long circumferential length surrounds a field plate 191 having a relatively short circumferential length.

Each of the field plates 191 is made of a material that is the same as the material of the gate electrode 189. The two side surfaces of each field plate 191 are covered with sidewalls 192 each made of, for example, an insulative material such as a silicon oxide or a silicon nitride. The outermost one of the field plates 191 may be formed integrally with the cover part 189a of the gate electrode 189. The number of field plates 191 may be at least one. For example, the number of field plates 191 may be eight or greater.

An insulative layer 193, a passivation film 194, and a molding resin 195 containing, for example, an epoxy resin are stacked in this order on the epitaxial layer 174. The insulative layer 193 includes a plurality of interlayer insulative films. The interlayer insulative films include a first interlayer insulative film 196 formed on the epitaxial layer 174, a second interlayer insulative film 197 formed on the first interlayer insulative film 196, and a third interlayer insulative film 198 formed on the second interlayer insulative film 197.

Each of the first interlayer insulative film 196, the second interlayer insulative film 197, and the third interlayer insulative film 198 is made of, for example, an insulator such as a silicon oxide or a silicon nitride. The passivation film 194 is made of, for example, at least one of a silicon nitride and a silicon oxide. The passivation film 194 may be a stack of films including a silicon oxide film and a silicon nitride film formed on the silicon oxide film. The passivation film 194 has a thickness of, for example, 1 μm or greater to 10 μm or less. A resin film made of a polyimide resin may be formed on the passivation film 194. In this case, the thickness of the passivation film 194 including the resin film may be 10 μm or greater.

A first source electrode 199, a first drain electrode 200, and a first gate electrode 201 are formed as a first metal on the first interlayer insulative film 196. Each of the first source electrode 199, the first drain electrode 200, and the first gate electrode 201 is an electrode film including, for example, one or more kinds of metals selected from the group consisting of aluminum, copper, titanium, tungsten, and tantalum.

The first source electrode 199 is electrically connected to the source region 179 and the body contact region 180 via a corresponding contact 202. The first source electrode 199 is disposed linearly so as to cover at least part of the source region 179 or the entire source region 179. The first drain electrode 200 is electrically connected to the drain region 183 via a corresponding contact 202. The first drain electrode 200 is arranged in a shape along the drain region 183 so as to cover at least part of the drain region 183 or the entire drain region 183. The first gate electrode 201 is electrically connected to the gate electrode 189 via a corresponding contact 202. The first gate electrode 201 is formed to be ring-shaped and extended along the gate electrode 189 so as to cover at least part of the gate electrode 189 or the entire gate electrode 189.

A second source electrode 203 and a second drain electrode 204 are formed as a second metal on the second interlayer insulative film 197. Each of the second source electrode 203 and the second drain electrode 204 is an electrode film including, for example, one or more kinds of metals selected from the group consisting of aluminum, copper, titanium, tungsten, and tantalum.

The second source electrode 203 is electrically connected to the first source electrode 199 via a corresponding contact 205. The second drain electrode 204 is electrically connected to the first drain electrode 200 via a corresponding contact 205.

In this embodiment, the first source electrode 199 is electrically connected to the first gate electrode 201. Therefore, the body region 178 of the p-type functions as an anode region, and the first source electrode 199 functions as an anode electrode. The drain region 183 functions as a cathode region, and the first drain electrode 200 functions as a cathode electrode.

As illustrated in FIG. 26, the insulative layer 193 is provided with a shielding member 206 that shields movable ions leaking from the molding resin 195, between the epitaxial layer 174 and the molding resin 195. Specifically, the insulative layer 193 includes the shielding member 206 which is conductive and at least part of which collectively covers a region between the drain region 183 and the gate electrode 189 in a plan view. The shielding member 206 is formed to cover at least the region between the drain region 183 and the withstand voltage holding part 181 (see FIG. 25) of the body region 178 in a plan view. The shielding member 206 is a conductive film including, for example, one or more kinds of metals selected from the group consisting of aluminum, copper, titanium, tungsten, and tantalum.

The shielding member 206 includes a first conductive film 207. The first conductive film 207 is formed integrally with the second drain electrode 204 on the layer on which the second drain electrode 204 is formed (i.e., on the second interlayer insulative film 197). The first conductive film 207 is extended in a strip shape from the second drain electrode 204 toward the withstand voltage holding part 181 of the body region 178 so as to cover the region between the drain region 183 and the withstand voltage holding part 181 of the body region 178. The first conductive film 207 is extended from the second drain electrode 204 so as to overlap at least the cover part 189a of the gate electrode 189 in a plan view.

In other words, the first conductive film 207 covers the field plates 191 formed on the region between the drain region 183 and the withstand voltage holding part 181 of the body region 178 in a plan view. In a plan view, an end of the first conductive film 207 is formed at right angles relative to an extending direction (direction along the first straight portions 183a and 183b of the drain region 183 (see FIG. 25)). When a drain-source voltage is applied to the first conductive film 207, the first conductive film 207 shuts out the influence of anions (movable ions of a cathode) in the molding resin 195 induced in the second drain electrode 204 and the influence of an electric field caused by the anions.

The shielding member 206 also includes a second conductive film 208. The second conductive film 208 is formed between the gate electrode 189 and the first conductive film 207. A voltage lower than that applied to the second drain electrode 204 is applied to the second conductive film 208. The second conductive film 208 is formed at an end, closer to the drain region 183, of the gate electrode 189 in a plan view, that is, on a lower layer of the first conductive film 207 (i.e., on the first interlayer insulative film 196) so as to cover the cover part 189a. The second conductive film 208 is electrically connected to the second source electrode 203 via a corresponding contact 205 at a position, closer to the two first straight portions 178a and 178b (see FIG. 25), of the body region 178.

When a drain-source voltage is applied to the second conductive film 208, the second conductive film 208 shuts out the influence of cations (movable ions of an anode) in the molding resin 195 induced in the second source electrode 203 and the influence of an electric field caused by the cations. The second conductive film 208 also serves as a field plate that suppresses concentration of an electric field at the end, closer to the drain region 183, of the gate electrode 189, that is, the cover part 189a of the gate electrode 189. A plurality of second conductive films 208 may be arranged on a ring-shaped region along an inner periphery of the first gate electrode 201 in a plan view.

In this embodiment, the epitaxial layer 174 has a structure for increasing the withstand voltage.

As illustrated in FIG. 26, a plurality of semiconductor regions, differing in n-type impurity concentration from one another, are formed around the drain region 183 in the epitaxial layer 174. Specifically, the epitaxial layer 174 has the first body region 184 of the n-type, the second body region 185 of the n-type, and the well region 186 of the n-type. Each of the regions 184, 185, and 186 is set to be higher in impurity concentration than the epitaxial layer 174 and is set to be lower in impurity concentration than the drain region 183.

In this embodiment, the first body region 184 is adjacent to the drain region 183 and surrounds the drain region 183. The n-type impurity concentration of the first body region 184 is higher than the impurity concentration of the second body region 185 and the impurity concentration of the well region 186.

The second body region 185 is adjacent to the first body region 184 and surrounds the first body region 184. The n-type impurity concentration of the second body region 185 is lower than the n-type impurity concentration of the first body region 184 and is higher than the impurity concentration of the well region 186.

The well region 186 is adjacent to the second body region 185 and surrounds the second body region 185. The n-type impurity concentration of the well region 186 is lower than the n-type impurity concentration of the second body region 185.

In this embodiment, a buffer region 182 including the regions 184, 185, and 186 of which the impurity concentrations are adjusted so that the n-type impurity concentration gradually decreases as the distance from each region to the drain region 183 becomes longer is formed around the drain region 183 in the epitaxial layer 174. In other words, the buffer region 182 is arranged to surround the drain region 183 in the epitaxial layer 174. In the buffer region 182, moreover, the n-type impurity concentration is set to be gradually higher from the body region 178 of the p-type functioning as an anode toward the drain region 183 functioning as a cathode. That is, the buffer region 182 is configured such that the impurity concentration in the region closer to the body region 178 is lower than the impurity concentration in the region closer to the drain region 183.

In this embodiment, the well region 186 is greater in thickness than the first body region 184 and the second body region 185. The first body region 184 is greater in thickness than the second body region 185. Each thickness is the length of the surface of the epitaxial layer 174 in the normal direction.

Part of the buffer region 182 overlaps the LOCOS film 188. The well region 186 is set to be longer in width than each of the body regions 184 and 185. As illustrated in FIG. 26, in this embodiment, the buffer region 182 and the field plate 191 are located so as not to overlap each other in a plan view. However, the present invention is not limited in such a manner. For example, the buffer region 182 and the field plate 191 may be located to overlap each other.

Any manufacturing method may be employed for forming the regions 184, 185, and 186. A specific example of such a manufacturing method will now be described. A method for manufacturing the boot diode 151 includes a well region forming step, a second body region forming step, and a first body region forming step. In the well region forming step, the well region 186 is formed by subjecting the epitaxial layer 174 to ion implantation and heat treatment. In the second body region forming step, the second body region 185 is formed by subjecting part of the well region 186 to further ion implantation and heat treatment. In the first body region forming step, the first body region 184 is formed by subjecting part of the second body region 185 to further ion implantation and heat treatment. The drain region 183 is formed by, for example, subjecting the first body region 184 to further ion implantation.

The regions undergoing ion implantation in the first body region 184, second body region 185, and well region 186 are set as follows, for example. That is, the outer peripheral edge of the first body region 184 is set to a region that is located outward from the outer peripheral edge of the drain region 183 by 1.4 µm. The outer peripheral edge of the second body region 185 is set to a region that is located outward from the outer peripheral edge of the drain region 183 by 0.6 µm and surrounds the drain region 183. The well region 186 is set to a region that is located outward from the outer peripheral edge of the second body region 185 by 1.5 µm and surrounds the second body region 185. After the ion implantation, the first body region 184 spreads by thermal diffusion or the like to surround the drain region 183.

The number of layers of the semiconductor regions that differ in n-type impurity concentration from one another is a matter of choice. In this embodiment, the semiconductor regions differ in n-type impurity concentration from one another include the three layers of the first body region 184, second body region 185, and well region 186, but may include one or more semiconductor regions. In addition, the buffer region 182 may have a configuration in which the impurity concentration changes stepwise, or may have a configuration in which the impurity concentration continuously changes.

Advantages

The boot diode 151 has the advantages described below.

(28) The boot diode 151 includes the epitaxial layer 174 serving as a semiconductor layer, the body region 178 serving as an anode region formed on the surface of the epitaxial layer 174, the drain region 183 serving as a cathode region formed on the epitaxial layer 174 and spaced apart from the body region 178, and the buffer region 182 arranged around the drain region 183. The buffer region 182 is higher in impurity concentration than the epitaxial layer 174 and is lower in impurity concentration than the drain region 183.

According to this configuration, when the applied voltage of the boot diode 151 is switched from the forward direction to the reverse direction, the depletion layer expands from the body region 178 toward the drain region 183. In this case, when the depletion layer reaches the buffer region 182, an expansion rate of the depletion layer decreases. It is thus possible to decrease a change rate of a reverse recovery current. This makes it possible to suppress a sudden change in the reverse recovery current that occurs when the depletion layer reaches the drain region 183. It is therefore possible to suppress decreases in the withstand voltage of the boot diode 151.

(29) In the buffer region 182, the region closer to the body region 178 is lower in impurity concentration than the region closer to the drain region 183. In other words, in the buffer region 182, the impurity concentration gradually decreases as the distance from each region to the drain region 183 becomes long. Specifically, the buffer region 182 includes the first body region 184 as a first buffer region having an impurity concentration lower than the impurity concentration of the drain region 183, the second body region 185 as a second buffer region having an impurity concentration lower than the impurity concentration of the first body region 184, and the well region 186 as a third buffer region having an impurity concentration lower than the impurity concentration of the second body region 185.

According to this configuration, when the depletion layer expands in the buffer region 182, the expansion rate of the depletion layer gradually decreases as the depletion layer passes through the well region 186, the second body region 185, and the first body region 184. This makes it possible to suppress a sudden change in the reverse recovery current that occurs when the depletion layer reaches the drain region 183. It is therefore possible to suppress decreases in the withstand voltage of the boot diode 151.

(30) The boot diode 151 includes the LOCOS film 188 arranged on the surface of the epitaxial layer 174, and the field plates 191 arranged on the LOCOS film 188. According to this configuration, it is possible to suppress disturbance of an electric field in the epitaxial layer 174. It is therefore possible to increase the withstand voltage of the boot diode 151.

(31) In the drain region 183, the four curved portions 183c to 183f are located to be separated from each other with the corresponding straight portion located in between. According to this configuration, as compared with when no straight portion exists between adjacent curved portions, interaction seldom occurs between adjacent curved portions, and local current concentration seldom occurs at the curved portions 183c to 183f. The curved portions 183c to 183f are thus less likely to be damaged. It is therefore possible to increase the withstand voltage of the boot diode 151.

(32) The central angle of each of the arc-shaped curved portions 183c to 183f is set at 90° or less. According to this configuration, as compared with when the central angle of each of the curved portions 183c to 183f is set to be larger than 90°, local current concentration hardly occurs at the curved portions 183c to 183f. The curved portions 183c to 183f are thus less likely to be damaged. It is therefore possible to improve the withstand voltage of the boot diode 151.

(33) The inner peripheral edge of the body region 178 is similar in shape to the outer peripheral edge of the drain region 183. According to this configuration, the distance between the inner peripheral edge of the body region 178 and the outer peripheral edge of the drain region 183 is substantially uniform in a plan view. Thus, local current concentration seldom occurs at the outer peripheral edge of the drain region 183. It is thus possible to increase the withstand voltage of the boot diode 151.

Motor Drive Circuit

The power module 1 described above can be applied as a motor drive circuit of a three-phase brushless motor. A brushless motor is applicable to, for example, a motor that drives a fan of an indoor unit or a fan of an outdoor unit in an air conditioner, a motor that drives a fan of an outdoor unit of an air conditioner for business use, a motor that drives a compressor of a refrigerator, a motor that drives a fan of a hair dryer, a motor that drives a fan of an air cleaner, and a motor that drives a pump of a hot-water supply pump.

Figure 27:
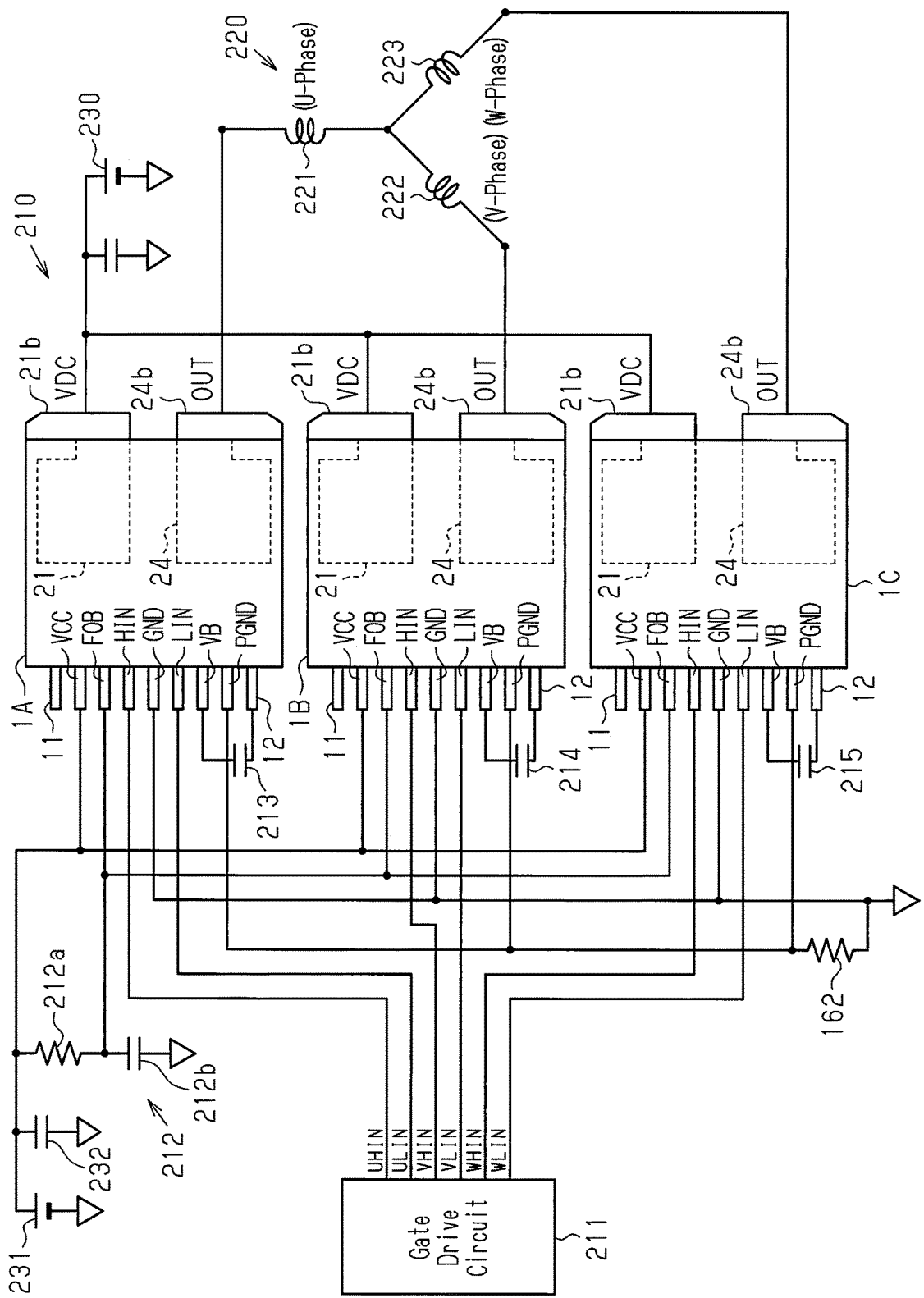
FIG. 27 is a diagram illustrating the configuration of a motor drive circuit including a power module similar to the power module of FIG. 1.

As illustrated in FIG. 27, the motor drive circuit 210 controls the supply of drive power to a U-phase coil 221, a V-phase coil 222, and a W-phase coil 223 of a brushless motor 220. The motor drive circuit 210 includes a first power module 1A, a second power module 1B, a third power module 1C, a gate drive circuit 211, a CR circuit 212, a first capacitor 213, a second capacitor 214, a third capacitor 215, and a current detecting resistor 162. Each of the power modules 1A to 1C is similar in configuration to the power module 1. In addition, the capacitors 213 to 215 are boot capacitors respectively connected to the power modules 1A to 1C.

In FIG. 27, for the sake of convenience, in the first power module 1A, a first protruding portion 21b of a first die pad 21 is connected to a direct-current power supply 230 which is a drive power supply of the brushless motor 220, and a second protruding portion 24b of a second die pad 24 is connected to the U-phase coil 221 of the brushless motor 220. As illustrated in FIG. 3, the first die pad 21 is connected to a first lead frame 11. In addition, the first die pad 21 is electrically connected to a drain 42 of a first switching element 40A mounted thereon (i.e., an electrode at a side closer to the first die pad 21, see FIG. 2). Accordingly, the first die pad 21 functions as a VDC terminal illustrated in FIG. 17. Likewise, the second die pad 24 is connected to a second lead frame 12. The second die pad 24 is also electrically connected to a drain 45 of a second switching element 40B mounted thereon (i.e., an electrode on a side closer to the second die pad 24, see FIG. 2). Accordingly, the second die pad 24 functions as an OUT terminal illustrated in FIG. 17. The second power module 1B and the third power module 1C are similar to the first power module 1A. Accordingly, in each of the second power module 1B and the third power module 1C, a first die pad 21 functions as a VDC terminal and a second die pad 24 functions as an OUT terminal.

As described above, the OUT terminal of the first power module 1A is electrically connected to one of two terminals of the U-phase coil 221. The OUT terminal of the second power module 1B is electrically connected to one of two terminals of the V-phase coil 222. The OUT terminal of the third power module 1C is electrically connected to one of two terminals of the W-phase coil 223. The other terminals of the coils 221 to 223 are connected to one another. The power modules 1A to 1C form a three-phase inverter circuit.

An external power supply 231 is electrically connected to the VCC terminal of each of the power modules 1A to 1C.

The gate drive circuit 211 is connected to an HIN terminal and an LIN terminal of each of the power modules 1A to 1C. The gate drive circuit 211 outputs an upper input signal UHIN and a lower input signal ULIN to the first power module 1A. The gate drive circuit 211 outputs an upper input signal VHIN and a lower input signal VLIN to the second power module 1B. The gate drive circuit 211 outputs an upper input signal WHIN and a lower input signal WLIN to the third power module 1C.

A capacitor 232 and the CR circuit 212 are connected in parallel between the external power supply 231 and the VCC terminal of each of the power modules 1A to 1C.

The capacitor 232 smoothens the power supply voltage VCC.

The current detecting resistor 162 is located between the ground and a source 44 (see FIG. 3) of the second switching element 40B in each of the power modules 1A to 1C. Specifically, the current detecting resistor 162 is connected to a GND terminal and a PGND terminal connected to the source 44 of the second switching element 40B in each of the power modules 1A to 1C.

The CR circuit 212 includes a resistor 212a and a capacitor 212b connected in series. A connection node between the resistor 212a and the capacitor 212b is connected to an FOB terminal of each of the power modules 1A to 1C. The FOB terminals of the power modules 1A to 1C are connected to one another.

As illustrated in FIG. 17, the FOB terminal is connected to a drain of a transistor 147 and an input terminal of a Schmitt trigger 148. Accordingly, the transistor 147 and the resistor 212a of each of the power modules 1A to 1C form a wired OR circuit. An external abnormality signal output from the FOB terminal of any one of the power modules 1A to 1C is input to the FOB terminal of another power module. Accordingly, when an abnormality occurs at one power module, the switching elements 40A and 40B in another power module are turned off based on an external abnormality signal output from the abnormal power module to prevent an abnormal operation of the brushless motor 220. The CR circuit 212 adjusts the time during which the first switching element 40A and the second switching element 40B of each of the power modules 1A to 1C are both turned off based on an external abnormality signal in accordance with the time constant.

As described above, when an abnormality occurs at any one of the power modules 1A to 1C, the first switching element 40A and the second switching element 40B of another power module are both turned off. It is thus possible to suppress an abnormal operation in the brushless motor 220.

Other Embodiments

The description of the foregoing embodiment is merely an example of a form that a power module of the present invention can take and is not intended to limit the form. The power module of the present invention may be embodied in, for example, modified examples (described later) of the foregoing embodiment or a combination of at least two modified examples that do not contradict each other.

Overall Configuration of Power Module

Figure 28:
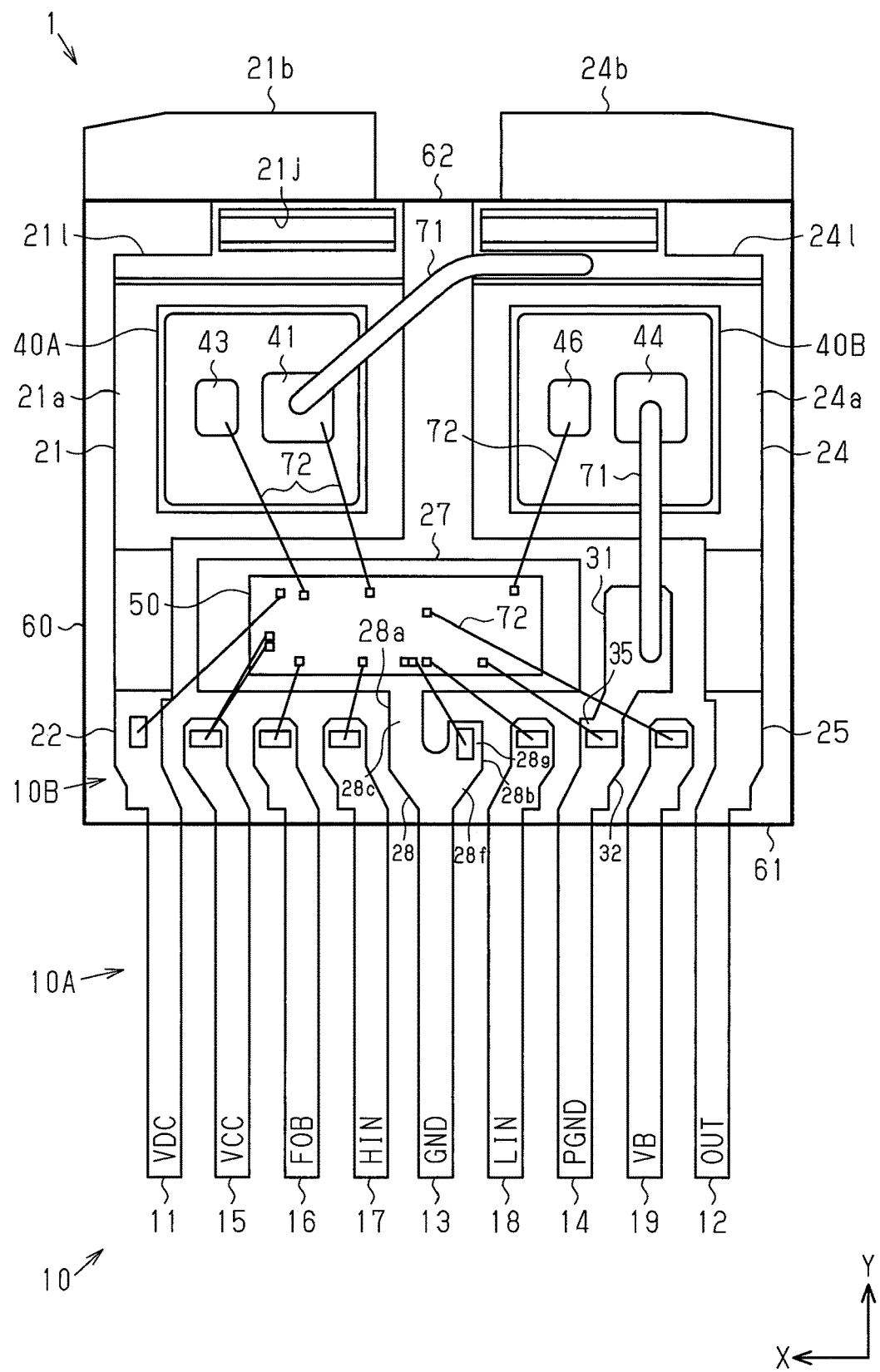
FIG. 28 is a schematic plan view that illustrates the layout of components configuring a power module in a modified example.

In the foregoing embodiment, the power module 1 may have the layout illustrated in FIG. 28.

(a) With regard to the arrangement of the lead frames 11 to 19 in the lead frame assembly 10, the third lead frame 13 and the seventh lead frame 17 are exchanged. The third lead frame 13 is thus located at the center of the lead frames 11 to 19 in the lead frame assembly 10. In this case, the first projection 28f of the projecting portion 28b in the third inner lead 28 of the third lead frame 13 is inclined toward the second inner lead 25 of the second lead frame 12 as the first projection 28f approaches the third die pad 27. The second projection 28g is located at a position closer to the second inner lead 25 than the first portion 28c of the third inner lead 28. As described above, the projecting portion 28b is located between the main body 28a of the third inner lead 28 and the eighth lead frame 18 in the sideward direction X.

(b) With regard to the arrangement of the lead frames 11 to 19 in the lead frame assembly 10, the fourth lead frame 14 and the ninth lead frame 19 are exchanged. As a result, the small-current connection member 72 connecting the ninth lead frame 19 to the integrated circuit element 50 traverses the fourth lead frame 14.

In this case, the structure of the fourth lead frame 14 may be changed as follows. That is, the fourth inner lead 32 of the fourth lead frame 14 is inclined toward the first inner lead 22 of the first lead frame 11 as the fourth inner lead 32 approaches the first side surface 61 of the encapsulation resin 60. A small-current connection portion 35 is formed at an intermediate part of the fourth inner lead 32 to form a region where the small-current connection member 72 is connected. The small-current connection portion 35 extends in the lengthwise direction Y. As a result, the shape of the small-current connection portion 35 on the fourth inner lead 32 differs from the other inclined shape. Therefore, the small-current connection portion 35 serves to indicate where to connect the small-current connection member 72 to the fourth inner lead 32. Accordingly, a worker can easily recognize the position of the small-current connection portion 35 for connecting the small-current connection member 72. It is accordingly possible to easily check whether or not the small-current connection member 72 is connected to the correct position in manufacturing the power module 1, for example. As illustrated in FIG. 28, the connection portion 31 of the fourth lead frame 14 may be smaller in dimension in the lengthwise direction Y than the third die pad 27 of the third lead frame 13.

In the foregoing embodiment, the first die pad 21 of the first lead frame 11 and the second die pad 24 of the second lead frame 12 may be configured as illustrated in FIG. 28. That is, a hook part 211 which is recessed inward in the sideward direction X may be formed at an end, closer to the second side surface 62 of the encapsulation resin 60, of the first accommodated portion 21a of the first die pad 21 in the lengthwise direction Y. The hook part 211 is formed on the outer peripheral edge of the first accommodated portion 21a in the sideward direction X. The hook part 211 is formed by cutting out, in the sideward direction X, a portion where the first recess 21j is provided in the first accommodated portion 21a. The cutout portion 24e (see FIG. 6) may be omitted. According to this configuration, the resin of the encapsulation resin 60 is filled in the lengthwise direction Y between the first accommodated portion 21a and the first protruding portion 21b of the first die pad 21. This restricts movement of the first die pad 21 in the lengthwise direction Y. As illustrated in FIG. 28, a hook part 241 may be formed in the same manner in the second die pad 24.

In the foregoing embodiment, the first switching element 40A and the second switching element 40B may be configured as illustrated in FIG. 28. More specifically, the gate 43 of the first switching element 40A is located at the center of the first switching element 40A in the lengthwise direction Y. The gate 46 of the second switching element 40B is located at the center of the second switching element 40B in the lengthwise direction Y.

Figure 29:
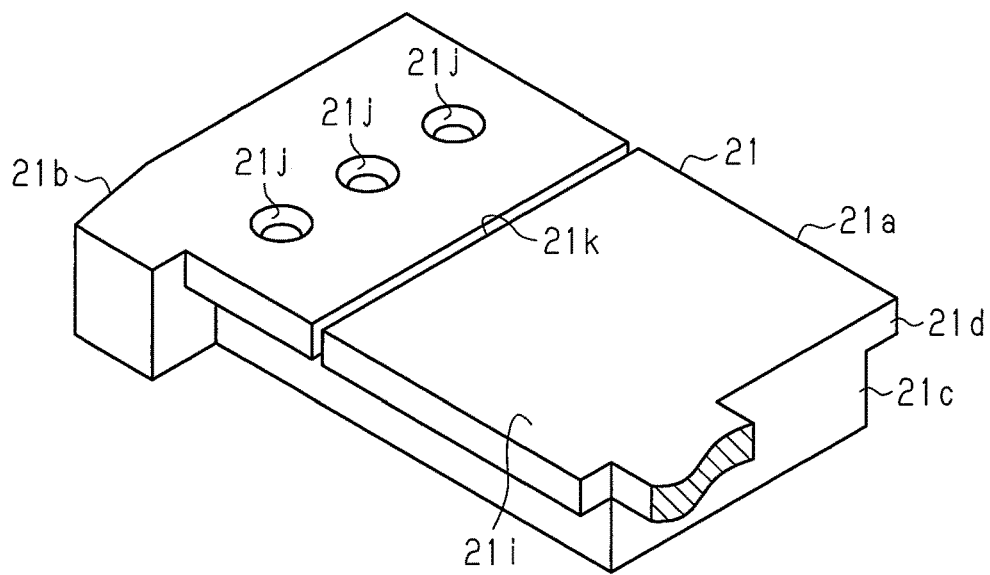
FIG. 29 is a perspective view illustrating a first die pad of the power module in a modified example.

In the foregoing embodiment, as illustrated in FIG. 29, the first recess 21j of the first die pad 21 may include a plurality of first recesses 21j. Each of the first recesses 21j is, for example, a circular hole in a plan view. The first recesses 21j are spaced apart from one another in the sideward direction X. The shape, size, number, and the like of the first recesses 21j are matters of choice. For example, the number of first recesses 21j may be two. Alternatively, the number of first recesses 21j may be four or greater.

Figure 30:
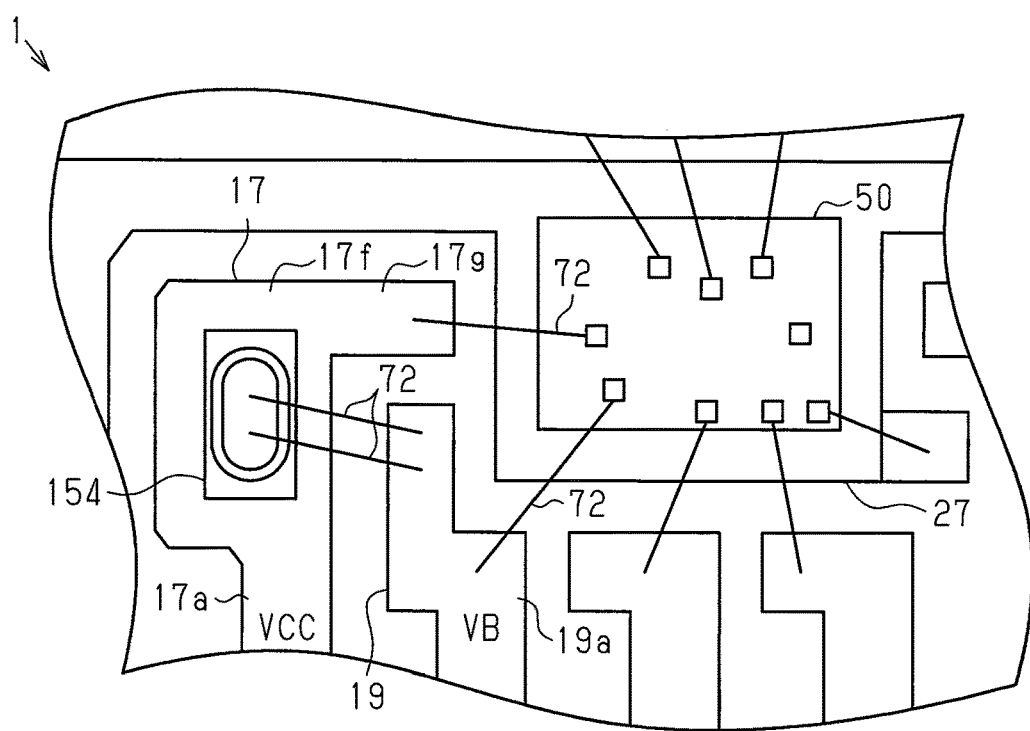
FIGS. 30 and 31 is an enlarged plan view illustrating a third die pad of the power module in a modified example.

In the foregoing embodiment, the boot diode 151 and the resistor 153 may be located outside the integrated circuit element 50 and inside the power module 1. For example, as illustrated in FIG. 30, a resistor-incorporating diode 154 is mounted on a distal end 17f of the seventh inner lead 17a of the seventh lead frame 17 as the VCC terminal. The resistor-incorporating diode 154 includes a boot diode and a resistor. The distal end 17f is arranged next to the third die pad 27 in the sideward direction X. The distal end 17f has a region, which is larger than the seventh inner lead 17a in the sideward direction X, for supporting the resistor-incorporating diode 154. The distal end 17f has a projecting portion 17g extending in the sideward direction X toward the third die pad 27. The projecting portion 17g is connected to a small-current connection member 72, which is electrically connected to the integrated circuit element 50. The ninth lead frame 19 is located adjacent to the seventh lead frame 17 in the sideward direction X. The small-current connection member 72 electrically connects the distal end of the ninth inner lead 19a of the ninth lead frame 19 to the resistor-incorporating diode 154.

Figure 31:
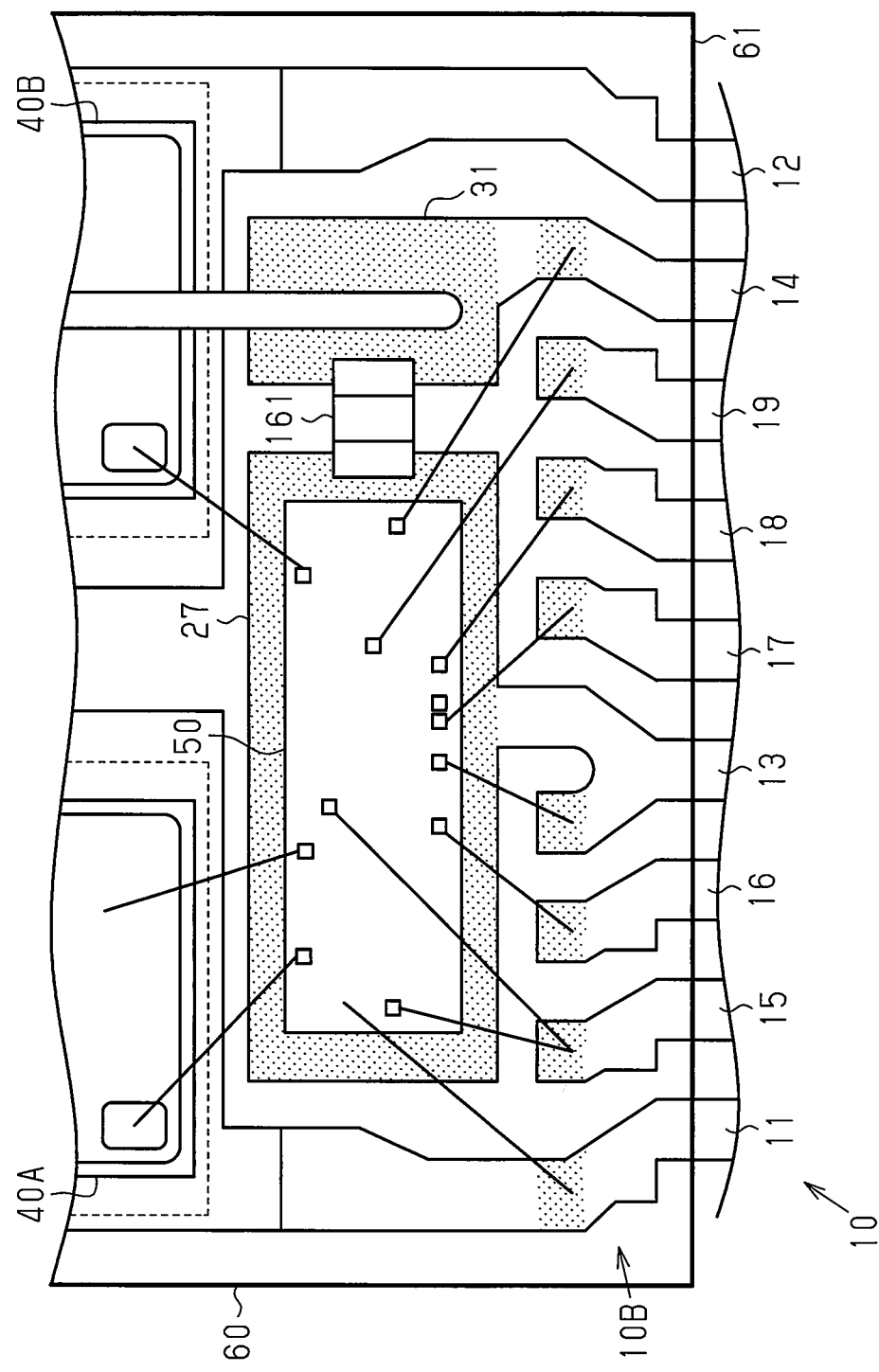

In the foregoing embodiment, the current detecting resistor 161 may be accommodated in the power module 1 (encapsulation resin 60). As illustrated in FIG. 31, for example, the current detecting resistor 161, which serves as a resistor element, may be connected to the third die pad 27 of the third lead frame 13 and the connection portion 31 of the fourth lead frame 14. The current detecting resistor 161 extends between the third die pad 27 and the connection portion 31. According to this configuration, as compared with when the power module 1 and the current detecting resistor 161 are individually mounted on a circuit board, it is also possible to decrease a mounting area on the circuit board. Also in the power module 1 illustrated in FIG. 28, likewise, the current detecting resistor 161 may be connected to the third die pad 27 and the connection portion 31 of the fourth lead frame 14.

Figure 32:
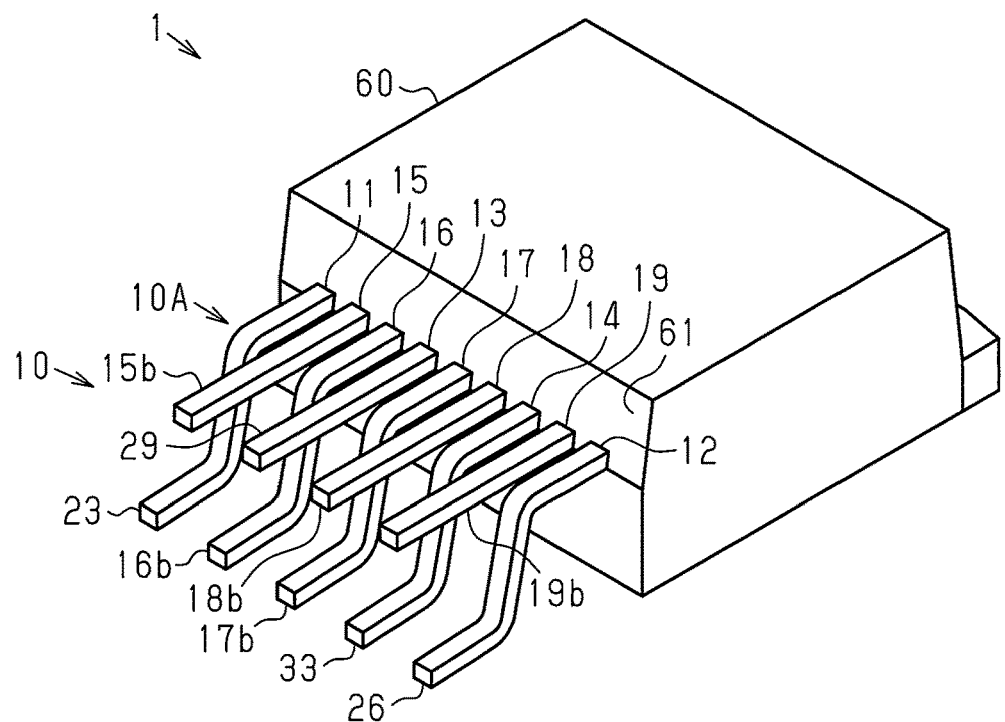
FIG. 32 is a perspective view of a power module in a modified example.

In the foregoing embodiment, the power module 1 may be of a substrate insertion type in which the lead frame assembly 10 includes folded outer lead and non-folded straight outer leads that are alternately arranged. As illustrated in FIG. 32, for example, the first outer lead 23 of the first lead frame 11, the sixth outer lead 16b of the sixth lead frame 16, the seventh outer lead 17b of the seventh lead frame 17, the fourth outer lead 33 of the fourth lead frame 14, and the second outer lead 26 of the second lead frame 12 are folded. The fifth outer lead 15b of the fifth lead frame 15, the third outer lead 29 of the third lead frame 13, the eighth outer lead 18b of the eighth lead frame 18, and the ninth outer lead 19b of the ninth lead frame 19 extending straight in the lengthwise direction Y. This configuration reduces the mounting area of the power module 1 on the circuit board as compared with a power module 1 that is surface-mounted.

In the foregoing embodiment, the cutout portion 21*e* may be omitted from the first die pad 21. Alternatively, the cutout portion 24*e* may be omitted from the second die pad 24.

In the foregoing embodiment, the flange 21*d* of the first die pad 21 may protrude from the intermediate portion of the base 21*c* in the vertical direction Z. Alternatively, the flange 21*d* of the first die pad 21 may protrude from an end, closer to the first end surface 63 of the encapsulation resin 60, of the base 21*c*. The flange 24*d* of the second die pad 24 may be changed in the same manner.

In the foregoing embodiment, the gap G1 between the first accommodated portion 21*a* of the first die pad 21 and the second accommodated portion 24*a* of the second die pad 24 may be equal to the gap G3 between the first protruding portion 21*b* of the first die pad 21 and the second protruding portion 24*b* of the second die pad 24.

In the foregoing embodiment, the flange 21*d* may be omitted from the first die pad 21. Alternatively, the flange 24*d* may be omitted from the second die pad 24.

In the foregoing embodiment, at least one of the restrictions 15*e* to 19*e*, 22*d*, and 25*d* of the lead frames 11, 12, and 15 to 19 in the lead frame assembly 10 may be omitted. At least one of the third inner lead 28 of the third lead frame 13 and the fourth inner lead 32 of the fourth lead frame 14 may be provided with a restriction that restricts the movement of the encapsulation resin 60 to the first side surface 61.

In the foregoing embodiment, the lead frame assembly 10 may be entirely plated with silver (or nickel plating, PPF). In this case, preferably, the lead frame assembly 10 is entirely plated with silver after the second die pad 24 is connected to the large-current connection member 71 and the connection portion 31 is connected to the large-current connection member 71. It is thus possible to connect the large-current connection member 71 to the second die pad 24 and the connection portion 31 with increased reliability.

In the foregoing embodiment, the power module 1 may employ any type of semiconductor package including an encapsulation resin 60, such as SOP, instead of the SIP-type semiconductor package.

Switching Element

In the foregoing embodiment, the first switching element 40A may have a structure other than the superjunction structure. The second switching element 40B may also be changed in the same manner.

In the foregoing embodiment, the planar shape of the p-type base layer 83 or the like may be changed to a circular shape, an oval shape, a pentagonal shape, a heptagonal shape, or a polygonal shape having more than seven sides.

In the foregoing embodiment, the first switching element 40A and the second switching element 40B may be configured so that the conduction type of the semiconductor portions is inversed.

Figure 33:
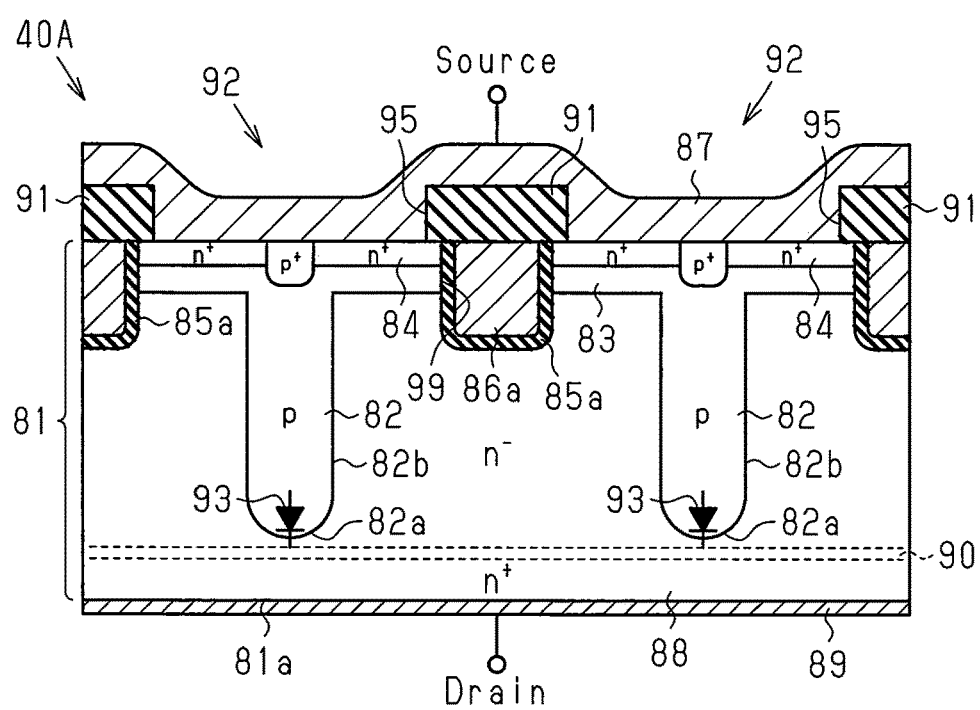
FIG. 33 is a schematic cross-sectional view of a first switching element in a modified example.

In the foregoing embodiment, as illustrated in FIG. 33, the first switching element 40A may have a trench gate structure. Specifically, the first switching element 40A may have the following trench gate structure. A gate trench 99 is formed to pass through the n$^+$-type source layer 84 and p-type base layer 83 from a surface of the n$^-$-type base layer 81. The gate trench 99 is filled with the gate electrode 86*a* via the gate insulative film 85*a*.

Figure 34:
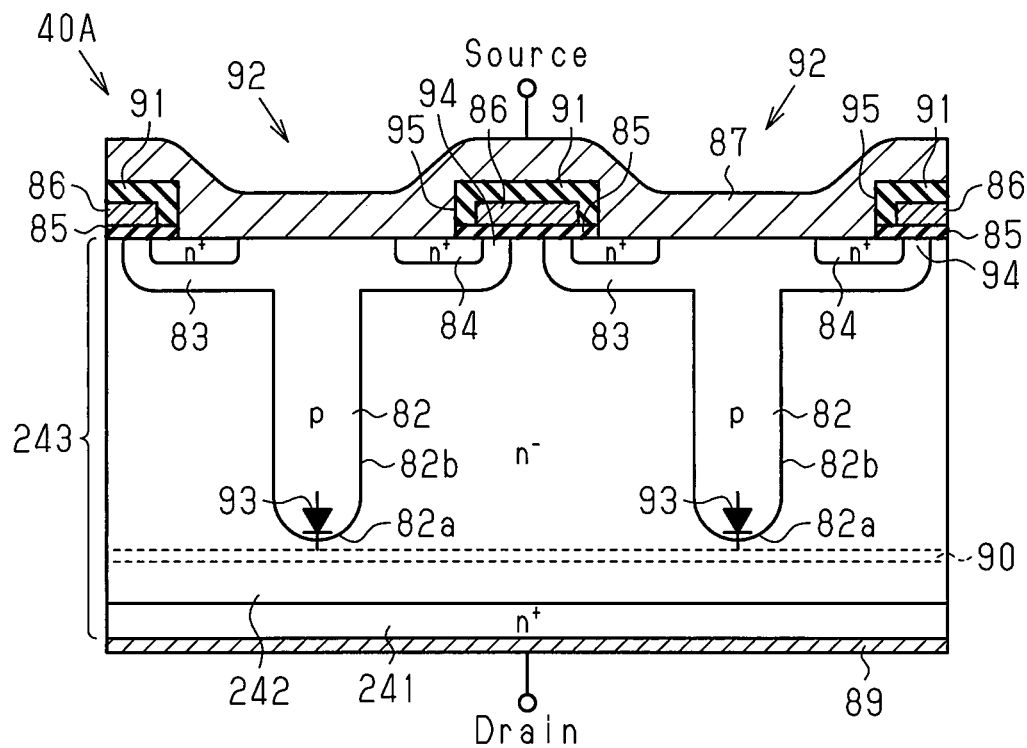
FIG. 34 is a schematic cross-sectional view of a first switching element in a modified example.

In the foregoing embodiment, as illustrated in FIG. 34, the first switching element 40A may have a stacked structure of an n$^+$-type substrate 241 and an n$^-$-type drift layer 242. In the n-type base layer 243, the n$^-$-type drift layer 242 has a relatively low impurity concentration, and the n$^+$-type substrate 241 has a relatively high impurity concentration. The n$^+$-type substrate 241 is thus configured to support the n$^-$-type drift layer 242 and is also configured to serve as the n$^+$-type contact layer 88 (see FIG. 11) in the foregoing embodiment.

Figure 35A:
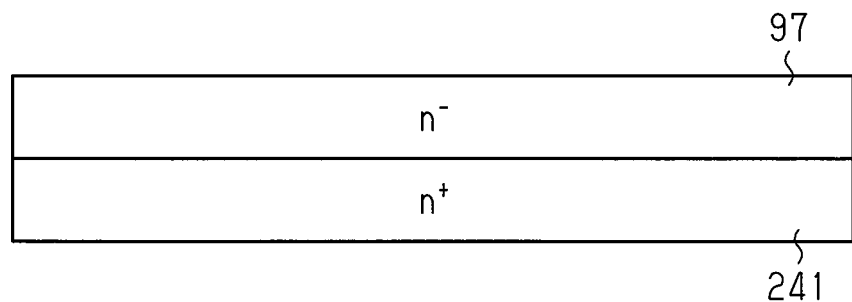
FIG. 35A illustrates a step of manufacturing the first switching element of FIG. 34.
Figure 35B:
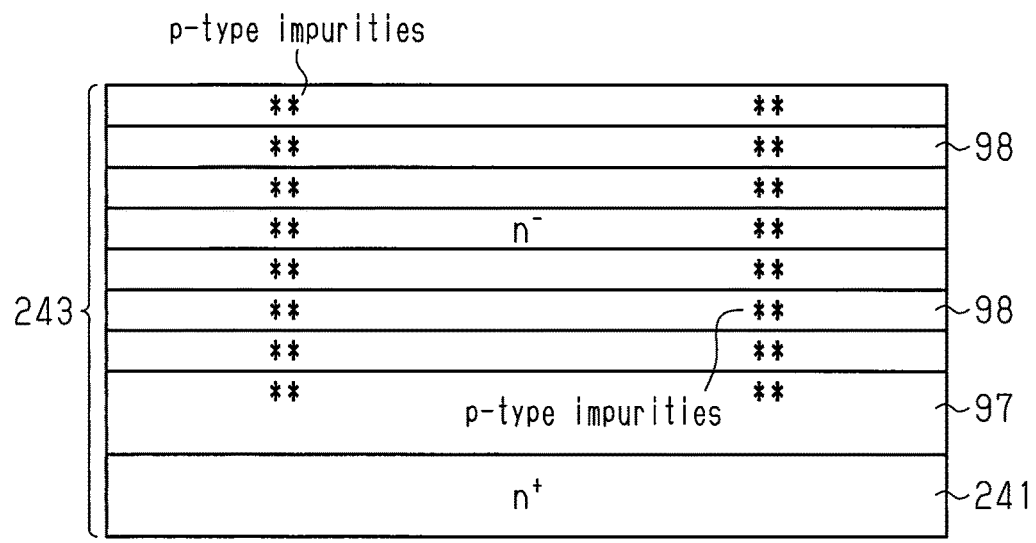
FIG. 35B illustrates a step subsequent to the step of FIG. 35A.

The first switching element 40A is manufactured as follows. First, as illustrated in FIGS. 35A and 35B, an initial base layer 97 is formed on an n$^+$-type substrate 241, and then a plurality of n-type semiconductor layers 98 are stacked on the initial base layer 97 to form an n$^-$-type drift layer 242 in the same manner as the steps illustrated in FIGS. 15A and 15B. This forms an n-type base layer 243 including the n$^+$-type substrate 241 and the n$^-$-type drift layer 242.

Figure 35C:
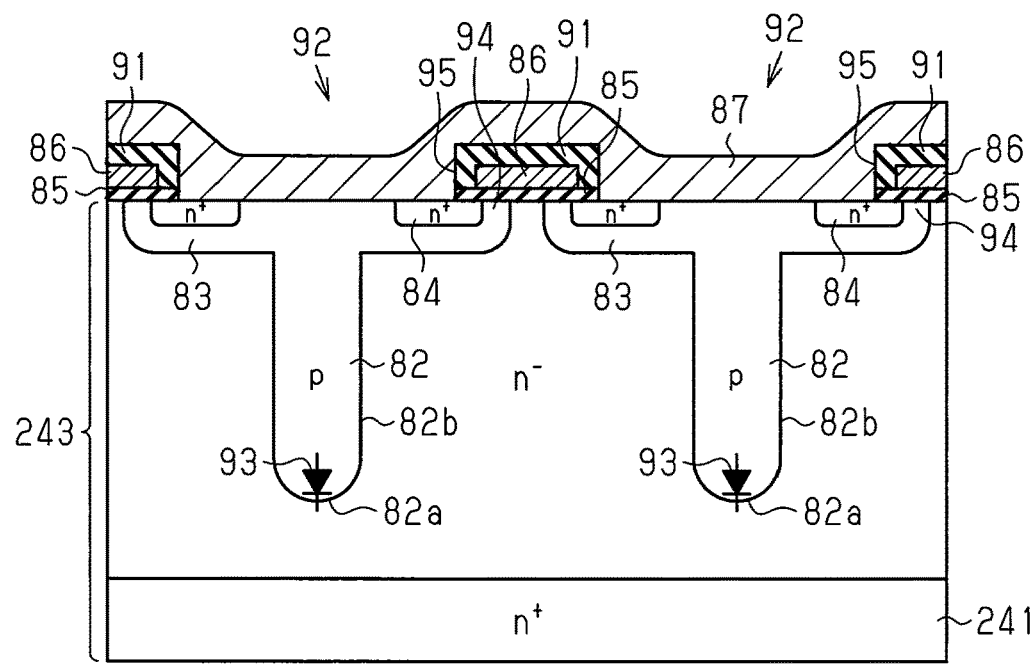
FIG. 35C illustrates a step subsequent to the step of FIG. 35B.

Next, as illustrated in FIG. 35C, an annealing treatment (1000° C. to 1200° C.) is performed to drive-diffuse p-type impurities in the plurality of n-type semiconductor layers 98. This forms a p-type column layer 82. Subsequently, a p-type base layer 83, an n$^+$-type source layer 84, a gate insulative film 85, a gate electrode 86, and the like are formed through a step similar to that illustrated in FIG. 15C. Thereafter, steps similar to those illustrated in FIGS. 15D to 15E are performed. This obtains the first switching element 40A. The second switching element 40B may be similar in structure to the first switching element 40A.

Circuits in Power Module

Figure 36:
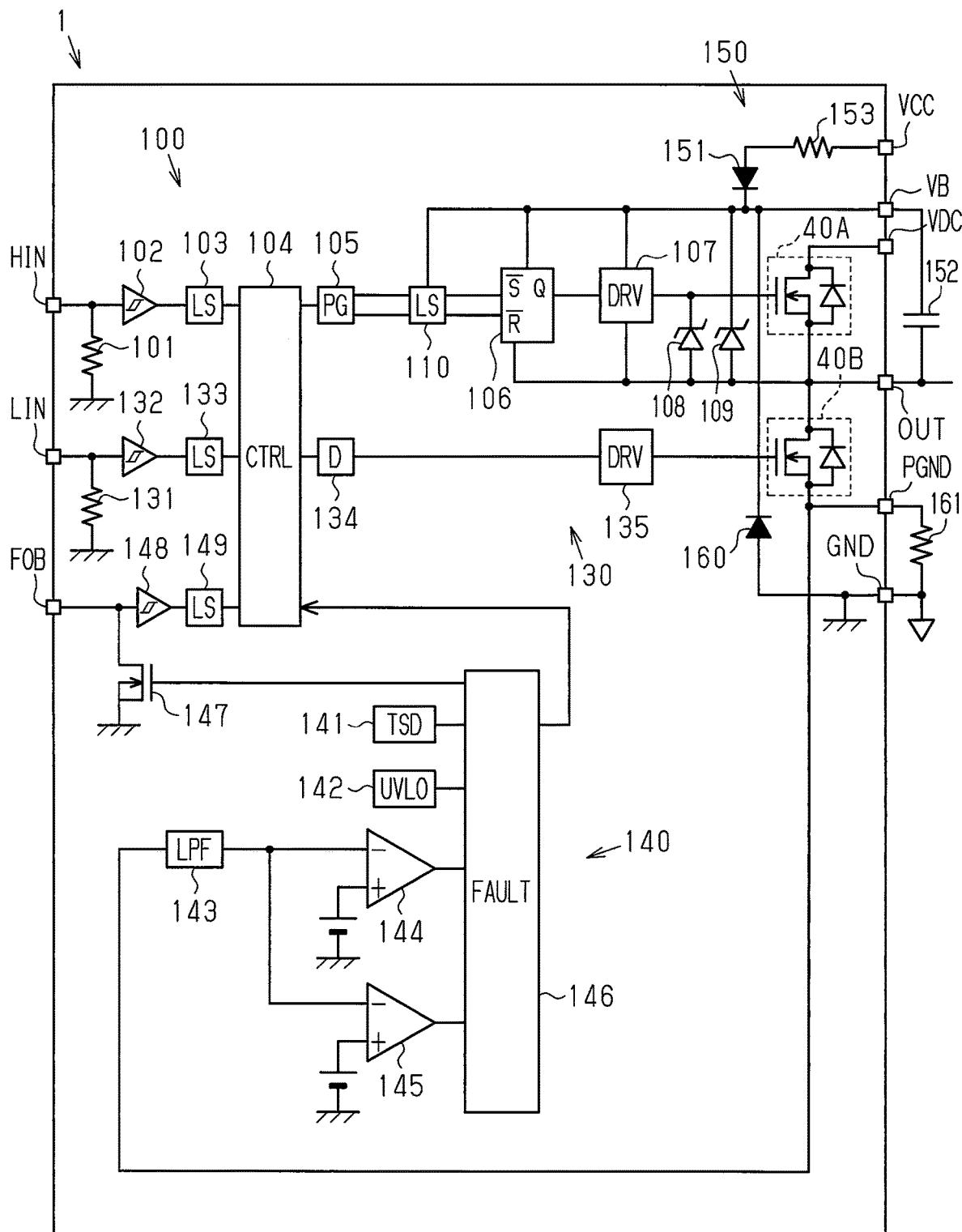
FIG. 36 is a block diagram that illustrates in detail the circuit configuration of the power module in a modified example.

In the foregoing embodiment, as illustrated in FIG. 36, the filter circuit 120 may be omitted from the upper switch drive unit 100. In this case, the level shift circuit 110 shifts the levels of an ON signal S$_{ON}$ and an OFF signal S$_{OFF}$ from the pulse generator 105, and then outputs the level-shifted signals to the RS flip-flop circuit 106.

Figure 37:
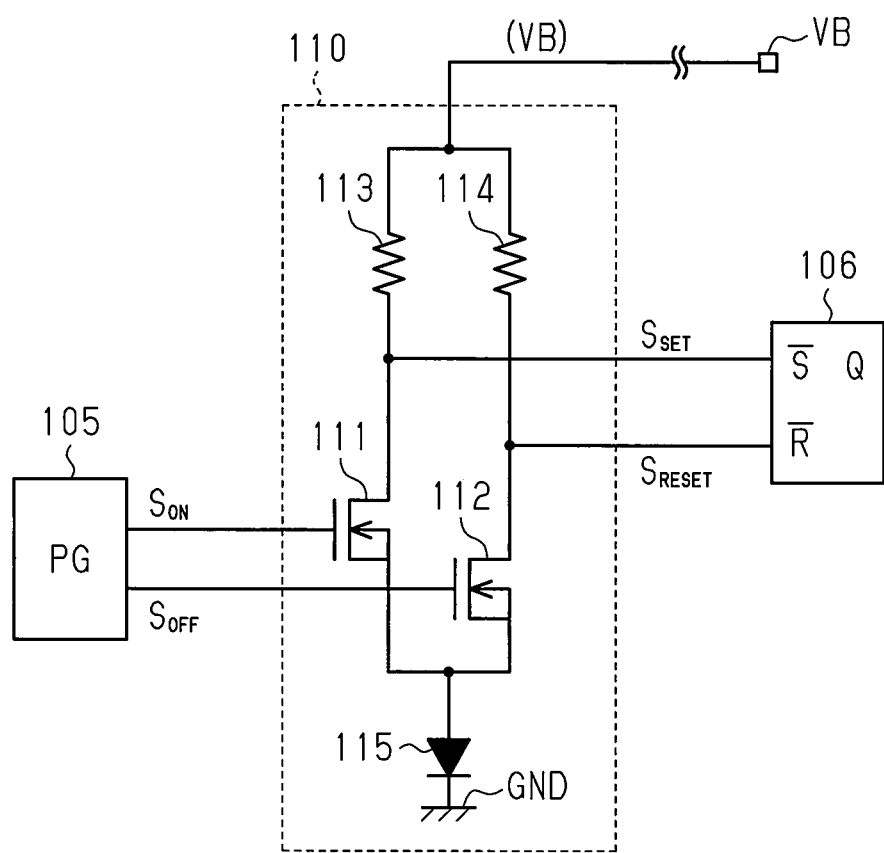
FIG. 37 is a diagram illustrating the configuration of a level shift circuit shown in FIG. 36.

In this case, as illustrated in FIG. 37, the level shift circuit 110 includes a backflow preventing diode 115. The backflow preventing diode 115 has an anode connected to the source and back gate of each of the transistors 111 and 112, and a cathode connected to the ground terminal GND. In this configuration, the backflow preventing diode 115 can avoid generation of an erroneous signal of an upper output signal HO resulting from a reverse recovery current in the level shift circuit 110.

The level shift circuit 110 in the foregoing embodiment may additionally include the backflow preventing diode 115 illustrated in FIG. 37.

In the foregoing embodiment, the current limiter circuit 144 may be omitted from the abnormality prevention unit 140.

Boot Diode

In the foregoing embodiment, the shape of the boot diode 151 in a plan view may be changed as follows.

Figure 38:
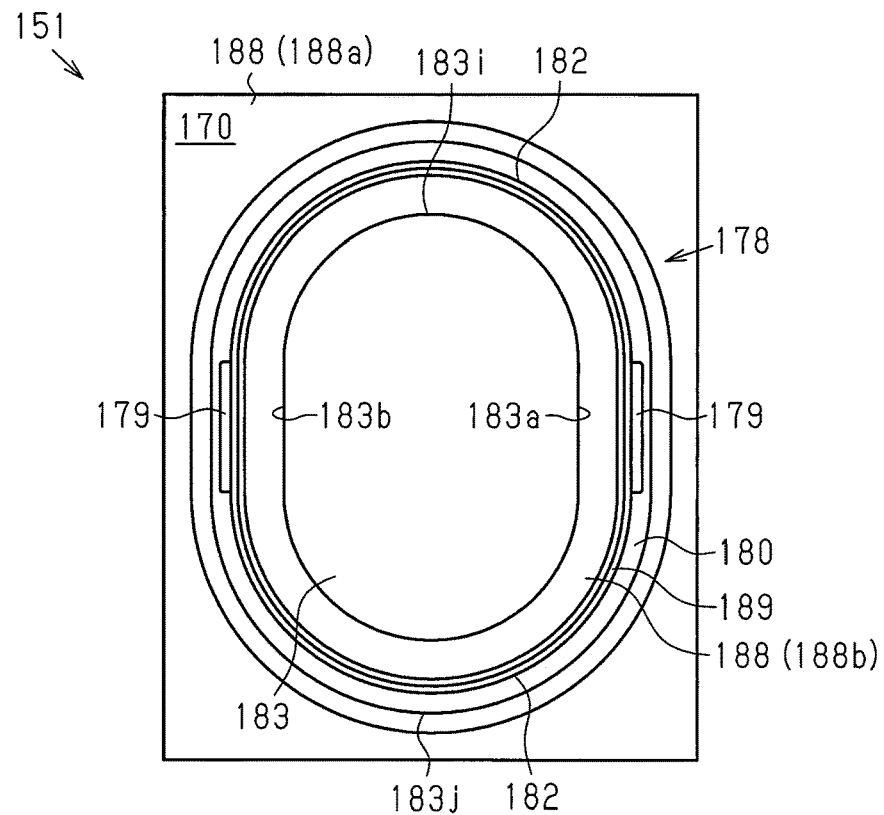
FIG. 38 is a plan view of a boot diode in a modified example.

(a) As illustrated in FIG. 38, the outer peripheral edge of the drain region 183 in the boot diode 151 is formed to have the shape of a substantially oblong ring in a plan view, including two first straight portions 183*a* and 183*b* and two curved portions 183*i* and 183*j* continuous with the two ends of the first straight portions 183*a* and 183*b*. Each of the curved portions 183*i* and 183*j* restricts local current concentration. As illustrated in FIG. 38, moreover, the shape of the inner peripheral edge of the body region 178 may be changed to be similar in shape with the outer peripheral edge of the drain region 183.

Figure 39:
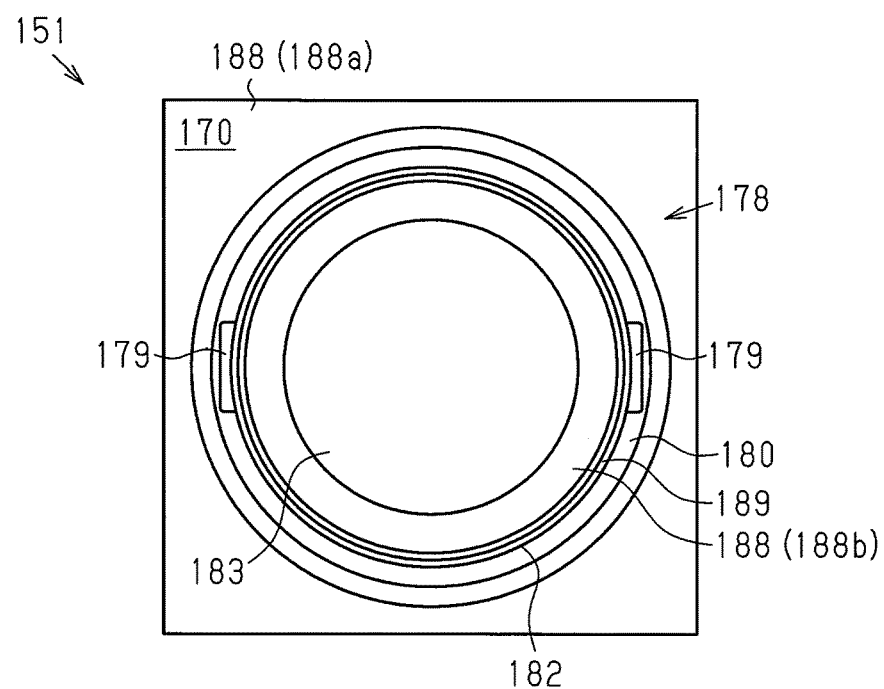
FIG. 39 is a plan view of a boot diode in a modified example.

(b) As illustrated in FIG. 39, the drain region 183 of the boot diode 151 is formed to have the shape of an annular ring in a plan view. The outer peripheral edge of the drain region 183 restricts local current concentration. As illustrated in FIG. 39, the shape of the inner peripheral edge of the body region 178 may be changed to be similar to the shape of the outer peripheral edge of the drain region 183.

In the foregoing embodiment, the source regions 179 are respectively formed on the first straight portions 178a and 178b and the second straight portions 178g and 178h. Alternatively, the source regions 179 are not necessarily formed on the curve portions 178c to 178f. The source region 179 may be formed along the shape of the body region 178. In other words, the source region 179 may be formed to be substantially ring-shaped in a plan view. Alternatively, the source region 179 may be omitted.

In the foregoing embodiment, shallow trench isolation (STI) may be employed instead of the LOCOS film 188. The STI includes an insulator that is buried in a trench formed to be ring-shaped in a plan view. The trench is formed by digging down the epitaxial layer 174 between the gate insulative film 187 and the drain region 183. The insulator may be integrated with the gate insulative film 187 on the epitaxial layer 174. The insulator may be, for example, a silicon oxide or a silicon nitride.

In the foregoing embodiment, the body region 178 may be divided into a plurality of segments which are formed in a non-continuous manner. In this case, the body region 178 may be divided into a plurality of segments which are formed in a non-continuous manner along a strip-shaped region formed along the outer peripheral edge of the inner LOCOS film 188b.

In the foregoing embodiment, one LDMIS region 170 may include a plurality of body regions 178 (plurality of LDMISs).

In the foregoing embodiment, the conduction type of the semiconductor substrate 172 may be changed from the p type to the n type. In this case, the conduction types of the remaining regions may be changed in accordance with the change in the conduction type of the semiconductor substrate 172.

Circuits Using Power Module

Figure 40:
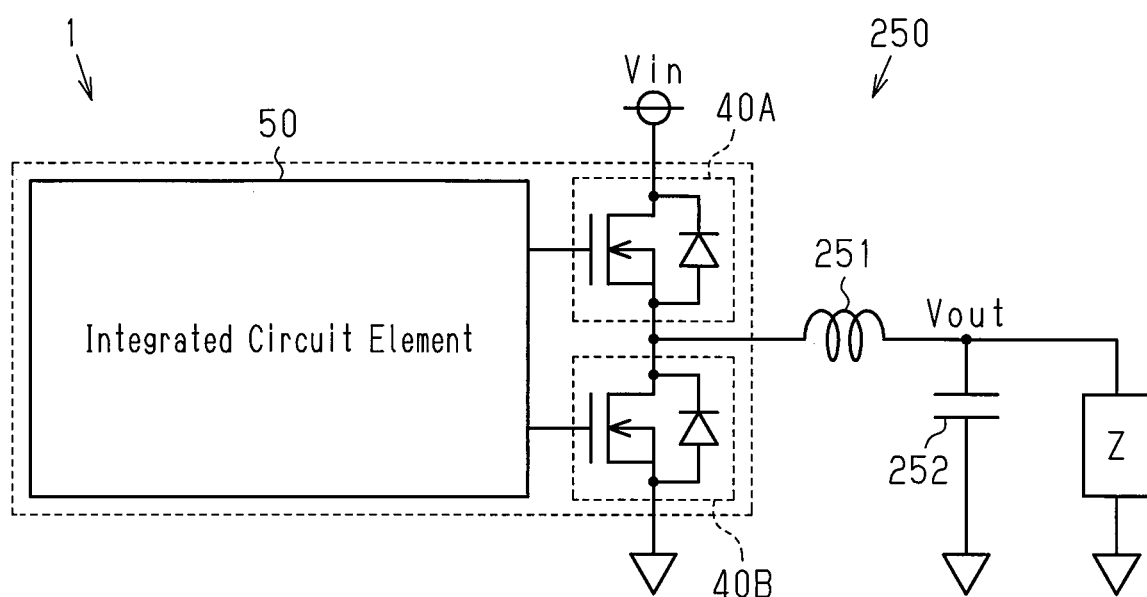
FIG. 40 illustrates an application example of the power module.

As illustrated in FIG. 40, a switching power supply circuit 250 of a synchronous rectification type may use a single power module 1. The switching power supply circuit 250 includes, in addition to the power module 1, an inductor 251 and a smoothing capacitor 252. The switching power supply circuit 250 drives the first switching element 40A and the second switching element 40B in a complementary (exclusive) manner to generate the desired output voltage Vout from an input voltage Vin. The number of power modules 1 is one in this case.

Moreover, a motor drive circuit for a single-phase, full-wave motor or a drive circuit for an H bridge may use two power modules 1. Alternatively, a motor drive circuit for a stepping motor may use four power modules 1. Further, a motor drive circuit for a five-phase stepping motor may use five power modules 1.

Additional Remarks

Technical concepts that can be recognized from the foregoing embodiment and modified examples will now be described.

Remark A1. A method for manufacturing a power module including a first die pad, a first switching element mounted on the first die pad, a second die pad electrically insulated from the first die pad, a second switching element mounted on the second die pad, an integrated circuit element that controls a switching operation of the first switching element and the second switching element, an encapsulation resin that encapsulates the first switching element, the second switching element, and the integrated circuit element, and a lead frame assembly including outer leads protruding from the encapsulation resin and inner leads arranged in the encapsulation resin and electrically connected to the outer leads, the method including:

a switching element mounting step of mounting the first switching element on the first die pad and mounting the second switching element on the second die pad;

a first bonding step of connecting the first switching element and the second die pad through wire bonding and connecting the second switching element to one of the inner leads;

a plating step of plating the inner leads after the first bonding step; and a second bonding step of connecting the integrated circuit element and at least one of the inner leads through wire bonding after the plating step.

Remark B1. A diode including:

a semiconductor layer of a first conduction type;

an anode region of a second conduction type, wherein the anode region is formed on a surface of the semiconductor layer;

a cathode region of the first conduction type, wherein the cathode region is formed on the surface of the semiconductor layer spaced apart from the anode region; and a buffer region of the first conduction type, wherein the buffer region surrounds the cathode region in the semiconductor layer, and the buffer region has a higher impurity concentration than the semiconductor layer and a lower impurity concentration than the cathode region.

Remark B2. The diode according to remark B1, wherein the buffer region is configured so that a region closer to the anode region has a lower impurity concentration than a region closer to the cathode region.

Remark B3. The diode according to remark B2, wherein the buffer region includes:

a first buffer region adjacent to the cathode region, wherein the first buffer region being has an impurity concentration that is higher than that of the semiconductor layer and lower than that of the cathode region; and a second buffer region that surrounds the first buffer region, wherein the second buffer region has an impurity concentration that is higher than that of the semiconductor layer and lower than that of the first buffer region.

Remark B4. The diode according to remark B3, wherein
the buffer region further includes a third buffer region that surrounds the second buffer region, and
the third buffer region has an impurity concentration that is higher than that of the semiconductor layer and lower than that of the second buffer region.

Remark B5. The diode according to remark B1, wherein
the anode region is ring-shaped in a plan view, and
the cathode region is located inward from the anode region and includes an outer peripheral edge that is similar in shape to an inner peripheral edge of the anode region.

Remark B6. The diode according to remark B1, wherein an outer peripheral edge of the cathode region includes a curved portion that limits current concentration.

Remark B7. The diode according to remark B6, wherein
the curved portion is one of four curved portions, and
the outer peripheral edge of the cathode region includes the four curved portions, which are spaced apart from one another, and four straight portions, each located between adjacent one of the curved portions continuously with the curved portions.

Remark B8. The diode according to remark B6, wherein the curved portion is arcuate and has a central angle of 90° or less.

The object of remarks B1 to B8 will now be described.

A diode may include, for example, a semiconductor layer of a first conduction type, an anode region of a second conduction type formed on a surface of the semiconductor layer, and a cathode region of the first conduction type formed on the surface of the semiconductor layer spaced apart from the anode region. The diode may be used as a boot diode that forms a bootstrap circuit for turning on a switching element of an upper arm of a half-bridge circuit. Such a boot diode may need to withstand voltage.

If a diode is used as a boot diode, when performing a bootstrap operation that charges and discharges a boot capacitor, the switching from a forward voltage to a reverse voltage linearly increase the reverse recovery current as time elapses. When the reverse voltage is applied to the diode, a depletion layer expands from the anode region toward the cathode region in the semiconductor layer. The depletion layer is eliminated in a sudden manner when reaching the cathode region. Here, a change rate (di/dt) of the reverse recovery current significantly increases. This may lower the withstand voltage of the diode.

In this regard, for example, the through rate (dV/dt) for controlling a half-bridge circuit may be lowered to increase the change rate of the reverse recovery current. However, the lowered through rate reduces the switching rate of the two switching elements. This may hinder high-speed operation.

Accordingly, it is an object of the diode to limit decreases in the withstand voltage that would result from the application of a reverse voltage.

The invention claimed is:

1. A power module comprising:
a first die pad;
a first switching element that is mounted on the first die pad;
a second die pad that is electrically insulated from the first die pad;
a second switching element that is mounted on the second die pad;
an integrated circuit element that controls a switching operation of the first switching element and the second switching element;
an encapsulation resin that encapsulates the first switching element, the second switching element, and the integrated circuit element; and
a lead frame assembly that includes an outer lead, which protrudes from the encapsulation resin, and an inner lead, which is arranged in the encapsulation resin and electrically connected to the outer lead,
wherein the lead frame assembly includes a first lead frame and a second lead frame,
the first lead frame includes a first inner lead, which serves as the inner lead and is connected to the first die pad, and a first outer lead, which serves as the outer lead and is electrically connected to the first inner lead,
the second lead frame includes a second inner lead, which serves as the inner lead and is connected to the second die pad, and a second outer lead, which serves as the outer lead and is electrically connected to the second inner lead,
the first switching element and the second switching element each have a superjunction structure,
the first die pad includes a first accommodated portion, which is encapsulated in the encapsulation resin, and a first protruding portion, which protrudes out of the encapsulation resin from the first accommodated portion,
the second die pad includes a second accommodated portion, which is encapsulated in the encapsulation resin, and a second protruding portion, which protrudes out of the encapsulation resin from the second accommodated portion, and
a shortest distance between the first protruding portion and the second protruding portion is longer than a shortest distance between the first accommodated portion and the second accommodated portion.

2. The power module according to claim 1, wherein
the first switching element includes an electrode located on a surface closer to the first die pad,
the electrode of the first switching element is mounted on the first die pad with a first conductive paste arranged between the electrode and the first die pad,
the second switching element includes an electrode located on a surface closer to the second die pad, and
the electrode of the second switching element is mounted on the second die pad with a second conductive paste arranged between the electrode and the second die pad.

3. The power module according to claim 1, wherein
the first die pad, the first inner lead, and the first outer lead are integrated into a single component, and
the second die pad, the second inner lead, and the second outer lead are integrated into a single component.

4. The power module according to claim 1, wherein:
the lead frame assembly includes a plurality of lead frames that include at least the first lead frame and the second lead frame;
the lead frames are arranged along a side surface of the encapsulation resin; and
when a direction in which the lead frames are arranged in the lead frame assembly is defined as a sideward direction, the first lead frame is the one of the lead frames located at one end of the lead frame assembly in the sideward direction, and the second lead frame is the one of the lead frames located at the other end of the lead frame assembly in the sideward direction.

5. The power module according to claim 1, further comprising a third die pad on which the integrated circuit element is mounted, wherein:
the lead frame assembly includes a plurality of lead frames that include at least the first lead frame and the second lead frame;
the lead frames are arranged along a side surface of the encapsulation resin;
when a direction in which the lead frames are arranged in the lead frame assembly is defined as a sideward direction, a direction perpendicular to the sideward direction in a plan view of the lead frame assembly is defined as a lengthwise direction, and a direction perpendicular to the sideward direction and the lengthwise direction is defined as a vertical direction, the third die pad is located at a position in the vertical direction separated from the first die pad and the second die pad.

6. The power module according to claim 5, wherein
the first die pad and the second die pad are arranged next to each other in the sideward direction, and
the third die pad is located at a position separated from the first die pad and the second die pad in the lengthwise direction.

7. The power module according to claim 6, wherein
the first die pad and the second die pad are greater in thickness than the third die pad.

8. The power module according to claim 5, wherein:
the integrated circuit element is located inward from an outer peripheral edge of the third die pad; and the third die pad is rectangular, elongated in the sideward direction, and located between the first inner lead and the second inner lead in the sideward direction.

9. The power module according to claim 8, wherein
the first inner lead extends from a portion in an end surface of the first die pad in the lengthwise direction located at one end in the sideward direction, and
the second inner lead extends from a portion in an end surface of the second die pad in the lengthwise direction located at the other end in the sideward direction.

10. The power module according to claim 5, wherein the inner leads of the lead frames in the lead frame assembly include portions closer to the outer leads than the third die pad that are located at positions separated from the first die pad and the second die pad in the vertical direction.

11. The power module according to claim 10, wherein
the inner leads are each electrically connected to the integrated circuit element by a small-current connection member, and
the inner leads each include a portion to which the small-current connection member is connected and located at a position that is the same as that of the third die pad in the vertical direction.

12. The power module according to claim 5, wherein:
the lead frame assembly includes a third lead frame;
the third lead frame includes a third inner lead, which is connected to the third die pad, and a third outer lead, which is electrically connected to the third inner lead;
the third inner lead includes a main body, which connects the third die pad to the third outer lead, and a projecting portion, which includes a portion projecting from a side surface of the main body in a direction that differs from the lengthwise direction; and
the integrated circuit element is connected to the projecting portion by a small-current connection member.

13. The power module according to claim 12, wherein
the projecting portion is hook-shaped, and
the small-current connection member is connected to a distal end of the projecting portion.

14. The power module according to claim 12, wherein the third inner lead is located at a central part of the lead frames in the lead frame assembly in the sideward direction.

15. A power module comprising:
a first die pad;
a first switching element that is mounted on the first die pad;
a second die pad that is electrically insulated from the first die pad;
a second switching element that is mounted on the second die pad;
an integrated circuit element that controls a switching operation of the first switching element and the second switching element;
an encapsulation resin that encapsulates the first switching element, the second switching element, and the integrated circuit element; and
a lead frame assembly that includes an outer lead, which protrudes from the encapsulation resin, and an inner lead, which is arranged in the encapsulation resin and electrically connected to the outer lead,
wherein the lead frame assembly includes a first lead frame and a second lead frame,
the first lead frame includes a first inner lead, which serves as the inner lead and is connected to the first die pad, and a first outer lead, which serves as the outer lead and is electrically connected to the first inner lead,
the second lead frame includes a second inner lead, which serves as the inner lead and is connected to the second die pad, and a second outer lead, which serves as the outer lead and is electrically connected to the second inner lead, and
the first switching element and the second switching element each have a superjunction structure,
the power module further comprising a third die pad on which the integrated circuit element is mounted, wherein
the lead frame assembly includes a plurality of lead frames that include at least the first lead frame and the second lead frame,
the lead frames are arranged along a side surface of the encapsulation resin,
when a direction in which the lead frames are arranged in the lead frame assembly is defined as a sideward direction, a direction perpendicular to the sideward direction in a plan view of the lead frame assembly is defined as a lengthwise direction, and a direction perpendicular to the sideward direction and the lengthwise direction is defined as a vertical direction, the third die pad is located at a position in the vertical direction separated from the first die pad and the second die pad,
the lead frame assembly includes a fourth lead frame that forms a ground terminal,
the fourth lead frame includes a connection portion that is electrically connected to the second switching element by a large-current connection member, and
the connection portion is located between the third die pad and the second inner lead in the sideward direction.

16. The power module according to claim 15, wherein the connection portion and the third die pad are located next to each other in the sideward direction.

17. The power module according to claim 16, further comprising a resistor element that is connected to the third die pad and the connection portion.

18. A power module comprising:
a first die pad;
a first switching element that is mounted on the first die pad;
a second die pad that is electrically insulated from the first die pad;
a second switching element that is mounted on the second die pad;
an integrated circuit element that controls a switching operation of the first switching element and the second switching element;
an encapsulation resin that encapsulates the first switching element, the second switching element, and the integrated circuit element; and
a lead frame assembly that includes an outer lead, which protrudes from the encapsulation resin, and an inner lead, which is arranged in the encapsulation resin and electrically connected to the outer lead,
wherein the lead frame assembly includes a first lead frame and a second lead frame,
the first lead frame includes a first inner lead, which serves as the inner lead and is connected to the first die pad, and a first outer lead, which serves as the outer lead and is electrically connected to the first inner lead,
the second lead frame includes a second inner lead, which serves as the inner lead and is connected to the second die pad, and a second outer lead, which serves as the outer lead and is electrically connected to the second inner lead,
the first switching element and the second switching element each have a superjunction structure, the lead frame assembly includes a plurality of lead frames including at least the first lead frame and the second lead frame, the lead frames are arranged along a side surface of the encapsulation resin, and when a direction in which the lead frames are arranged in the lead frame assembly is defined as a sideward direction and a direction perpendicular to the sideward direction in a plan view of the lead frame assembly is defined as a lengthwise direction, the first die pad includes a first recess located at a position separated from the first switching element on the first die pad in the lengthwise direction.

19. The power module according to claim 18, wherein the first recess includes a groove extending in the sideward direction.

* * * * *